United States Patent
Woods et al.

(10) Patent No.: US 7,192,488 B2
(45) Date of Patent: *Mar. 20, 2007

(54) METHODS AND SYSTEMS FOR PROCESSING A BEVEL EDGE OF A SUBSTRATE USING A DYNAMIC LIQUID MENISCUS

(75) Inventors: Carl A. Woods, Aptos, CA (US); James P. Garcia, Santa Clara, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/292,490

(22) Filed: Dec. 1, 2005

(65) Prior Publication Data

US 2006/0081270 A1    Apr. 20, 2006

Related U.S. Application Data

(60) Division of application No. 10/603,427, filed on Jun. 24, 2003, now Pat. No. 7,000,622, which is a continuation-in-part of application No. 10/404,692, filed on Mar. 31, 2003, which is a continuation-in-part of application No. 10/330,843, filed on Dec. 24, 2002, which is a continuation-in-part of application No. 10/330,897, filed on Dec. 24, 2002, which is a continuation-in-part of application No. 10/261,839, filed on Sep. 30, 2002.

(51) Int. Cl.
*B08B 3/00* (2006.01)
*C23G 1/00* (2006.01)

(52) U.S. Cl. ............................................ 134/2; 134/34

(58) Field of Classification Search ................ None
See application file for complete search history.

(56) References Cited

U.S. PATENT DOCUMENTS

| | | | | |
|---|---|---|---|---|
| 4,968,375 A | * | 11/1990 | Sato et al. | 156/345.23 |
| 6,398,975 B1 | * | 6/2002 | Mertens et al. | 216/92 |
| 6,523,553 B1 | * | 2/2003 | Redeker et al. | 134/61 |
| 6,797,074 B2 | * | 9/2004 | Redeker et al. | 134/26 |
| 2002/0125212 A1 | * | 9/2002 | Mertens et al. | 216/57 |
| 2004/0064911 A1 | * | 4/2004 | Klupfel et al. | 15/306.1 |

* cited by examiner

*Primary Examiner*—Joseph L. Perrin
(74) *Attorney, Agent, or Firm*—Martine Penilla & Gencarella, LLP

(57) ABSTRACT

A system and method for processing an edge of a substrate includes an edge roller and a first proximity head. The first proximity head being mounted on the edge roller. The first proximity head capable of forming a meniscus and including a concave portion and multiple ports opening into the concave portion. The concave portion being capable of receiving an edge of a substrate and the ports including at least one process liquid injection port, at least one vacuum port and at least one surface tension control port.

18 Claims, 51 Drawing Sheets

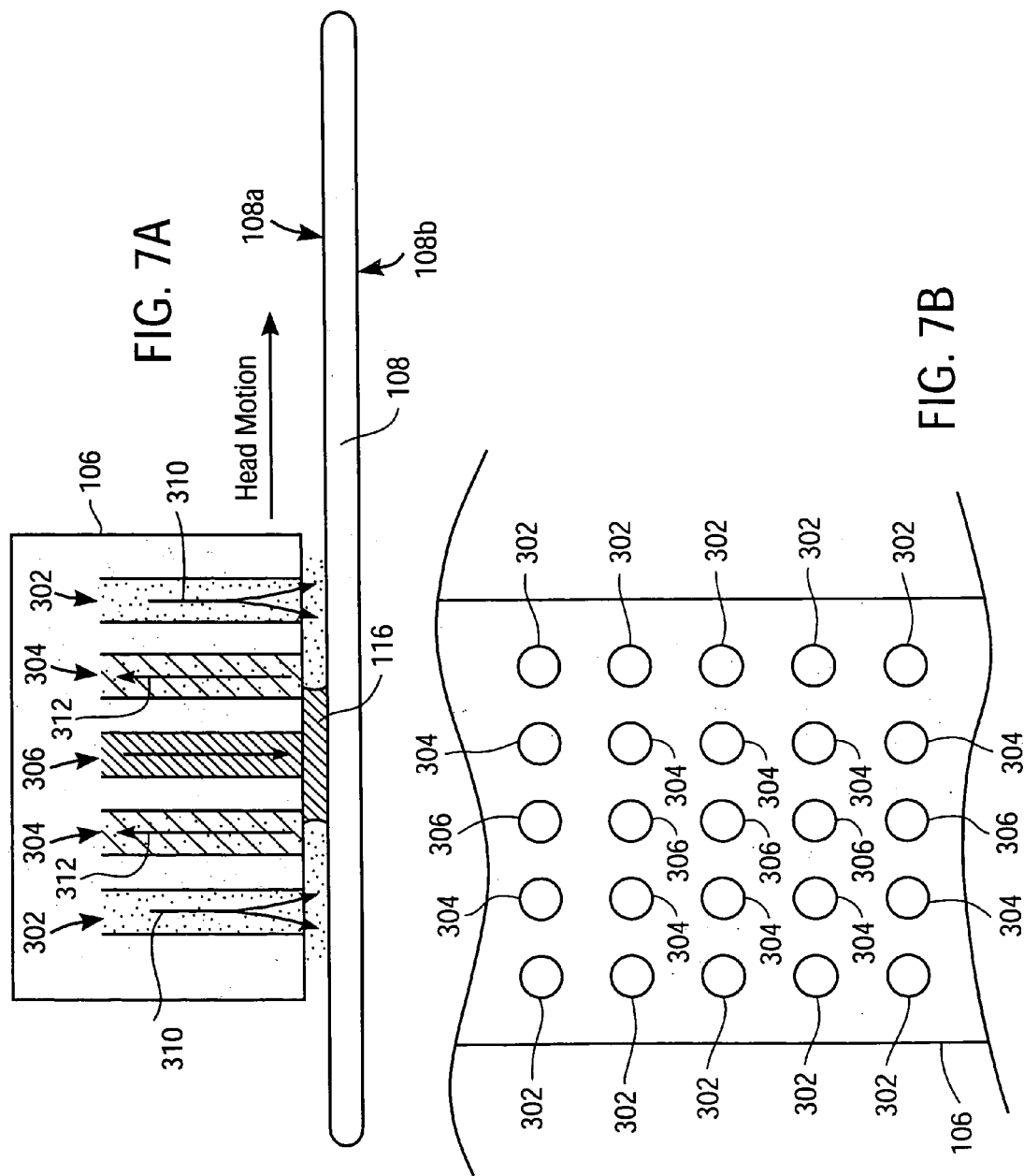

METHODS AND SYSTEMS FOR PROCESSING A BEVEL EDGE OF A SUBSTRATE USING A DYNAMIC LIQUID MENISCUS

CROSS REFERENCE TO RELATED APPLICATIONS

This application is a divisional of and claims priority from U.S. patent application Ser. No. 10/603,427 filed on Jun. 24, 2003 now U.S. Pat. No. 7,000,622 and entitled "Methods and Systems for Processing a Bevel Edge of a Substrate Using a Dynamic Liquid Meniscus" which is a continuation-in-part and claims priority from co-pending U.S. patent application Ser. No. 10/330,843 filed on Dec. 24, 2002 and entitled "Meniscus, Vacuum, IPA Vapor, Drying Manifold," which is a continuation-in-part of co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. The Ser. No. 10/603,427 application is also a continuation in part of U.S. patent application Ser. No. 10/330,897, filed on Dec. 24, 2002, entitled "System for Substrate Processing with Meniscus, Vacuum, IPA vapor, Drying Manifold" and is also a continuation in part of U.S. patent application Ser. No. 10/404,692, filed on Mar. 31, 2003, entitled "Methods and Systems for Processing a Substrate Using a Dynamic Liquid Meniscus." The Ser. No. 10/603,427 application is also a continuation in part of U.S. patent application Ser. No. 10/404,692, filed on Mar. 31, 2003, entitled "Methods and Systems for Processing a Substrate Using a Dynamic Liquid Meniscus. " The aforementioned applications being incorporated by reference in their entirety.

BACKGROUND OF THE INVENTION

1. Field of the Invention

The present invention relates generally to semiconductor manufacturing processes, and more particularly, to methods and systems for efficiently applying a process to an edge of a substrate.

2. Description of the Related Art

In the semiconductor chip fabrication process, it is well known that there is a need to clean and dry a wafer where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder that pushes a wafer surface against a polishing surface. The polishing surface uses a slurry which consists of chemicals and abrasive materials to cause the polishing. Unfortunately, the CMP process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after a fabrication operation that leaves unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin-drying, IPA, or Marangoni drying. All of these drying techniques utilize some form of a moving liquid/gas interface on a wafer surface, which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface.

The most prevalent drying technique used today is spin rinse drying (SRD). FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces. An additional problem is that the edge of the wafer surface can be difficult to fully clean using the SRD process.

Therefore, there is a need for a method and an apparatus that avoids the prior art by allowing quick and efficient cleaning and drying of a an edge of a semiconductor wafer, but at the same time reducing the formation of numerous water or cleaning fluid droplets that may cause contamination to deposit on the wafer surface and the wafer edge.

SUMMARY OF THE INVENTION

Broadly speaking, the present invention fills these needs by providing a system and method for processing an edge of a wafer. It should be appreciated that the present invention can be implemented in numerous ways, including as a process, an apparatus, a system, computer readable media, or a device. Several inventive embodiments of the present invention are described below.

One embodiment provides a method of processing an edge of a substrate. The method including supporting the substrate by an edge support. The edge support including a first proximity head. An edge meniscus is formed inside a concave portion of the first proximity head. The concave portion being capable of receiving at least a portion of an edge of the substrate and the edge meniscus is moved onto the edge of the substrate. The edge support can include an edge roller.

The method can also include moving the edge meniscus off of the edge of the substrate. Moving the edge meniscus onto the edge of the substrate can include rotating the proximity head about an axis of the proximity head. Moving the edge meniscus onto the edge of the substrate can also include moving the meniscus relative to the edge of the substrate. Moving the edge meniscus can also include increasing the size of the edge meniscus.

The edge of the substrate can include a circumferential edge of the substrate and the edge meniscus encompasses at least a portion of the circumference of the substrate. The edge meniscus can encompass the edge of the substrate within the portion of the circumference of the substrate. The edge meniscus can encompass at least one of a top surface edge exclusion zone and a bottom surface edge exclusion zone. The method can also include moving the edge meniscus along the edge of the substrate.

Processing the edge of a substrate can include at least one of cleaning, rinsing, etching or drying the edge of the substrate. Processing the edge of the substrate can also include processing at least a portion of at least one of a top surface or a bottom surface of the substrate. Processing at least a portion of at least one of the top surface or the bottom surface of the substrate can include processing the at least a portion of at least one of the top surface or the bottom surface of the substrate with the edge meniscus. Processing at least a portion of at least one of the top surface or the bottom surface of the substrate can include processing the at least a portion of at least one of the top surface or the bottom surface of the substrate with a corresponding top or bottom meniscus.

The corresponding top meniscus can be supported between a top proximity head and the top surface of the substrate and the corresponding bottom meniscus can be supported between a bottom proximity head and the bottom surface of the substrate. The corresponding top meniscus can be formed between the top proximity head and at least one of the bottom proximity head or an adjacent surface and the top meniscus can be moved onto the top surface of the substrate.

The first proximity head can include a concave portion, the concave portion capable of receiving an edge of a substrate and multiple ports opening into the concave portion. The ports including at least one process liquid injection port, at least one vacuum port and at least one surface tension control port.

Another embodiment provides a method of processing an edge of a substrate including supporting the substrate by an edge roller, the edge roller including a proximity head and forming a meniscus inside a concave portion of the proximity head. The concave portion is capable of receiving at least a portion of an edge of the substrate. The meniscus encompasses the edge of the substrate within a portion of the circumference of the substrate. The meniscus is moved onto the edge of the substrate and moved along the edge of the substrate. Moving the meniscus onto the edge of the substrate can include increasing the size of the meniscus.

Another embodiment provides a system for processing an edge of a substrate. The system includes an edge roller and a first proximity head. The first proximity head being mounted on the edge roller. The first proximity head capable of forming a meniscus and including a concave portion and multiple ports opening into the concave portion. The concave portion being capable of receiving an edge of a substrate and the ports including at least one process liquid injection port, at least one vacuum port and at least one surface tension control port The edge of the substrate can include a circumferential edge of the substrate and the first proximity head is capable of forming a meniscus capable of covering at least a portion of the circumference of the substrate. The edge roller can be mounted on a first axis and the first proximity head is mounted on a second axis. The first axis and the second axis can be concentric. The first axis and the second axis can be rotated independently.

The system can further include a second proximity head. The edge of the substrate can include a circumferential edge and the first proximity head and the second proximity head are capable of being positioned over the circumferential edge. The first proximity head and the second proximity head are capable of being independently positioned over the circumferential edge. The first proximity head is capable of locating a first meniscus on the edge of the substrate before the edge of the substrate contacts the edge roller and the second proximity head is capable of locating a second meniscus on the edge of the substrate after the edge of the substrate contacts the edge roller. The system can also include an actuator coupled to the first proximity head, the actuator being capable of moving the first proximity head.

Yet another embodiment provides a system for processing an edge of a substrate. The system including an edge roller mounted on a first axis, a first proximity head mounted on a second axis. The second axis is concentric with the first axis. The first proximity head capable of forming a meniscus. The first proximity head includes a concave portion. The concave portion is capable of receiving an edge of a substrate. The first proximity head also includes multiple ports opening into the concave portion. The ports include at least one process liquid injection port, at least one vacuum port, and at least one surface tension control port. The system also includes an actuator coupled to the second axis. The actuator capable of moving the second axis the axis capable of being rotated independently from the first axis.

The various embodiments of the present invention provide the advantage of processing an edge (e.g., cleaned, etched) of the substrate through use of an edge-shaped head that can support a meniscus around the edge of the substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 5N-1 is a flowchart diagram of the method operations of using a wafer cleaning and drying systems in accordance with one embodiment of the present invention.

FIG. 5N-2 is a detailed cross-sectional view of the edge platform in accordance with one embodiment of the present invention.

FIG. 7A illustrates a proximity head performing a drying operation in accordance with one embodiment of the present invention.

FIG. 7B shows a top view of a portion of a proximity head in accordance with one embodiment of the present invention.

DETAILED DESCRIPTION

Several exemplary embodiments for methods and apparatuses for processing (e.g., cleaning, rinsing, drying, etching) an edge of a wafer will now be described. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

FIGS. 2A through 2D below illustrate embodiments of an exemplary wafer processing system. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system described herein may be utilized to process any shape and size of substrates such as for example, 200 mm wafers, 300 mm wafers, flat panels, etc. The wafer processing system may be utilized for either or both processing the wafer depending on the configuration of the system.

Figure 2A:
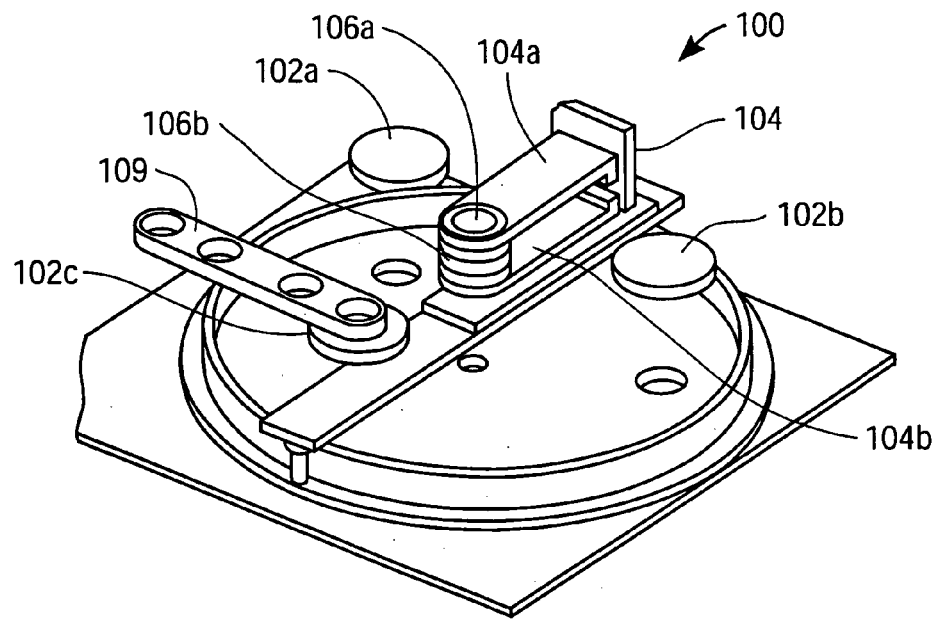
FIG. 2A shows a wafer processing system in accordance with one embodiment of the present invention.

FIG. 2A shows a wafer processing system 100 in accordance with one embodiment of the present invention. The system 100 includes rollers 102a, 102b, and 102c which may hold and rotate a wafer to enable wafer surfaces to be dried. The system 100 also includes proximity heads 106a and 106b that, in one embodiment, are attached to an upper arm 104a and to a lower arm 104b respectively. The upper arm 104a and the lower arm 104b are part of a proximity head carrier assembly 104 which enables substantially linear movement of the proximity heads 106a and 106b along a radius of the wafer.

In one embodiment the proximity head carrier assembly 104 is configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. The upper arm 104a and the lower arm 104b may be configured in any suitable way so the proximity heads 106a and 106b can be moved to enable wafer processing as described herein. It should be appreciated that the system 100 may be configured in any suitable manner as long as the proximity head(s) may be moved in close proximity to the wafer to generate and control a meniscus as discussed below in reference to FIGS. 6D through 8B. It should also be understood that close proximity may be any suitable distance from the wafer as long as a meniscus as discussed in further reference to FIG. 6D through 8B may be maintained. In one embodiment, the proximity heads 106a and 106b (as well as any other proximity head described herein) may each be moved to between about 0.1 mm to about 10 mm from the wafer to initiate wafer processing operations. In a preferable embodiment, the proximity heads 106a and 106b (as well as any other proximity head described herein) may each be moved to between about 0.5 mm to about 4.5 mm from the wafer to initiate wafer processing operations, and in more preferable embodiment, the proximity heads 106a and 106b (as well as any other proximity head described herein) may be moved to about 2 mm from the wafer to initiate wafer processing operations.

Figure 2B:
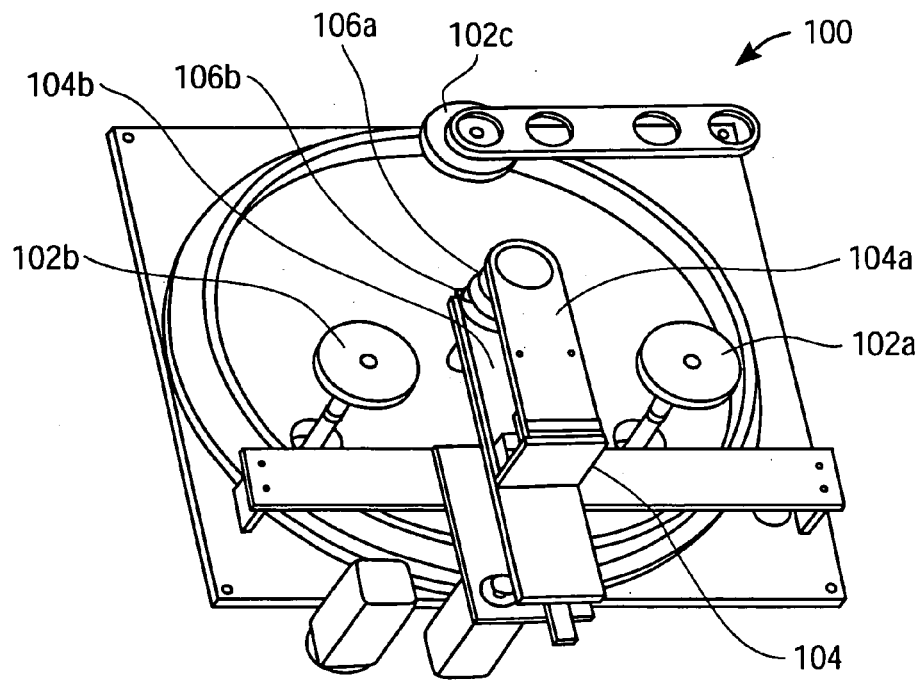
FIG. 2B shows an alternate view of the wafer processing system in accordance with one embodiment of present invention.

FIG. 2B shows an alternate view of the wafer processing system 100 in accordance with one embodiment of present invention. The system 100, in one embodiment, has the proximity head carrier assembly 104 that is configured to enable the proximity heads 106a and 106b to be moved from the center of the wafer towards the edge of the wafer. It should be appreciated that the proximity head carrier assembly 104 may be movable in any suitable manner that would enable movement of the proximity heads 106a and 106b to process the wafer as desired. In one embodiment, the proximity head carrier assembly 104 can be motorized to move the proximity head 106a and 106b from the center of the wafer to the edge of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate a fluid meniscus between the proximity head and the wafer. The fluid meniscus may be moved across the wafer to process the wafer by applying fluid to the wafer surface and removing the fluids from the surface. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing both the top and bottom surfaces and of the wafer, the system 100 may also be configured to process one side of the wafer and dry another side of the wafer if desired by inputting and outputting different types of fluids. It should be appreciated that the system 100 may utilize the application of different chemicals top and bottom in the proximity heads 106a and 106b respectively depending on the operation desired. The proximity heads can be configured to process the bevel edge of the wafer in addition to processing the top and/or bottom of the wafer. This can be accomplished by moving the meniscus off the edge the wafer which processes (e.g., cleans, rinses, dries, etc.) the bevel edge. It should also be understood that the proximity heads 106a and 106b may be the same type of apparatus or different types of proximity heads.

Figure 2C:
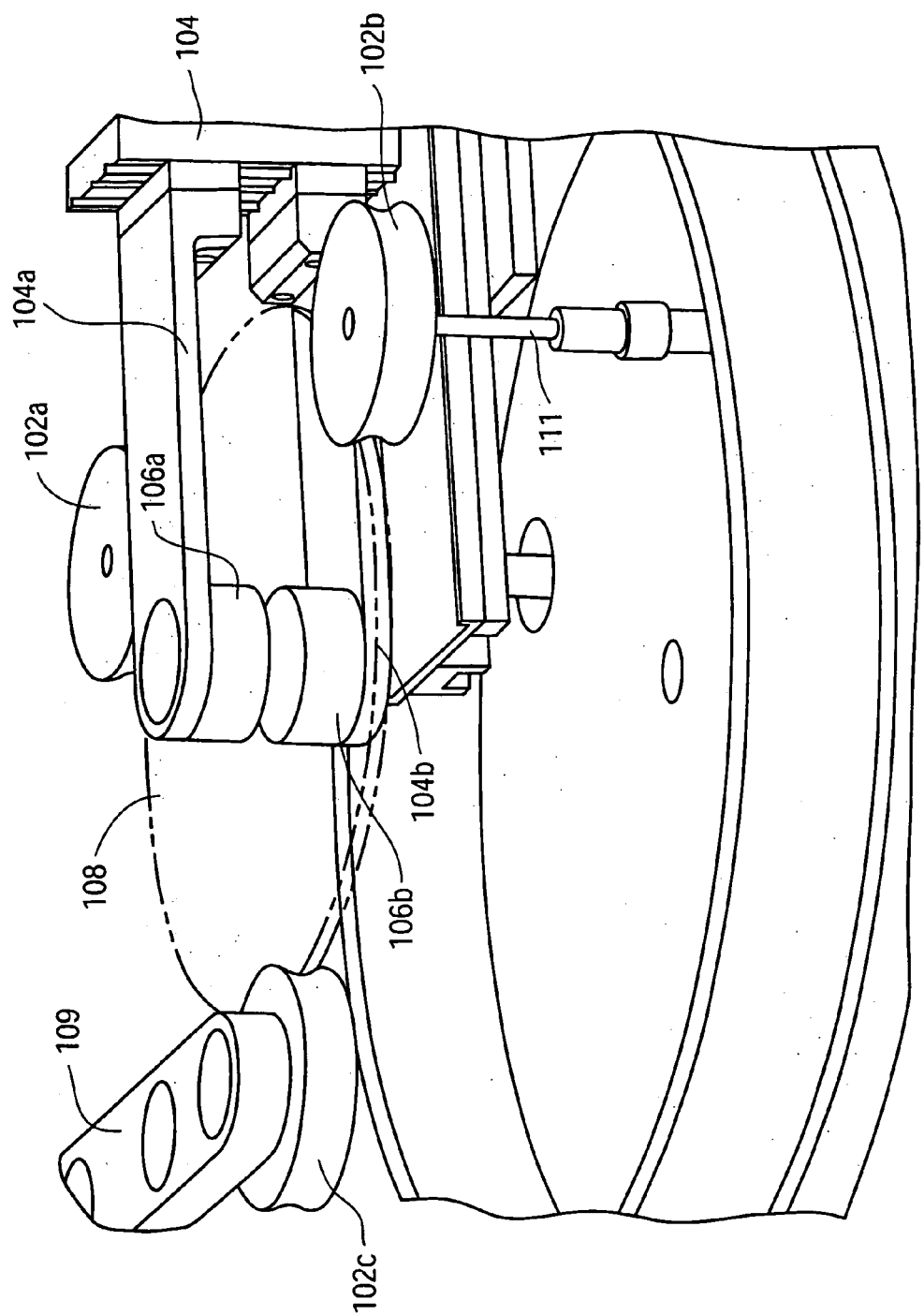
FIG. 2C illustrates a side close-up view of the wafer processing system holding a wafer in accordance with one embodiment of the present invention.

FIG. 2C illustrates a side close-up view of the wafer processing system 100 holding a wafer 108 in accordance with one embodiment of the present invention. The wafer 108 may be held and rotated by the rollers 102a, 102b, and 102c in any suitable orientation as long as the orientation enables a desired proximity head to be in close proximity to a portion of the wafer 108 that is to be processed. In one embodiment, the roller 102b may be rotated by using a spindle 111, and the roller 102c may be held and rotated by a roller arm 109. The roller 102a may also be rotated by its own spindle (as shown in FIG. 3B. In one embodiment, the rollers 102a, 102b, and 102c can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a, 102b, and 102c serves to move a wafer area that has not been processed into close proximity to the proximity heads 106a and 106b. In an exemplary drying operation, the wet areas of the wafer would be presented to the proximity heads 106a and 106b through both the linear motion of the proximity heads 106a and 106b and through the rotation of the wafer 108. The processing operation itself is conducted by at least one of the proximity heads. Consequently, in one embodiment, a dry area of the wafer 108 would expand from a center region to the edge region of the wafer 108 in a spiral movement as a drying operation progresses. In a preferable embodiment, the dry area of the wafer 108 would move around the wafer 108 and the wafer 108 would be dry in one rotation (if the length of the proximity heads 106a and 106b are at least a radius of the wafer 108). By changing the configuration of the system 100 and the orientation of and movement of the proximity head 106a and/or the proximity head 106b, the drying movement may be changed to accommodate nearly any suitable type of drying path.

It should be understood that the proximity heads 106a and 106b may be configured to have at least one of first source inlet configured to input deionized water (DIW) (also known as a DIW inlet), at least one of a second source inlet configured to input isopropyl alcohol (IPA) in vapor form (also known as IPA inlet), and at least one source outlet configured to output fluids from a region between the wafer and a particular proximity head by applying vacuum (also known as vacuum outlet). It should be appreciated that the vacuum utilized herein may also be suction. In addition, other types of solutions may be input into the first source inlet and the second source inlet such as, for example, cleaning solutions, ammonia, HF, etc. It should be appreciated that although IPA vapor is used in some of the exemplary embodiments, nitrogen or other inert carrier gas may be used to carry the IPA vapor. Alternatives for IPA include but are not limited to the following: diacetone, diaceton alcohol, 1-methoxy-2-propanol, ethylglycol, methyl-pyrrolidon, ethyllactate, 2-butanol. In addition, any other type of vapor or gas may be utilized such as for example, nitrogen, argon or other gases, any suitable alcohol vapor, organic compounds, etc. that may be miscible with water.

In one embodiment, the at least one IPA vapor inlet is adjacent to the at least one vacuum outlet which is in turn adjacent to the at least one DIW inlet to form an IPA-vacuum-DIW orientation. It should be appreciated that other types of orientations such as IPA-DIW-vacuum, DIW-vacuum-IPA, vacuum-IPA-DIW, etc. may be utilized depending on the wafer processes desired and what type of wafer processing mechanism is sought to be enhanced. In a preferable embodiment, the IPA-vacuum-DIW orientation may be utilized to intelligently and powerfully generate, control, and move the meniscus located between a proximity head and a wafer to process wafers. The DIW inlets, the IPA vapor inlets, and the vacuum outlets may be arranged in any suitable manner if the above orientation is maintained. For example, in addition to the IPA vapor inlet, the vacuum outlet, and the DIW inlet, in an additional embodiment, there may be additional sets of IPA vapor outlets, DIW inlets and/or vacuum outlets depending on the configuration of the proximity head desired. Therefore, another embodiment may utilize an IPA-vacuum-DIW-DIW-vacuum-IPA or other exemplary embodiments with an IPA source inlet, vacuum source outlet, and DIW source inlet configurations are described herein with a preferable embodiment being described in reference to FIG. 6D. It should be appreciated that the exact configuration of the IPA-vacuum-DIW orientation may be varied depending on the application. For example, the distance between the IPA input, vacuum, and DIW input locations may be varied so the distances are consistent or so the distances are inconsistent. In addition, the distances between the IPA input, vacuum, and DIW output may differ in magnitude depending on the size, shape, and configuration of the proximity head 106a and the desired size of a process window (i.e., meniscus shape and size) as described in further detail in reference to FIG. 10. In addition, as discussed in reference to FIG. 10, the IPA-vacuum-DIW orientation is configured so a vacuum region substantially surrounds a DIW region and the IPA region substantially surrounds at least the trailing edge region of the vacuum region.

Figure 2D:
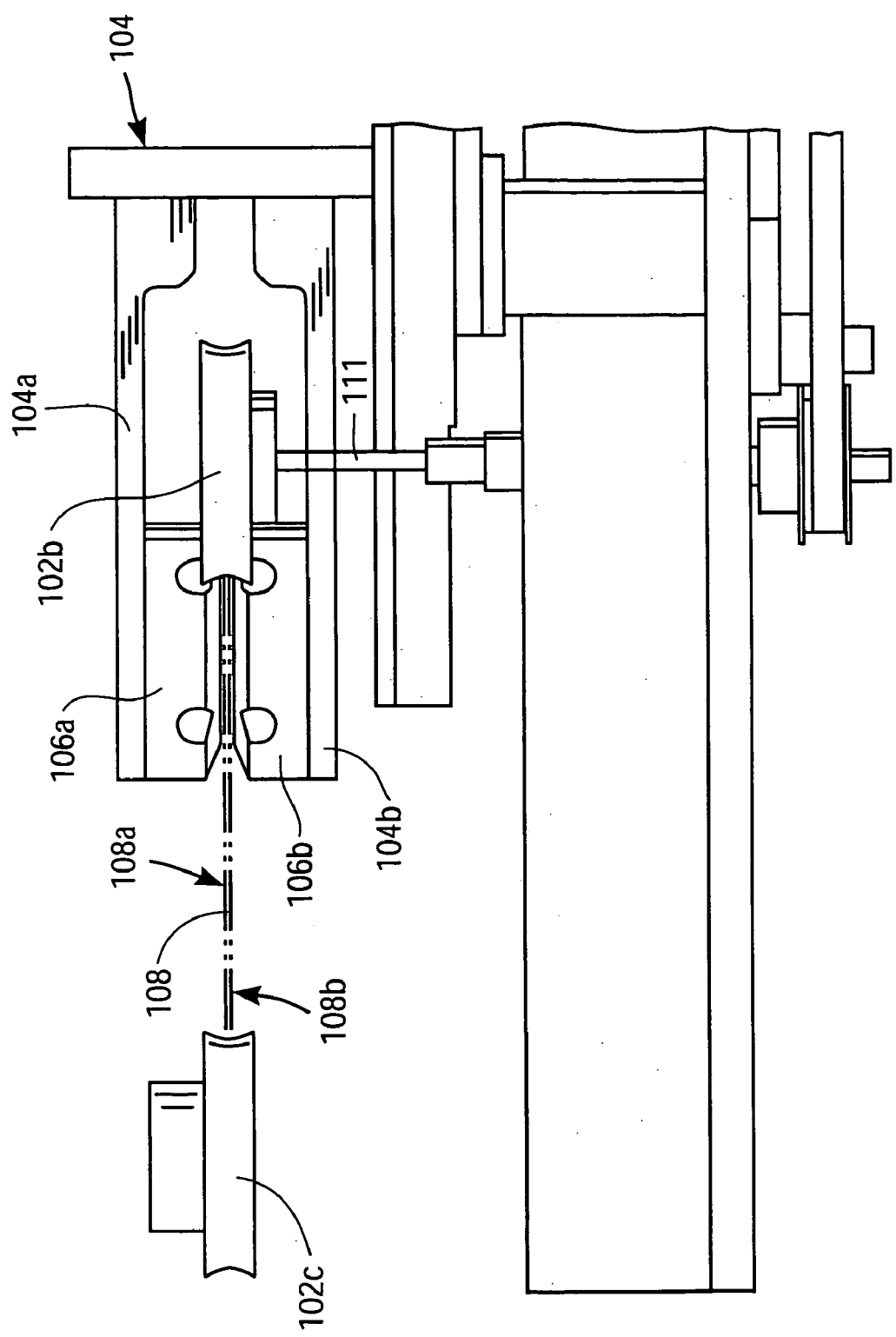
FIG. 2D shows another side close-up view of the wafer processing system in accordance with one embodiment of the present invention.

FIG. 2D shows another side close-up view of the wafer processing system 100 in accordance with one embodiment of the present invention. In this embodiment, the proximity heads 106a and 106b have been positioned in close proximity to a top surface 108a and a bottom surface 108b of the wafer 108 respectively by utilization of the proximity head carrier assembly 104. Once in this position, the proximity heads 106a and 106b may utilize the IPA and DIW source inlets and a vacuum source outlet(s) to generate wafer processing meniscuses in contact with the wafer 108 which are capable of removing fluids from a top surface 108a and a bottom surface 108b. The wafer processing meniscus may be generated in accordance with the descriptions in reference to FIGS. 6 through 9B where IPA vapor and DIW are input into the region between the wafer 108 and the proximity heads 106a and 106b. At substantially the same time the IPA and DIW is input, a vacuum may be applied in close proximity to the wafer surface to output the IPA vapor, the DIW, and the fluids that may be on a wafer surface. It should be appreciated that although IPA is utilized in the exemplary embodiment, any other suitable type of vapor may be utilized such as any suitable alcohol vapor, organic compounds, hexanol, ethyl glycol, etc. that may be miscible with water. These fluids may also be known as surface tension reducing fluids. The portion of the DIW that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In another exemplary embodiment, the proximity heads 106a and 106b may be moved in a manner so all parts of the wafer 108 are processed without the wafer 108 being rotated. In such an embodiment, the proximity head carrier assembly 104 may be configured to enable movement of the either one or both of the proximity heads 106a and 106b to close proximity of any suitable region of the wafer 108. In one embodiment, of the proximity heads are smaller in length than a radius of the wafer, the proximity heads may be configured to move in a spiral manner from the center to the edge of the wafer 108 or vice versa. In a preferable embodiment, when the proximity heads are larger in length than a radius of the wafer, the proximity heads 106a and 106b may be moved over the entire surface of the wafer in one rotation. In another embodiment, the proximity heads 104a and 104b may be configured to move in a linear fashion back and forth across the wafer 108 so all parts of the wafer surfaces 108a and/or 108b may be processed. In yet another embodiment, configurations as discussed below in reference to FIG. 5C through 5H may be utilized. Consequently, countless different configurations of the system 100 may be utilized in order to obtain an optimization of the wafer processing operation.

Figure 3A:
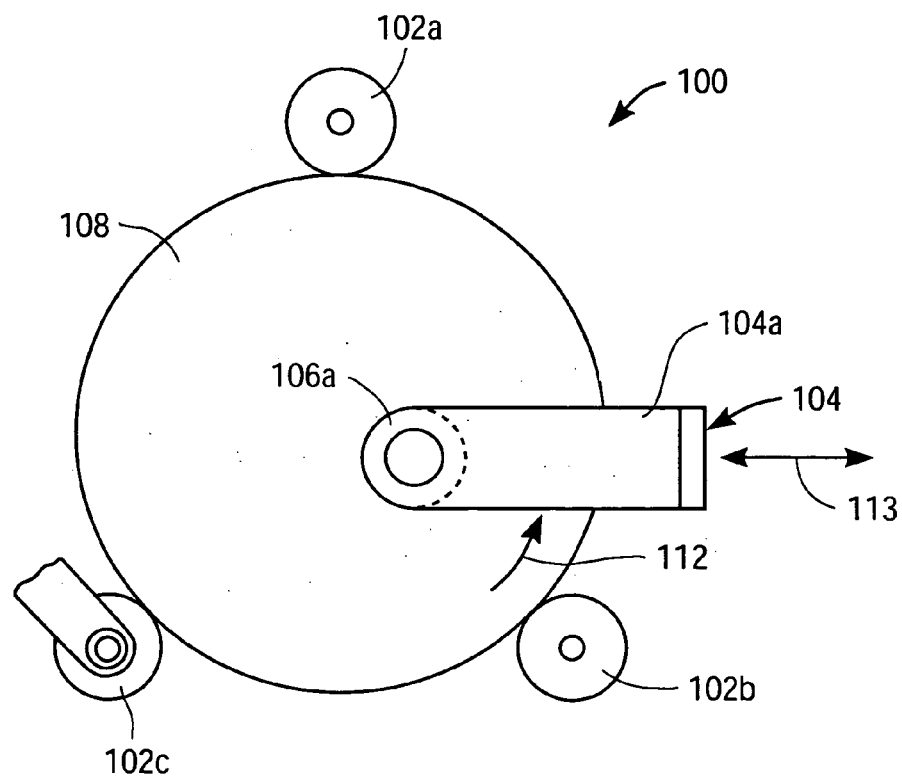
FIG. 3A shows a top view illustrating the wafer processing system with dual proximity heads in accordance with one embodiment of the present invention.
Figure 3B:
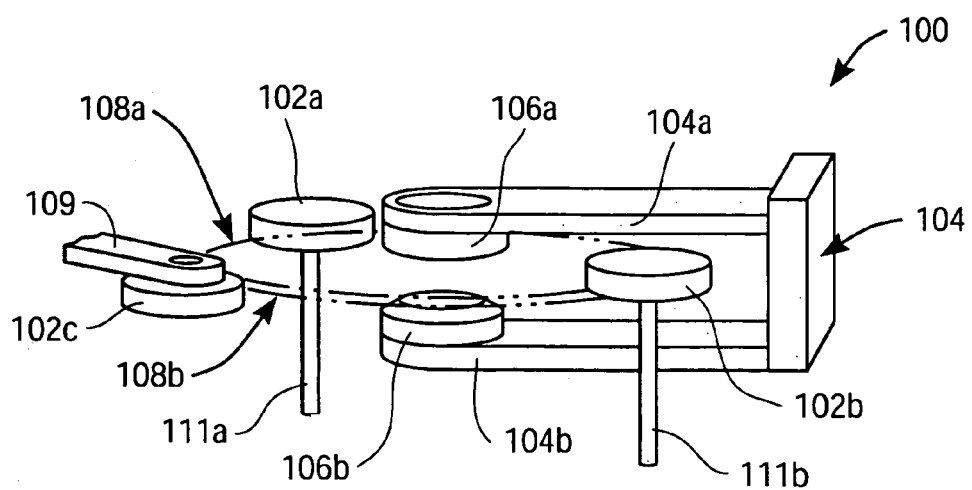
FIG. 3B illustrates a side view of the wafer processing system with dual proximity heads in accordance with one embodiment of the present invention.

FIG. 3A shows a top view illustrating the wafer processing system 100 with dual proximity heads in accordance with one embodiment of the present invention. As described above in reference to FIGS. 2A to 2D, the upper arm 104a may be configured to move and hold the proximity head 106a in a position in close proximity over the wafer 108. The upper arm 104a may also be configured to move the proximity head 106a from a center portion of the wafer 108 towards the edge of the wafer 108 in a substantially linear fashion 113. Consequently, in one embodiment, as the wafer 108 moves as shown by rotation 112, the proximity head 106a is capable of removing a fluid film from the top surface 108a of the wafer 108 using a process described in further detail in reference to FIGS. 6 through 8. Therefore, the proximity head 106a may dry the wafer 108 in a substantially spiral path over the wafer 108. In another embodiment as shown in reference to FIG. 3B, there may be a second proximity head located below the wafer 108 to remove a fluid film from the bottom surface 108b of the wafer 108.

FIG. 3B illustrates a side view of the wafer processing system 100 with dual proximity heads in accordance with one embodiment of the present invention. In this embodiment, the system 100 includes both the proximity head 106a capable of processing a top surface of the wafer 108 and the proximity head 106b capable of processing a bottom surface of the wafer 108. In one embodiment, spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may be presented to the proximity heads 106a and 106b for processing. In one embodiment, while the wafer 108 is being rotated, the proximity heads 106a and 106b are brought to close proximity of the wafer surfaces 108a and 108b by the arms 104a and 104b respectively. Once the proximity heads 106a and 106b are brought into close proximity to the wafer 108, the wafer processing may be begun. In operation, the proximity heads 106a and 106b may each remove fluids from the wafer 108 by applying IPA, deionized water and vacuum to the top surface and the bottom surface of the wafer 108 as described in reference to FIG. 6.

In one embodiment, by using the proximity heads 106a and 106b, the system 100 may dry a 200 mm wafer in less than 45 seconds. In another embodiment, where the proximity heads 106a and 106b are at least a radius of the wafer in length, the drying time for a wafer may be less than 30 seconds. It should be understood that processing time (e.g., cleaning and drying time) may be decreased by increasing the speed at which the proximity heads 106a and 106b travels from the center of the wafer 108 to the edge of the wafer 108. In another embodiment, the proximity heads 106a and 106b may be utilized with a faster wafer rotation to dry the wafer 108 in less time. In yet another embodiment, the rotation of the wafer 108 and the movement of the proximity heads 106a and 106b may be adjusted in conjunction to obtain an optimal processing speed. In one embodiment, the proximity heads 106a and 106b may move linearly from a center region of the wafer 108 to the edge of the wafer 108 at between about 0 mm per second to about 50 mm per second.

Figure 4A:
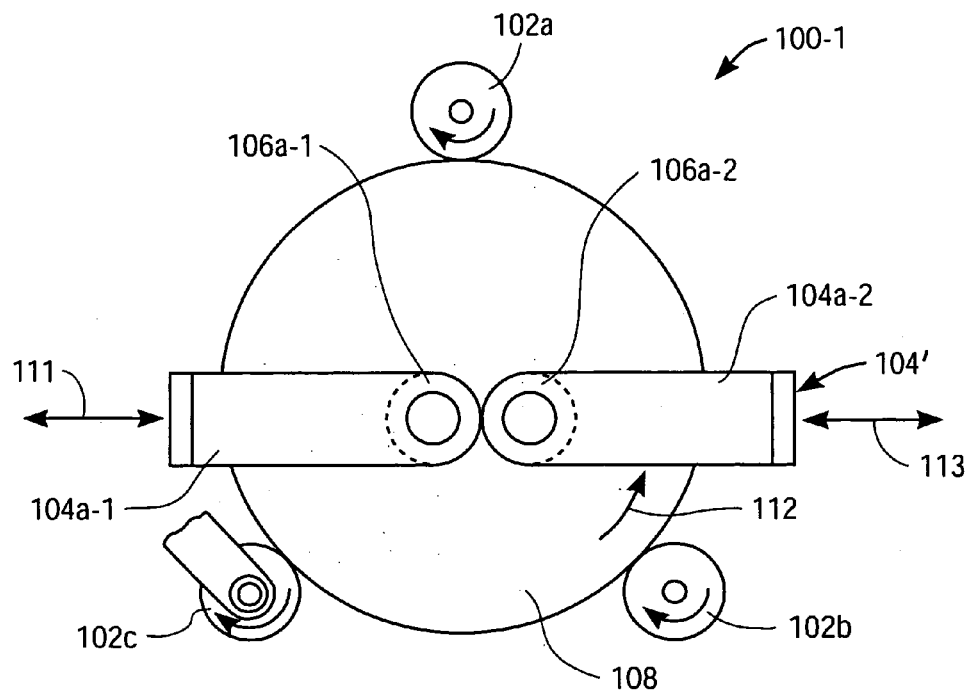
FIG. 4A shows a top view of a wafer processing system which includes multiple proximity heads for a particular surface of the wafer in accordance with one embodiment of the present invention.
Figure 4B:
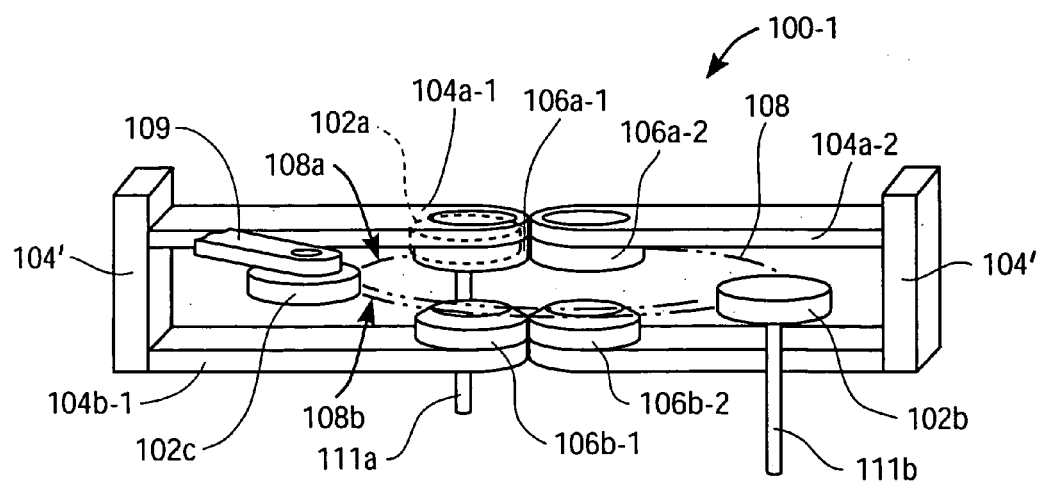
FIG. 4B shows a side view of the wafer processing system which includes multiple proximity heads for a particular surface of the wafer in accordance with one embodiment of the present invention.

FIG. 4A shows a top view of a wafer processing system 100-1 which includes multiple proximity heads for a particular surface of the wafer 108 in accordance with one embodiment of the present invention. In this embodiment, the system 100-1 includes an upper arm 104a-1 and an upper arm 104a-2. As shown in FIG. 4B, the system 100-1 also may include lower arm 104b-1 and lower arm 104b-2 connected to proximity heads 106b-1 and 106b-2 respectively. In the system 100-1, the proximity heads 106a-1 and 106a-2 (as well as 106b-1 and 106b-2 if top and bottom surface processing is being conducted) work in conjunction so, by having two proximity heads processing a particular surface of the wafer 108, processing time may be cut to about half of the time. Therefore, in operation, while the wafer 108 is rotated, the proximity heads 106a-1, 106a-2, 106b-1, and 106b-2 start processing the wafer 108 near the center of the wafer 108 and move outward toward the edge of the wafer 108 in a substantially linear fashion. In this way, as the rotation 112 of the wafer 108 brings all regions of the wafer 108 in proximity with the proximity heads so as to process all parts of the wafer 108. Therefore, with the linear movement of the proximity heads 106a-1, 106a-2, 106b-1, and 106b-2 and the rotational movement of the wafer 108, the wafer surface being dried moves in a spiral fashion from the center of the wafer 108 to the edge of the wafer 108.

In another embodiment, the proximity heads 106a-1 and 106b-1 may start processing the wafer 108 and after they have moved away from the center region of the wafer 108, the proximity heads 106a-2 and 106b-2 may be moved into place in the center region of the wafer 108 to augment in wafer processing operations. Therefore, the wafer processing time may be decreased significantly by using multiple proximity heads to process a particular wafer surface.

FIG. 4B shows a side view of the wafer processing system 100-1 which includes multiple proximity heads for a particular surface of the wafer 108 in accordance with one embodiment of the present invention. In this embodiment, the system 100-1 includes both the proximity heads 106a-1 and 106a-2 that are capable of processing the top surface 108a of the wafer 108, and proximity heads 106b-1 and 106b-2 capable of processing the bottom surface 108b of the wafer 108. As in the system 100, the spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may brought in close proximity to the proximity heads 106a-1, 106a-2, 106b-1, and 106b-2 for wafer processing operations.

In operation, each of the proximity heads 106a-1, 106a-2, 106b-1, and 106b-2 may remove fluids from the wafer 108 by applying IPA, deionized water and vacuum to the top surface and the bottom surface of the wafer 108 as shown, for example, in FIG. 6 through 8. By having two proximity heads per wafer side, the wafer processing operation (i.e., cleaning and/or drying) may be accomplished in substantially less time. It should be appreciated that as with the wafer processing system described in reference to FIGS. 3A and 3B, the speed of the wafer rotation may be varied to any suitable speed as long as the configuration enables proper wafer processing. In one embodiment, the wafer processing time may be decreased when half a rotation of the wafer 108 is used to dry the entire wafer. In such an embodiment, the wafer processing speed may be about half of the processing speed when only one proximity head is utilized per wafer side.

Figure 5A:
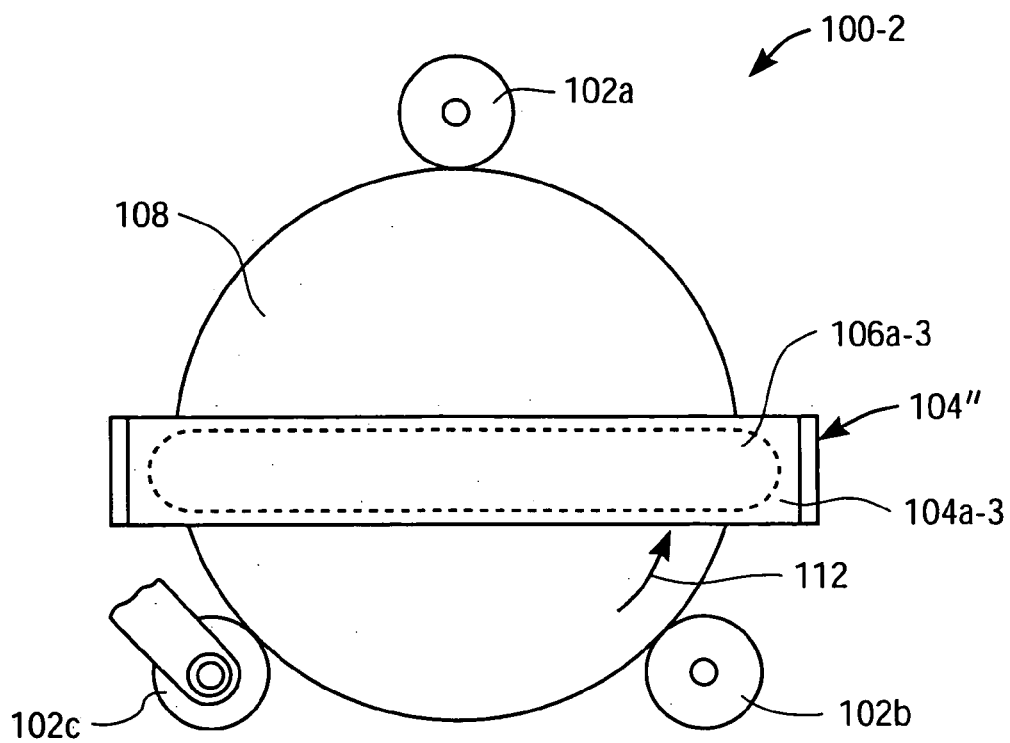
FIG. 5A shows a top view of a wafer processing system with a proximity head in a horizontal configuration which extends across a diameter of the wafer 108 in accordance with one embodiment of the present invention.

FIG. 5A shows a top view of a wafer processing system 100-2 with a proximity head 106a-3 in a horizontal configuration which extends across a diameter of the wafer 108 in accordance with one embodiment of the present invention. In this embodiment, the proximity head 106a-3 is held by an upper arm 104a-3 that extends across a diameter of the wafer 108. In this embodiment, the proximity head 106a-3 may be moved into a processing position by a vertical movement of the upper arm 104a-3 so the proximity head 106a-3 can be in a position that is in close proximity to the wafer 108. Once the proximity head 106a-3 is in close proximity to the wafer 108, the wafer processing operation of a top surface of the wafer 108 can take place.

Figure 5B:
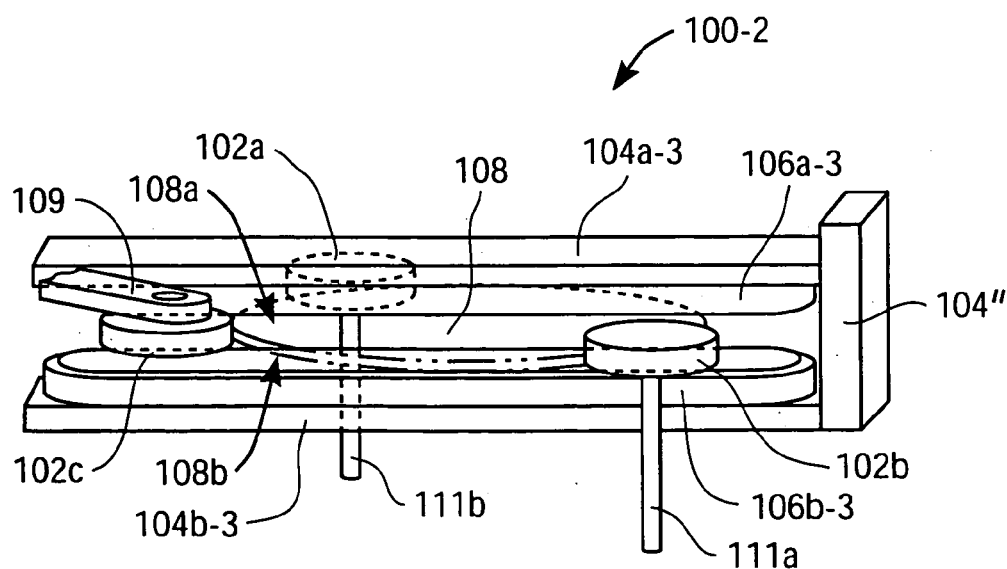
FIG. 5B shows a side view of a wafer processing system with the proximity heads in a horizontal configuration which extends across a diameter of the wafer in accordance with one embodiment of the present invention.

FIG. 5B shows a side view of a wafer processing system 100-2 with the proximity heads 106a-3 and 106b-3 in a horizontal configuration which extends across a diameter of the wafer 108 in accordance with one embodiment of the present invention. In this embodiment, the proximity head 106a-3 and the proximity head 106b-3 both are elongated to be able to span the diameter of the wafer 108. In one embodiment, while the wafer 108 is being rotated, the proximity heads 106a-3 and 106b-3 are brought to close proximity of the wafer surfaces 108a and 108b by the top arm 104a and a bottom arm 106b-3 respectively. Because the proximity heads 106*a*-3 and 106*b*-3 extend across the wafer 108, only half of a full rotation may be needed to process the wafer 108.

Figure 5C:
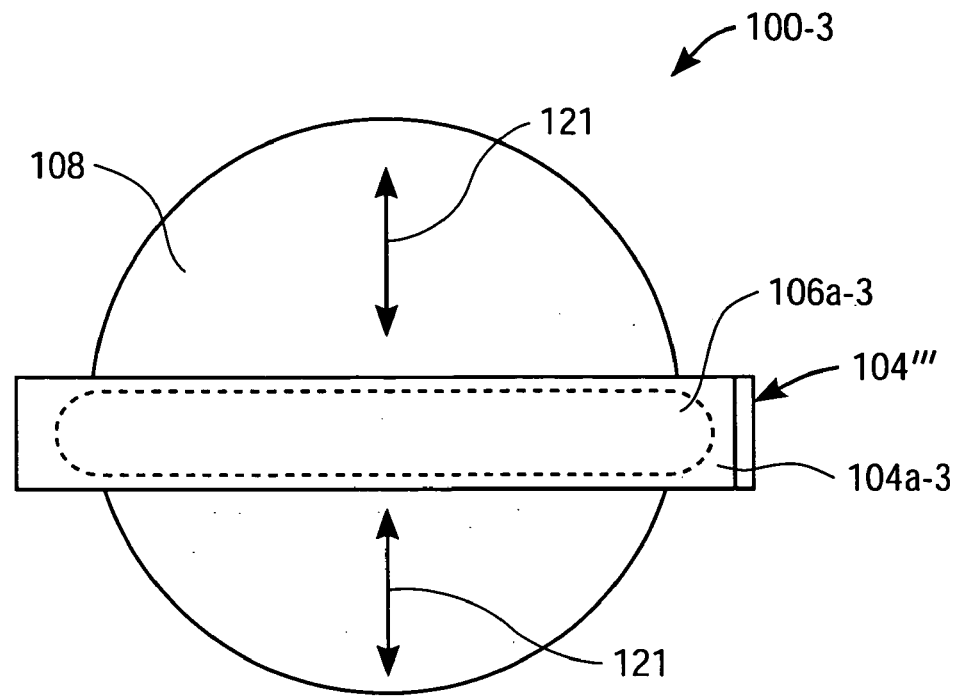
FIG. 5C shows a top view of a wafer processing system with the proximity heads in a horizontal configuration which is configured to clean and/or dry the wafer that is stationary in accordance with one embodiment of the present invention.

FIG. 5C shows a top view of a wafer processing system 100-3 with the proximity heads 106*a*-3 and 106*b*-3 in a horizontal configuration which is configured to process the wafer 108 that is stationary in accordance with one embodiment of the present invention. In this embodiment, the wafer 108 may be held stationary by any suitable type of wafer holding device such as, for example, an edge grip, fingers with edge attachments, etc. The proximity head carrier assembly 104''' is configured to be movable from one edge of the wafer 108 across the diameter of the wafer 108 to an edge on the other side of the wafer 108 after crossing the entire wafer diameter. In this fashion, the proximity head 106*a*-3 and/or the proximity head 106*b*-3 (as shown below in reference to FIG. 5D) may move across the wafer following a path along a diameter of the wafer 108 from one edge to an opposite edge. It should be appreciated that the proximity heads 106*a*-3 and/or 106*b*-3 may be move from any suitable manner that would enable moving from one edge of the wafer 108 to another diametrically opposite edge. In one embodiment, the proximity head 106*a*-3 and/or the proximity head 106*b*-3 may move in directions 121 (e.g., top to bottom or bottom to top of FIG. 5C). Therefore, the wafer 108 may stay stationary without any rotation or movement and the proximity heads 106*a*-3 and/or the proximity head 106*b*-3 may move into close proximity of the wafer and, through one pass over the wafer 108, process the top and/or bottom surface of the wafer 108.

Figure 5D:
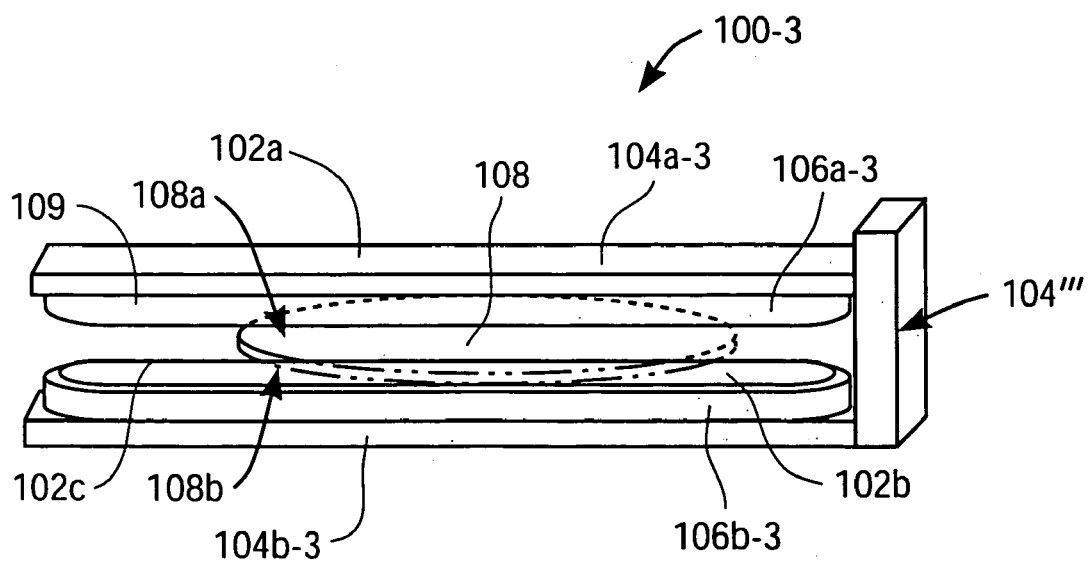
FIG. 5D shows a side view of a wafer processing system with the proximity heads in a horizontal configuration which is configured to clean and/or dry the wafer that is stationary in accordance with one embodiment of the present invention.

FIG. 5D shows a side view of a wafer processing system 100-3 with the proximity heads 106*a*-3 and 106*b*-3 in a horizontal configuration which is configured to process the wafer 108 that is stationary in accordance with one embodiment of the present invention. In this embodiment, the proximity head 106*a*-3 is in a horizontal position with the wafer 108 also in a horizontal position. By use of the proximity head 106*a*-3 and the proximity head 106*b*-3 that spans at least the diameter of the wafer 108, the wafer 108 may be processed in one pass by moving proximity heads 106*a*-3 and 106*b*-3 in the direction 121 as discussed in reference to FIG. 5C.

Figure 5E:
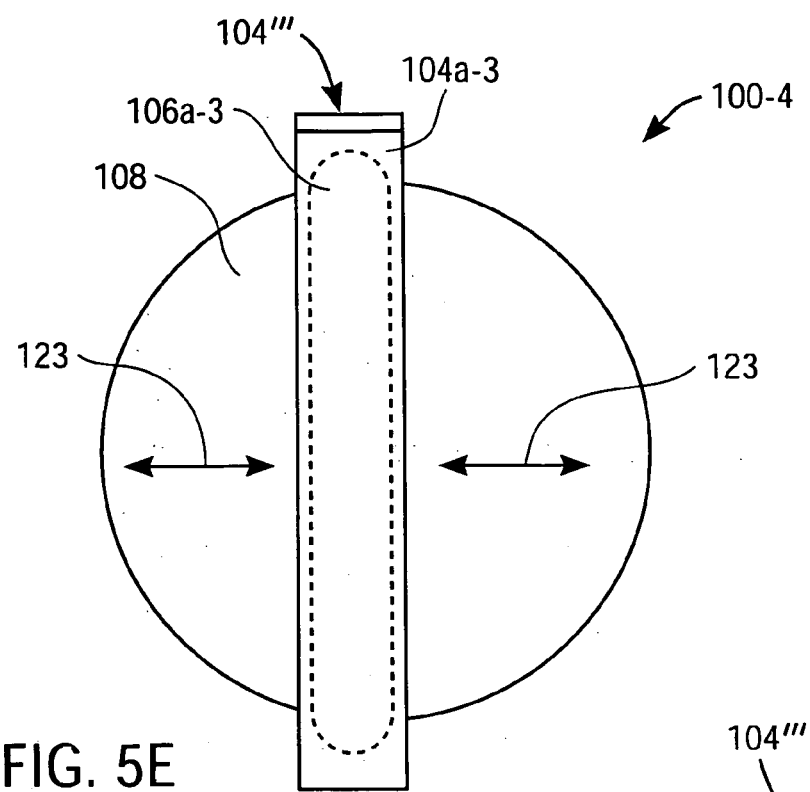
FIG. 5E shows a side view of a wafer processing system with the proximity heads in a vertical configuration enabled to clean and/or dry the wafer that is stationary in accordance with one embodiment of the present invention.

FIG. 5E shows a side view of a wafer processing system 100-4 with the proximity heads 106*a*-3 and 106*b*-3 in a vertical configuration enabled to process the wafer 108 that is stationary in accordance with one embodiment of the present invention. In this embodiment, the proximity heads 106*a*-3 and 106*b*-3 are in a vertical configuration, and the proximity heads 106*a*-3 and 106*b*-3 are configured to move either from left to right, or from right to left, beginning from a first edge of the wafer 108 to a second edge of the wafer 108 that is diametrically opposite to the first edge. Therefore, in such as embodiment, the proximity head carrier assembly 104''' may move the proximity heads 104*a*-3 and 104*b*-3 in close proximity with the wafer 108 and also enable the movement of the proximity heads 104*a*-3 and 104*b*-3 across the wafer from one edge to another so the wafer 108 may be processed in one pass thereby decreasing the time to process the wafer 108.

Figure 5F:
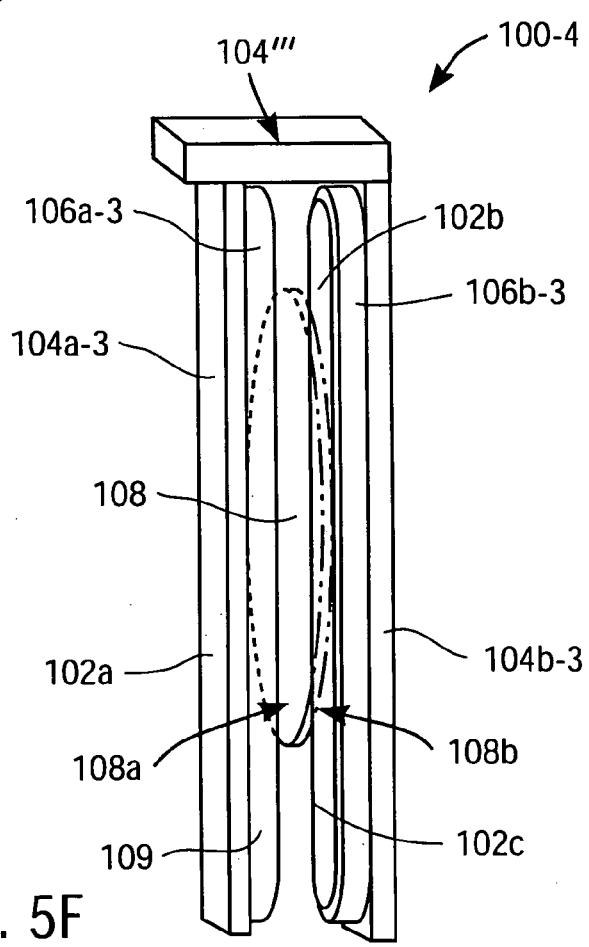
FIG. 5F shows an alternate side view of a wafer processing system that is shifted 90 degrees from the side view shown in FIG. 5E in accordance with one embodiment of the present invention.

FIG. 5F shows an alternate side view of a wafer processing system 100-4 that is shifted 90 degrees from the side view shown in FIG. 5E in accordance with one embodiment of the present invention. It should be appreciated that the proximity head carrier assembly 104''' may be oriented in any suitable manner such as for example, having the proximity head carrier assembly 104''' rotated 180 degrees as compared with what is shown in FIG. 5F.

Figure 5G:
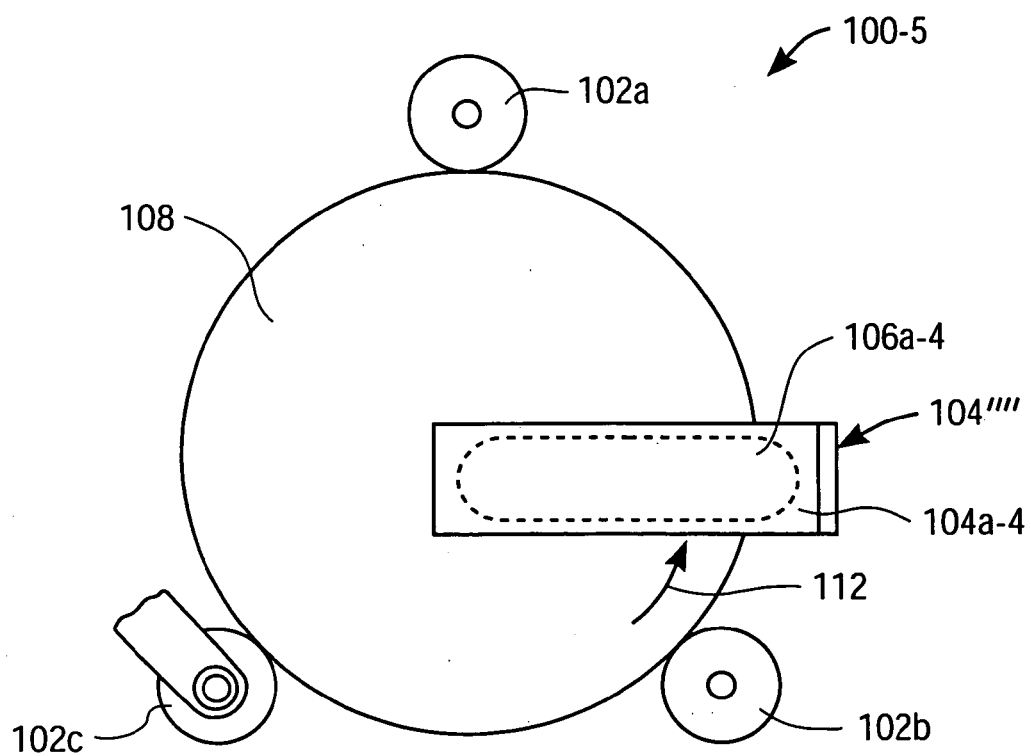
FIG. 5G shows a top view of a wafer processing system with a proximity head in a horizontal configuration which extends across a radius of the wafer in accordance with one embodiment of the present invention.

FIG. 5G shows a top view of a wafer processing system 100-5 with a proximity head 106*a*-4 in a horizontal configuration which extends across a radius of the wafer 108 in accordance with one embodiment of the present invention. In one embodiment, the proximity head 106*a*-4 extends across less than a radius of a substrate being processed. In another embodiment, the proximity head 106*a*-4 may extend the radius of the substrate being processed. In a preferable embodiment, the proximity head 106*a*-4 extends over a radius of the wafer 108 so the proximity head may process both the center point of the wafer 108 as well as an edge of the wafer 108 so the proximity head 106*a*-4 can cover and process the center point of the wafer and the edge of the wafer. In this embodiment, the proximity head 106*a*-4 may be moved into a processing position by a vertical movement of the upper arm 104*a*-4 so the proximity head 106*a*-4 can be in a position that is in close proximity to the wafer 108. Once the proximity head 106*a*-4 is in close proximity to the wafer 108, the wafer processing operation of a top surface of the wafer 108 can take place. Because, in one embodiment, the proximity head 106*a*-4 extends over the radius of the wafer, the wafer may be processed in one rotation.

Figure 5H:
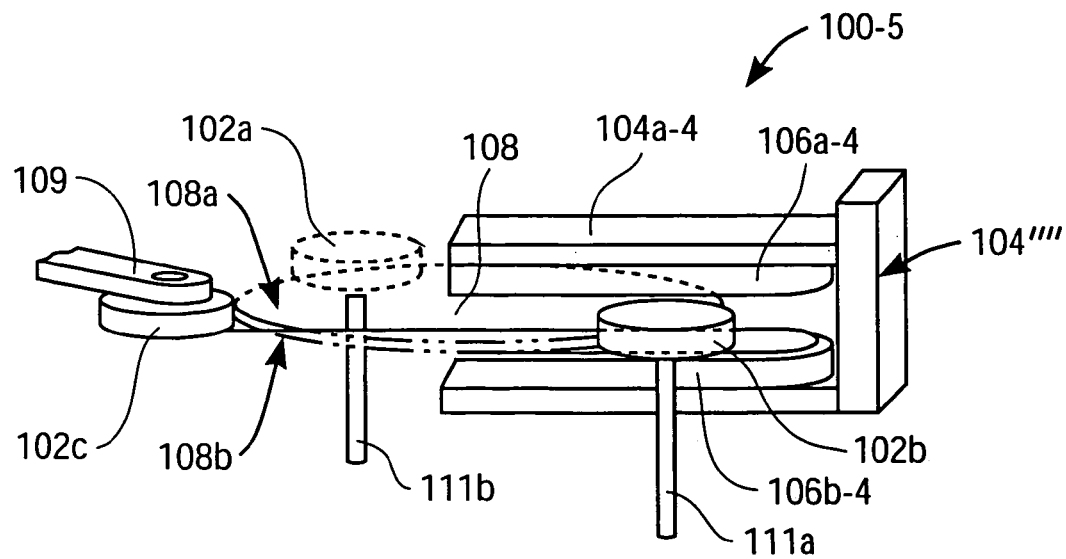
FIG. 5H shows a side view of a wafer processing system with the proximity heads and in a horizontal configuration which extends across a radius of the wafer in accordance with one embodiment of the present invention.

FIG. 5H shows a side view of a wafer processing system 100-5 with the proximity heads 106*a*-4 and 106*b*-4 in a horizontal configuration which extends across a radius of the wafer 108 in accordance with one embodiment of the present invention. In this embodiment, the proximity head 106*a*-4 and the proximity head 106*b*-4 both are elongated to be able to extend over and beyond the radius of the wafer 108. As discussed in reference to FIG. 5G, depending on the embodiment desired, the proximity head 106*a*-4 may extend less than a radius, exactly a radius, or greater than a radius of the wafer 108. In one embodiment, while the wafer 108 is being rotated, the proximity heads 106*a*-4 and 106*b*-4 are brought to close proximity of the wafer surfaces 108*a* and 108*b* by the top arm 104*a* and a bottom arm 106*b*-4 respectively. Because in one embodiment, the proximity heads 106*a*-4 and 106*b*-4 extend across greater than the radius of the wafer 108, only a full rotation may be needed to process the wafer 108.

As shown in FIGS. 2A–5H above, the proximity heads can move the meniscus across the surfaces of the wafer and even off the edge of the wafer. Unfortunately, the abrupt edge of the wafer can often cause the meniscus to fail (i.e., burst) causing droplets to be formed on the surface of the wafer. The droplets can then cause undesirable residue to form on the surfaces of the wafer as the droplets evaporate. One embodiment of the present invention provides additional support for the meniscus to move from the surface of the wafer to an adjacent edge platform. Alternatively, the meniscus can be formed on the adjacent edge platform and the moved across a gap between the edge platform and the wafer onto the wafer. The edge platform can also allow the meniscus to be moved completely off of the wafer surface before the meniscus is allowed to fail. The edge platform substantially eliminates meniscus failures on the surfaces of the wafer thereby providing a more complete cleaning process or drying process.

Figure 5I:
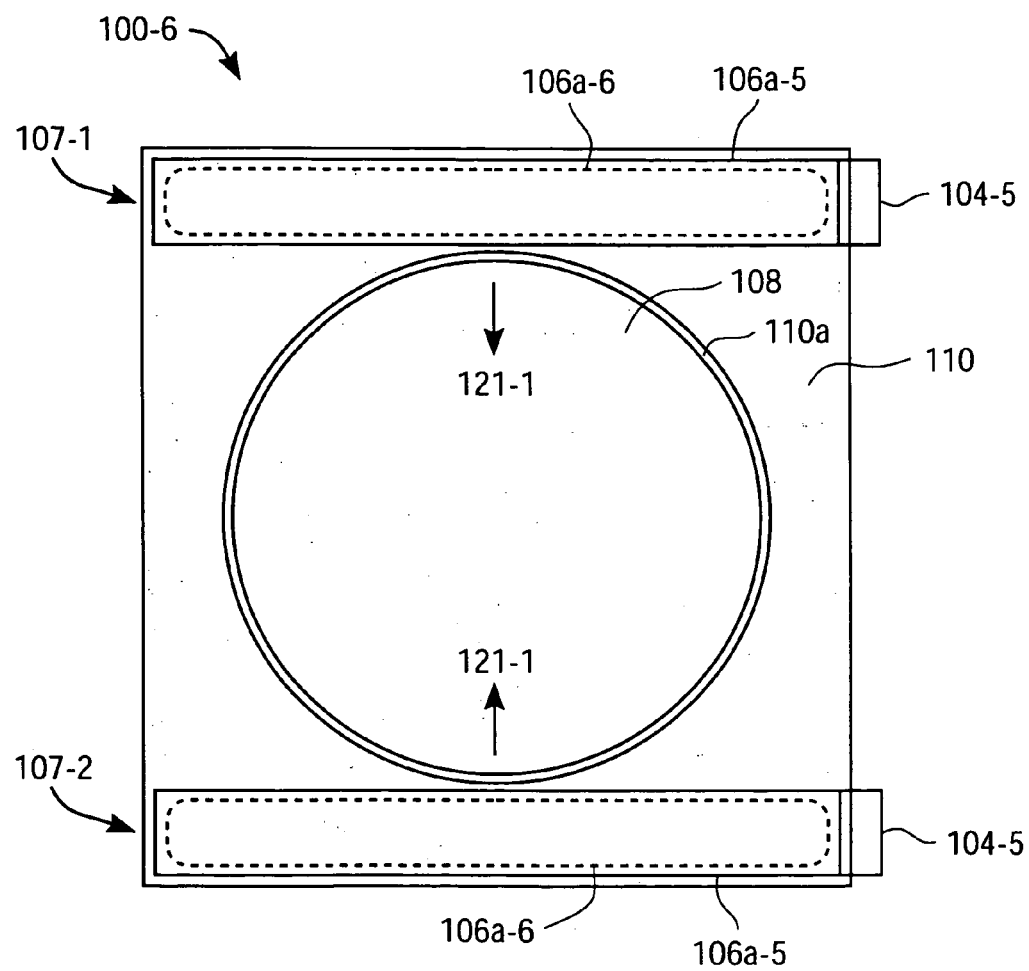
FIG. 5i shows a wafer processing system in accordance with one embodiment of the present invention.

FIG. 5*i* shows a wafer processing system 100-6 in accordance with one embodiment of the present invention. The wafer processing system 100-6 can be used in vertical or horizontal orientations. The wafer processing system 100-6 includes proximity heads 106*a*-5 and 106*b*-5 (shown in FIG. 5J below) that are wider than the diameter of the wafer 108. The wafer processing system 100-6 also includes an edge platform 110 that surrounds the wafer 108. A relatively small gap 110a (e.g., less than about 5 mm) is provided between the wafer 108 and the edge platform 110.

The edge platform 110 is approximately co-planer with the wafer 108, however, the edge platform may be slightly offset from the wafer surface. For example, if the wafer is about 700 micron in thickness, then the edge platform 110 could have a thickness of between about 600 micron and about 800 micron. As a result, a top surface of the edge platform 110 can be offset about 50 to about 100 micron or more relative to the top surface of the wafer 108. The edge platform 110 can be any thickness that can allow the proximity heads 106a-5 and 106b-5 to support the respective meniscuses 106a-6 and 106b-6 as the meniscuses is moved from the wafer 108 to the edge platform or from the edge platform to the wafer.

The wafer 108 may be held stationary by any suitable type of wafer holding device such as, for example, an edge grip, fingers with edge attachments, etc. The proximity head carrier assembly 104-5 is configured to be movable from beyond one edge of the wafer 108 across the diameter of the wafer 108 and beyond the edge on the other side of the wafer after crossing the entire wafer diameter. In this fashion, the proximity head 106a-5 and/or the proximity head 106b-5 may move from off of the edge of the wafer fully across the wafer following a path along a diameter of the wafer 108. A meniscus 106a-6 may thereby be formed by the proximity head 106a-5 while in position 107-1, on the edge platform 110 and fully off the surface of the wafer 108. Once the meniscus 106a-6 is formed off of the wafer 108, the proximity head 106a-5 can move (i.e., scan) the meniscus 106a-6 across the wafer to position 107-2 on the edge platform 110 also fully off the surface of the wafer 108. Alternatively, the proximity head 106a-5 can form the meniscus 106a-6 on the wafer 108 and then move the meniscus across the wafer and off of the wafer. Similarly, a corresponding meniscus 106b-6 may be formed and moved across the opposing surface of the edge platform 110 and wafer 108 by the proximity head 106b-5. The proximity heads 106a-5, 106b-5 can scan the respective sides of the wafer 108 individually or simultaneously, in substantial alignment with one another.

It should be appreciated that the proximity heads 106a-5 and/or 106b-5 may be moved by any suitable manner that would enable moving from beyond one edge of the wafer 108 to beyond another diametrically opposite edge. In one embodiment, the proximity head 106a-5 and/or the proximity head 106b-5 may move in directions 121-1 (e.g., top to bottom or bottom to top of FIG. 5i). Therefore, the wafer 108 may stay stationary without any rotation or movement and the proximity heads 106a-5 and/or the proximity head 106b-5 may move into close proximity of the wafer and, through one pass over the wafer 108, process the top and/or bottom surface of the wafer 108.

The wafer processing system 100-6 can be used to perform a linear scan of entire surface of the wafer 108 in one pass of the wafer, without requiring the wafer to rotate. A linear scan provides a high scan rate (e.g., more than about 20 to about 50 mm per second) across the wafer 108. This allows a uniform residence time (i.e., approximately constant residence time) of the meniscus 106a-6 on each portion of surface of the wafer 108. The uniform residence time can be very beneficial in maintaining, for example, a constant etch-rate across the entire surface of the wafer 108 during an etching process or a constant rinse process in a rinsing process, or a constant drying process in a drying process.

Devices and surfaces such as the edge platform 110 and the proximity heads 106a-5 and 106b-5 that are used in close proximity to the wafer 108 surface or edge and participate in (i.e., bound) one or more of the meniscuses 106a-6 and 106b-6 so as to assist in forming the meniscuses can be more efficient in moving the liquid contents of the meniscuses if an increased surface tension gradient is present. By way of example, the surface tension gradient can be increased when the proximity head has a lower surface tension than the wafer. The surface tension gradient can be greater because the wafer 108 is more hydrophobic than the proximity heads 106a-5 and 106b-5. A hydrophobic material has less attraction (e.g., higher surface tension) for a selected liquid. A hydrophilic material has a greater attraction (e.g., lower surface tension) for the selected liquid. By way of example, if the edge platform 110 has a lower surface tension (e.g., more hydrophilic) for the liquid contents of the meniscus 106a-6, than the wafer 108, then less of the liquid contents of the meniscus will tend to be left behind on the wafer (i.e., the wafer will be dryer) when the meniscus is moved off of the wafer and onto the edge platform 110. In another example, an increased surface tension gradient between the wafer 108 and the proximity heads 106a-5 and 106b-5 can allow the meniscuses to be more easily and effectively moved across the surface of the wafer. Maximizing the difference in surface tension (i.e., maximizing the surface tension gradient) will further enhance the drying effect of moving the meniscus from a first surface to a second surface.

Therefore the surface materials of such devices and surfaces can be selected to optimize the relative surface tensions of the devices and surfaces as compared to the wafer 108. By way of example, a proximity head having a more hydrophilic property than both the wafer 108 and the edge platform 110 will assist in minimizing the amount of liquid that may remain on the wafer as the meniscus is moved from the wafer to the edge platform. If the edge platform 110 is also more hydrophilic than the wafer 108, then the amount of liquid that may remain on the surface of the wafer may be even further reduced.

The edge platform 110 can be manufactured from any suitable material (e.g., glass, silicon, quartz, composite materials, plastic and combinations thereof). The edge platform 110 can be a hydrophobic or a hydrophilic material as selected for the specific process. By way of example, a hydrophilic edge platform 110 could reduce the possibility that the meniscus would leave any droplets on the wafer 108 as the meniscus was moved from the wafer 108 to the edge platform.

Figure 5J:
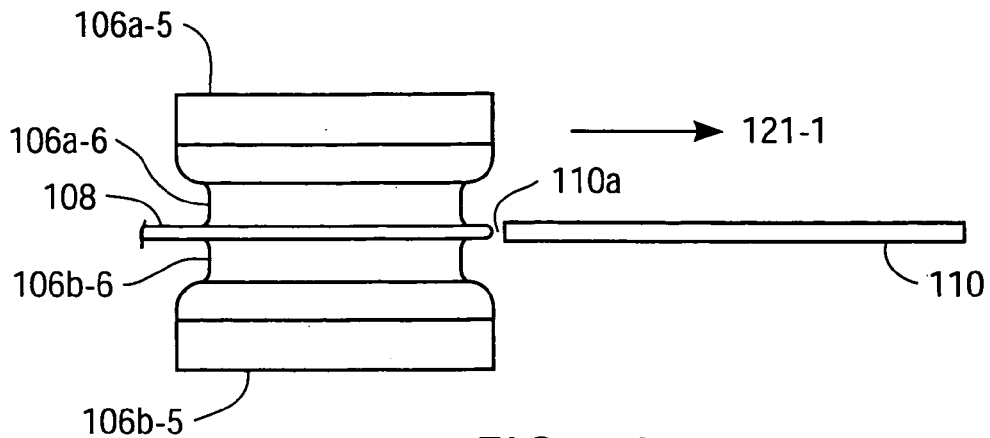
FIGS. 5J–5L show side views of the wafer processing system as the proximity heads move the meniscus from the surfaces of the wafer to the adjacent edge platform in accordance with one embodiment of the present invention.
Figure 5K:
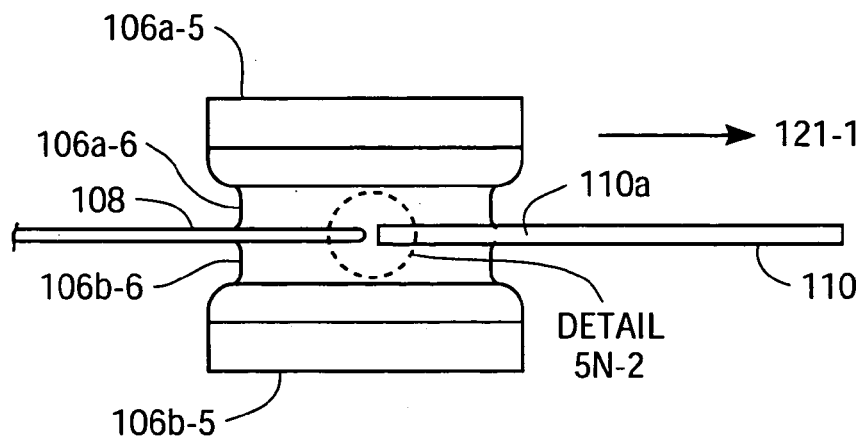
Figure 5L:
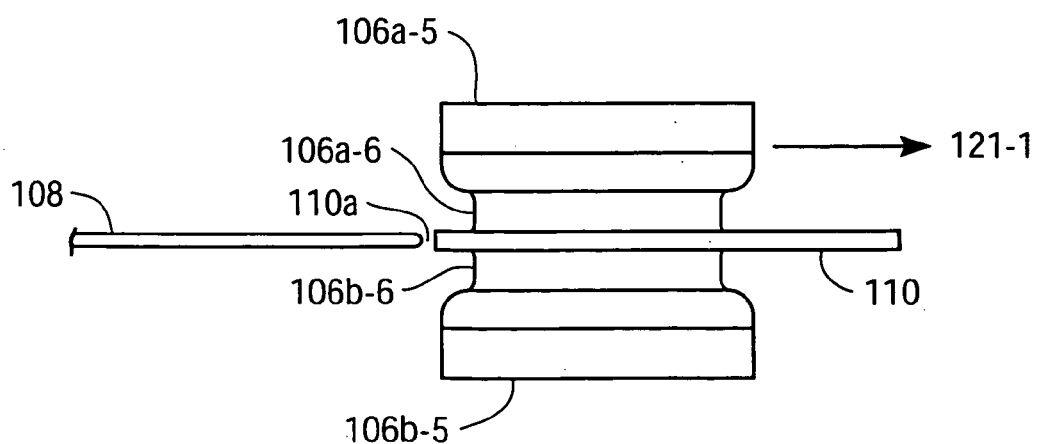

FIGS. 5J–5L show side views of the wafer processing system 100-6 as the proximity heads 106a-5 and 106b-5 move the respective meniscuses 106a-6, 106b-6 from the surfaces of the wafer 108 to the adjacent edge platform 110 in accordance with one embodiment of the present invention. As shown in FIG. 5J, the proximity heads 106a-5 and 106b-5 are supporting the respective meniscuses 106a-6 and 106b-6 on the wafer 108. The proximity heads 106a-5 and 106b-5 are moving the meniscuses in direction 121-1, toward the edge platform 110.

In FIG. 5K, the proximity heads 106a-5 and 106b-5 have moved the respective meniscuses 106a-6 and 106b-6 so that the meniscuses are supported partially on the wafer 108 and partially on the edge platform 110. The gap 110a between the edge platform 110 and the wafer 108 is fully filled by the meniscuses 106a-6 and 106b-6. The meniscuses 106a-6 and 106b-6 do not burst or fail due to the gap 110a because the gap is maintained at a size sufficiently small enough for one or both of the proximity heads 106a-5 and 106b-5 to fully support the respective meniscuses 106a-6, 106b-6 between the proximity heads.

In FIG. 5L, the proximity heads 106a-5 and 106b-5 have moved the respective meniscuses 106a-6 and 106b-6 so that the meniscuses are supported fully on the edge platform 110. Once the meniscuses 106a-6 and 106b-6 are moved fully on the edge platform 110, the meniscuses can be allowed to burst or collapse because the resulting droplets will not form on the wafer 108 but will form on the edge platform. As described in FIGS. 5J-L above, the proximity heads 106a-5 and 106b-5 can move the meniscuses from a first surface (e.g., the wafer 108 or the edge platform 110) to a second surface (e.g., the wafer 108 or the edge platform 110), in either direction.

Figure 5M:
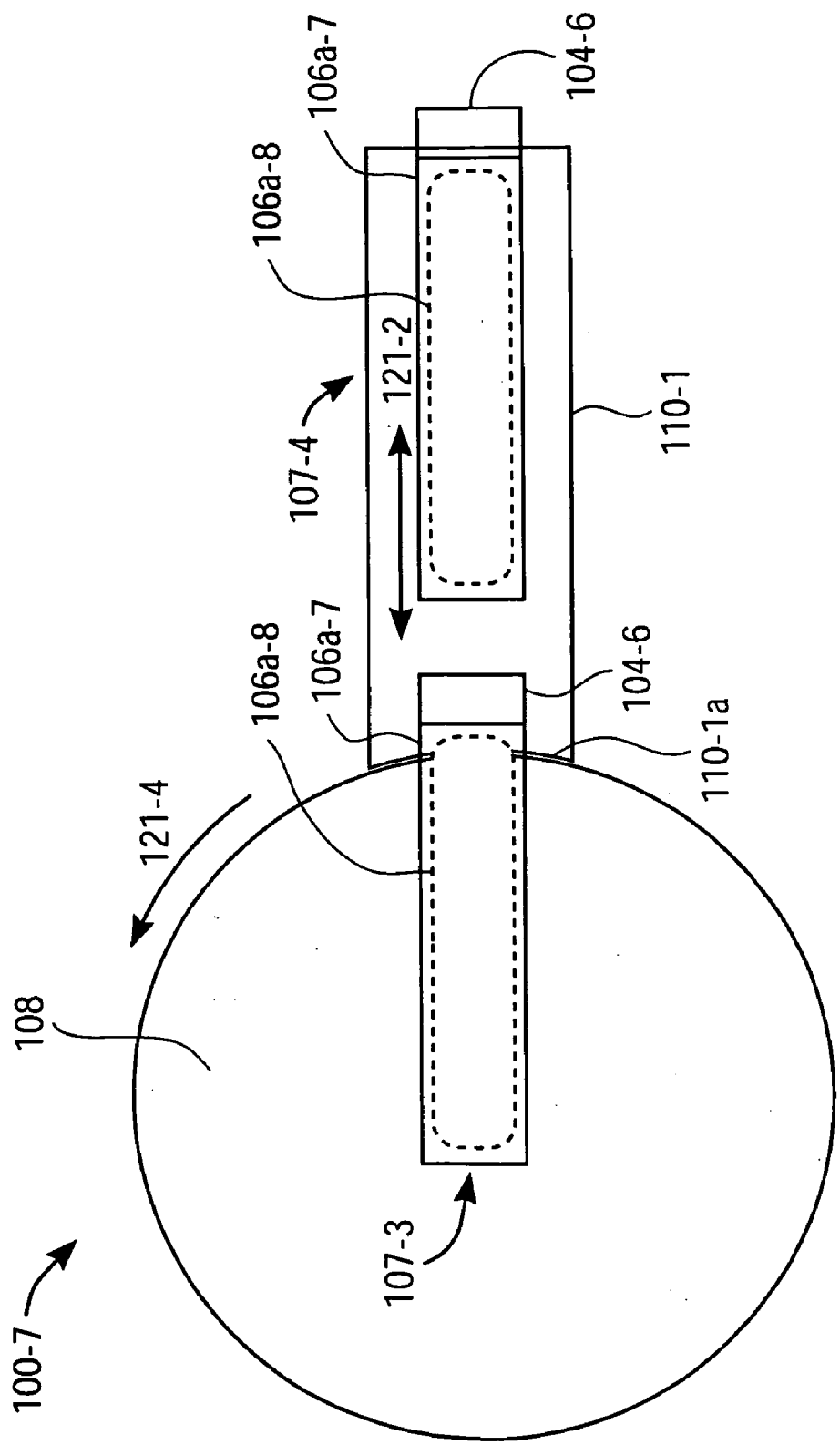
FIG. 5M shows a wafer processing system in accordance with one embodiment of the present invention.

FIG. 5M shows a wafer processing system 100-7 in accordance with one embodiment of the present invention. The wafer processing system 100-7 can be used in vertical or horizontal orientations or any orientation between the vertical and the horizontal. The wafer processing system 100-7 includes a partial edge platform 110-1, rather than a full edge platform 110 included in the wafer processing system 100-6 of FIG. 5i above. In the wafer processing system 100-7 the wafer 108 can be stationary or rotated. The proximity heads 106a-7 and 106b-7 (hidden directly below proximity head 106a-7) can form the respective meniscuses 106a-8 and 106b-8 in position 107-4 on the edge platform 110-1 and then move the meniscuses into position 107-3 partially on the wafer 108 and spanning a gap 110-1a to the edge platform. The meniscuses can also be moved off of the wafer to return the meniscuses position 107-4 fully on the edge platform. The edge of the wafer 108 can also be processed (e.g., cleaned, etched, rinsed, dried, etc.) as the wafer rotates and the edge passes through the meniscuses 106a-8 and 106b-8 in position 107-3. The proximity heads 106a-7 and 106b-7 have a length of at least the radius of the wafer 108 so that the proximity heads and the respective meniscuses can cover the entire surface of the wafer in a single rotation of the wafer (e.g., in direction 121-4) when in position 107-3.

Figure 5N:
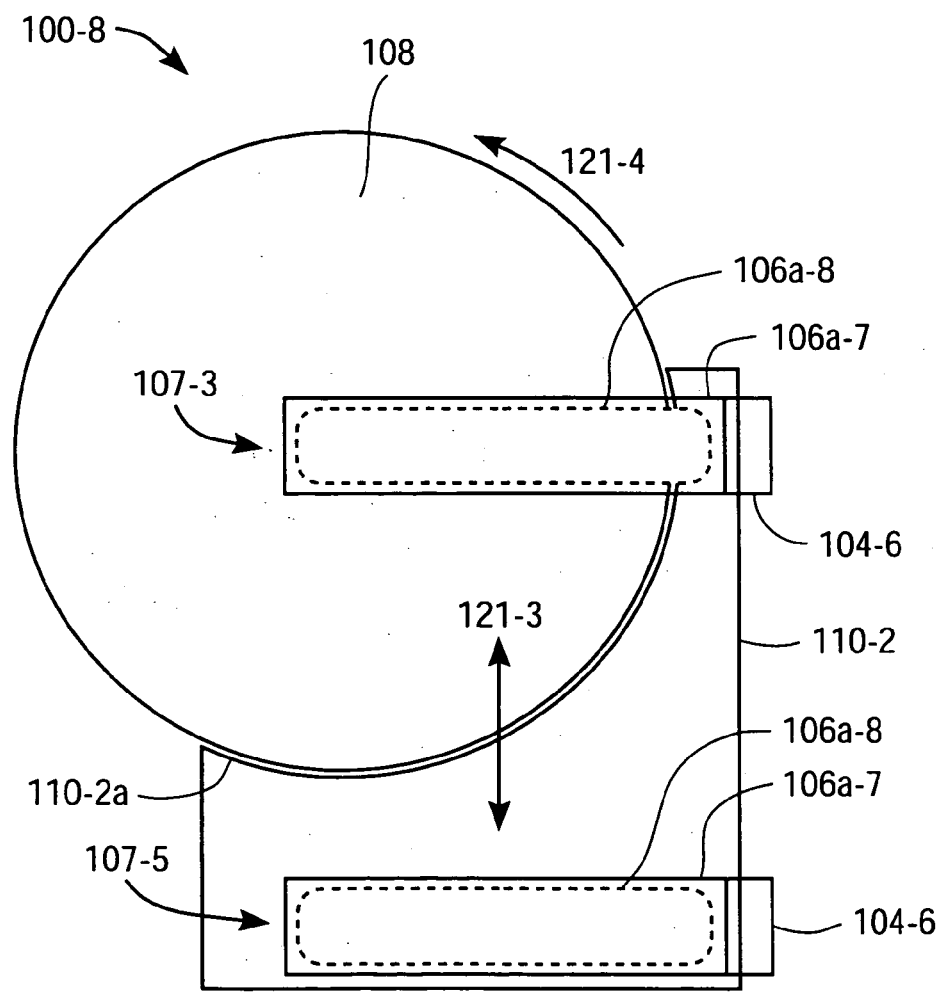
FIG. 5N shows a wafer processing system in accordance with one embodiment of the present invention.
Figures 1, 5N:
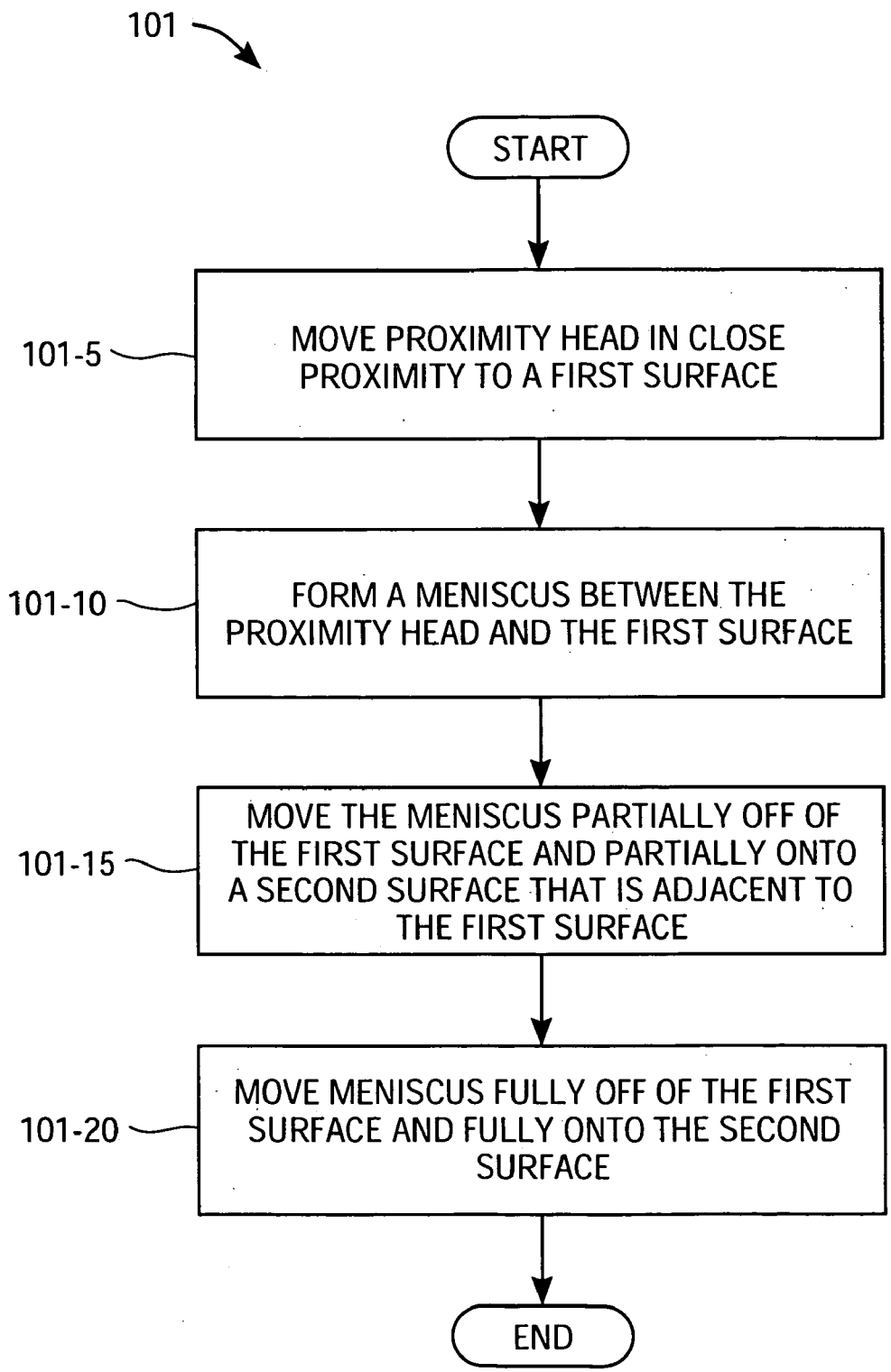

FIG. 5N shows a wafer processing system 100-8 in accordance with one embodiment of the present invention. The wafer processing system 100-8 can be used in vertical or horizontal orientations. The wafer processing system 100-8 includes a partial edge platform 110-2 similar to the wafer processing system 100-7 above. In the wafer processing system 100-8 the wafer 108 can be stationary or rotated. The proximity heads 106a-7 and 106b-7 (hidden directly below proximity head 106a-7) can form the respective meniscuses 106a-8 and 106b-8 in position 107-5 on the edge platform 110-2 and then move the meniscuses into position 107-3, partially on the wafer 108 and spanning a gap 110-2a to the edge platform. The meniscuses can also be moved off of the wafer 108 and fully onto the edge platform 110-2, in position 107-5. In one embodiment, the partial edge platform 110-2 can also be movable relative to the wafer 108. By way of example, the partial edge platform 110-2 can move with the proximity head 106a-7 so as maintain alignment with the proximity head and to support that portion of the meniscus 106a-8 that is not supported by the wafer 108. In this manner, a smaller partial edge platform can be used.

Figure 1:
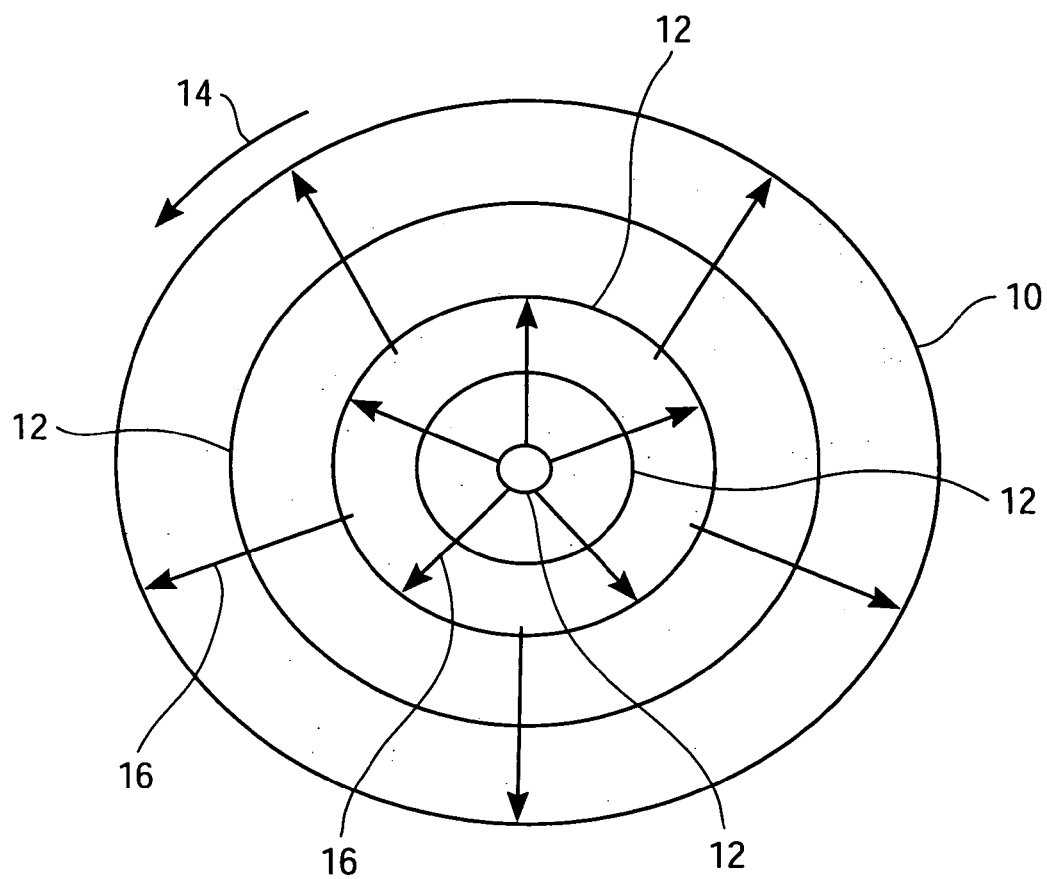
FIG. 1 illustrates movement of cleaning fluids on a wafer during an SRD drying process.

FIG. 5N-1 is a flowchart diagram of the method operations 101 of using a wafer processing systems 100-6, 100-7 and 100-8 in accordance with one embodiment of the present invention. In an operation 101-5, a proximity head is positioned in close proximity over a first surface (e.g., an edge platform or a wafer surface). In an operation 101-10, a meniscus is formed between the proximity head and the first surface. The first surface is adjacent to a second surface (e.g., the other of an edge platform or a wafer surface). The first surface may be in contact with the second surface or maybe separated from the second surface by a relatively small gap or separating space. In an operation 101-20, the proximity head moves the meniscus fully off of the first surface and fully onto the second surface.

By way of example, in operation 101-5, the proximity head 106a-5 is positioned in close proximity to the surface of the wafer 108 as shown in FIG. 5J above. In operation 101-10, the proximity head 106a-5 can form meniscus 106a-6 between the proximity head and the surface of the wafer 108.

In operation 101-15, the proximity head 106a-5 moves the meniscus 106a-6 at least partially off of the surface of the wafer 108 to the adjacent edge platform 110 as shown in FIG. 5K above. In operation 101-20, the proximity head 106a-5 moves the meniscus 106a-6 fully off of the surface of the wafer 108 and fully onto the edge platform 110 as shown in FIG. 5L above.

Once the meniscus 106a-6 is fully off of the surface of the wafer 108, the meniscus can be allowed to burst (e.g., liquid supply to the meniscus shut down). Since the meniscus 106a-6 is fully off of the surface of the wafer 108, any droplets that may form when the meniscus is allowed to burst will not form on the surface of the wafer.

Figures 2, 5N:
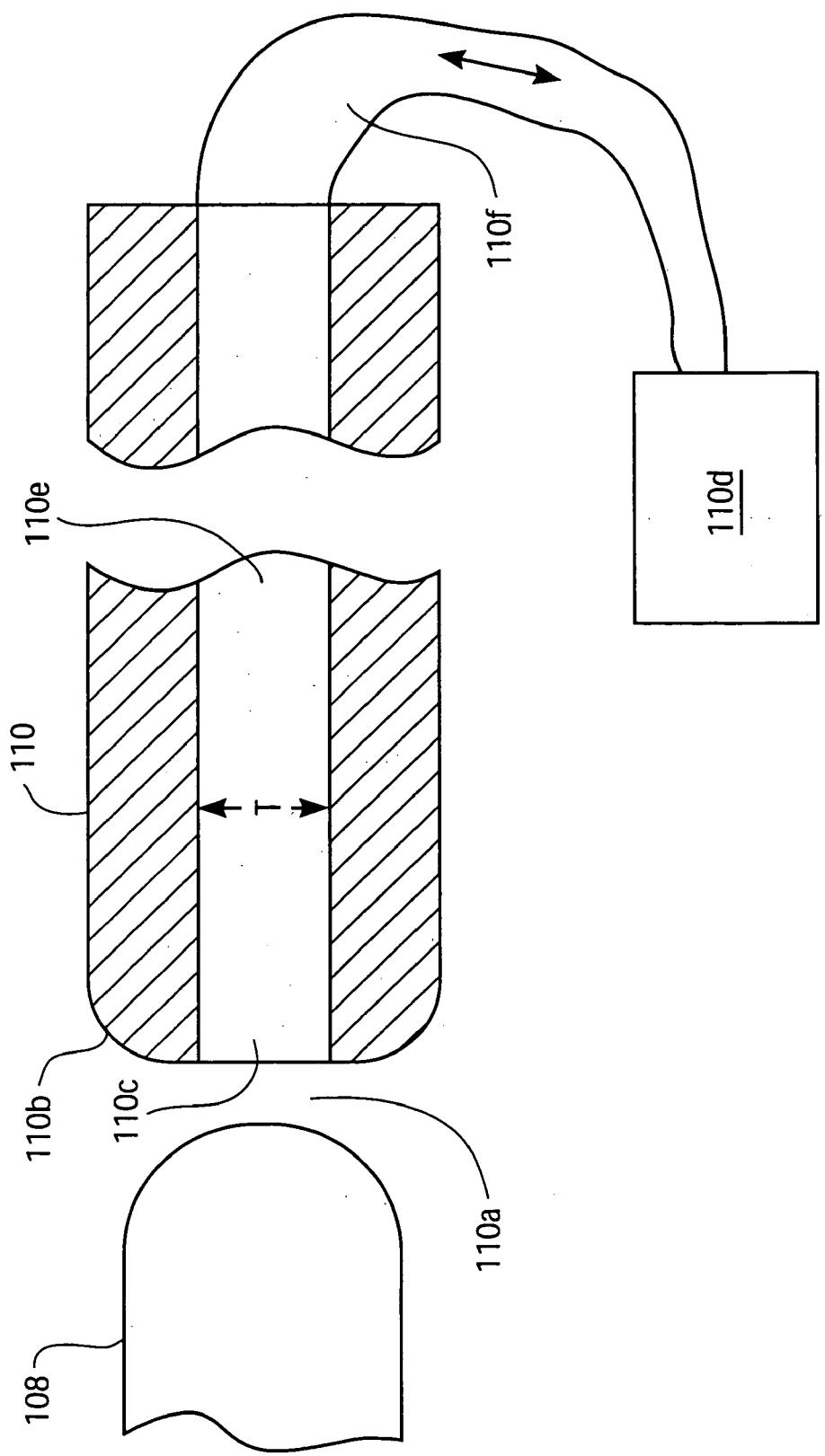

FIG. 5N-2 is a detailed cross-sectional view of the edge platform 110, in accordance with one embodiment of the present invention. The edge 110b of the edge platform 110 can include rounded corners (as shown) or even a completely "beveled" (e.g., angled, fully rounded, etc.) similar to the beveled or rounded edge of the wafer 108. The edge platform 110 can have a surface finish quality similar to that of the wafer 108 or the proximity heads described elsewhere herein. The edge platform 110 can be thicker or thinner than the wafer 108. By way of example, a typical wafer is about 750 micron in thickness. The edge platform 110 can be as thin as about 500 micron and as thick as about 1.2 mm or more.

In one embodiment, the edge 10b of the edge platform 110 can also include multiple inlets and/or outlets 110c that are arranged along the edge 110b. The multiple inlets 110c can be vacuum inlets to remove excess fluid in the gap 110a between the edge platform 110 and the wafer 108. The multiple inlets and/or outlets 110c can also include outlets for injecting IPA vapor (e.g., on a carrier gas) and even for injecting fluid for supporting the meniscus. One or more of the multiple inlets and/or outlets 110c are connected to a source 110d through a channel 110e inside the edge platform 110 and a interconnecting tubing/piping 110f. The channel 110e can be as wide as physically possible given the thickness constraint of the edge platform 110. By way of example, an edge platform 110 having a thickness of about 1.2 mm can support a channel 110e of about 800 micron in thickness (T). Conversely, a an edge platform 110 having a thickness of about 600 micron can support a channel 110e of about 250 micron in thickness (T). The multiple inlets and/or outlets 110c can also be combined to form a slot in the edge 110b of the edge platform 110. The multiple inlets and/or outlets 110c can also be used for more than one function. By way of example, a first portion of the multiple inlets and/or outlets 110c can be coupled to an IPA source to inject IPA into the gap 110a. Simultaneously, a second portion of the multiple inlets and/or outlets 110c can be coupled to a vacuum source to remove excess fluid from the gap 110a.

Figure 6A:
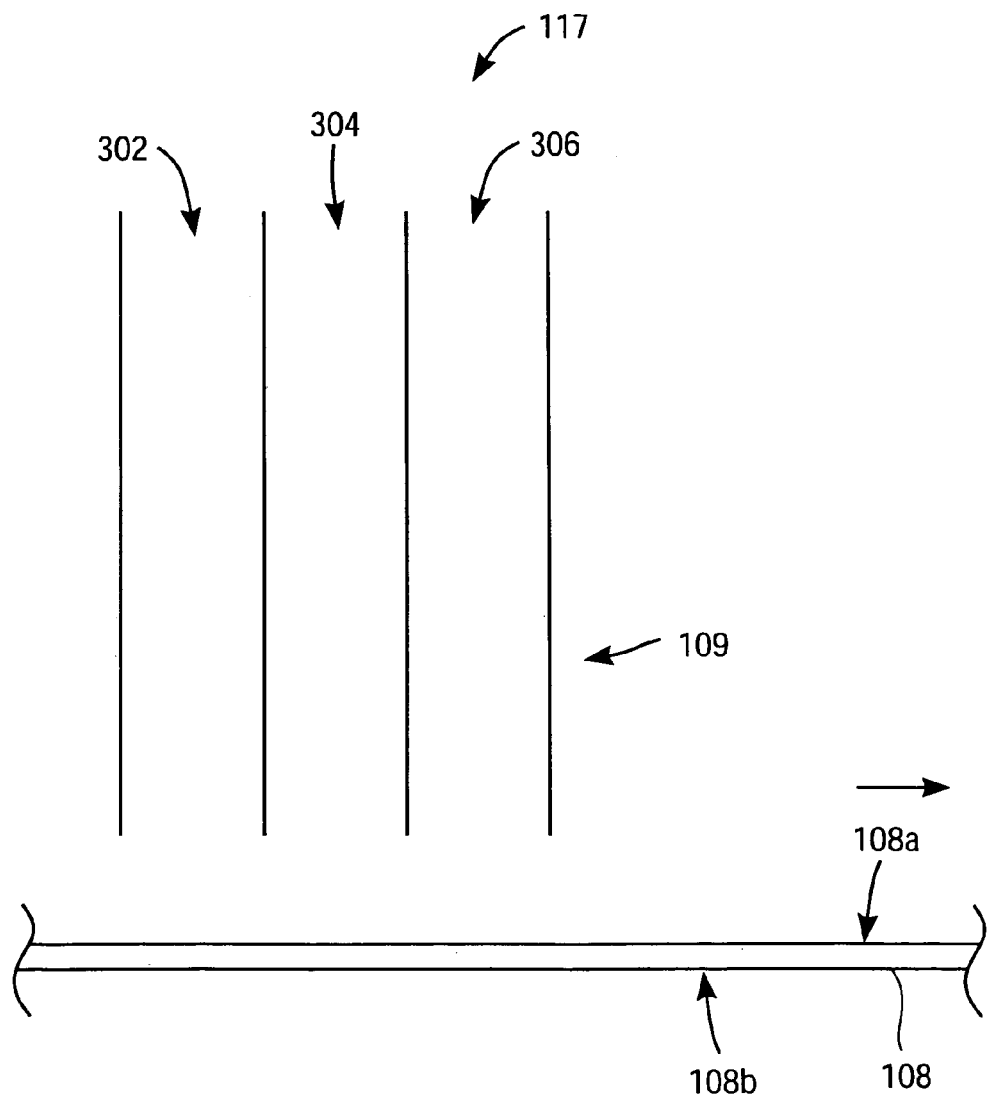
FIG. 6A shows a proximity head inlet/outlet orientation that may be utilized to clean and dry the wafer in accordance with one embodiment of the present invention.

FIG. 6A shows a proximity head inlet/outlet orientation 117 that may be utilized to process the wafer 108 in accordance with one embodiment of the present invention. In one embodiment, the orientation 117 is a portion of a proximity head 106a where other source inlets 302 and 306 in addition to other source outlets 304 may be utilized in addition to the orientation 117 shown. The orientation 117 may include a source inlet 306 on a leading edge 109 with a source outlet 304 in between the source inlet 306 and the source outlet 302.

Figure 6B:
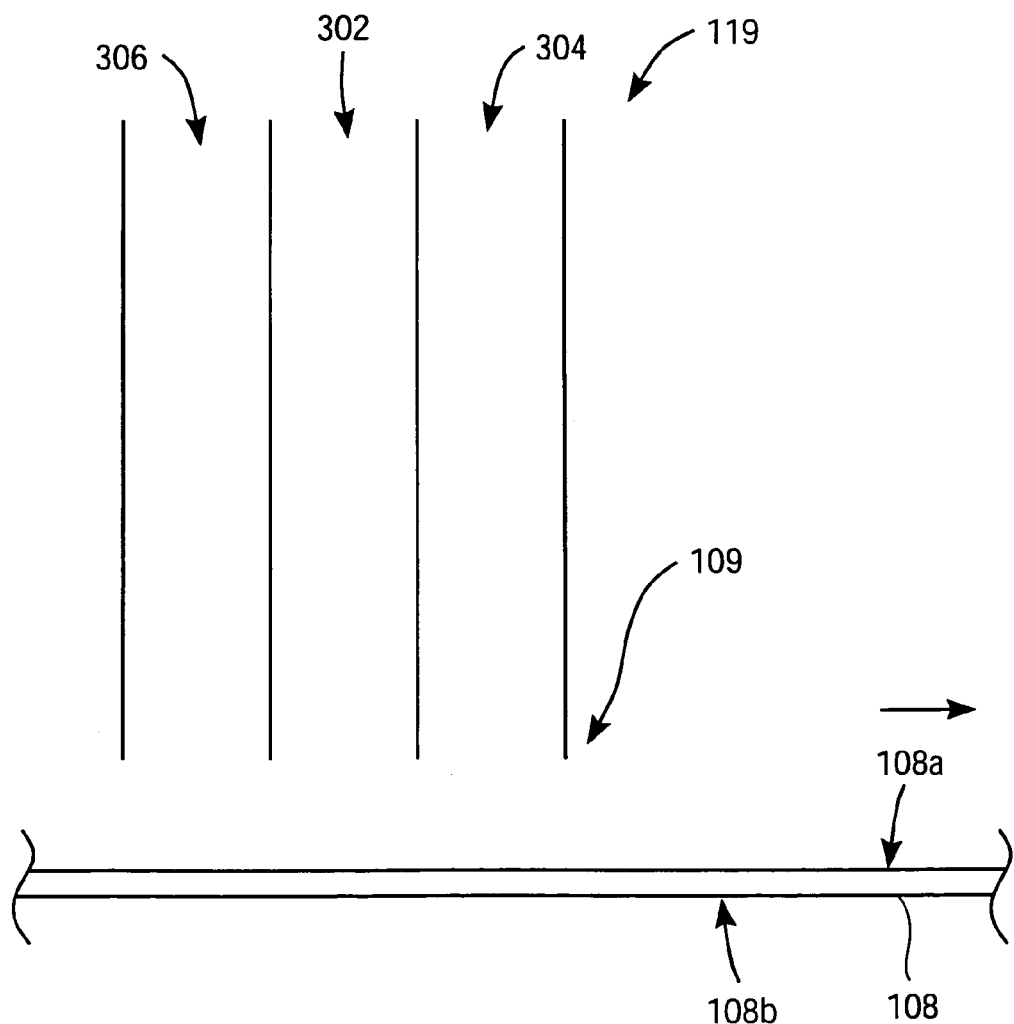
FIG. 6B shows another proximity head inlet/outlet orientation that may be utilized to clean and dry the wafer in accordance with one embodiment of the present invention.

FIG. 6B shows another proximity head inlet/outlet orientation 119 that may be utilized to process the wafer 108 in accordance with one embodiment of the present invention. In one embodiment, the orientation 119 is a portion of a proximity head 106a where other source inlets 302 and 306 in addition to other source outlets 304 may be utilized in addition to the orientation 119 shown. The orientation 119 may include a source outlet 304 on a leading edge 109 with a source inlet 302 in between the source outlet 304 and the source inlet 306.

Figure 6C:
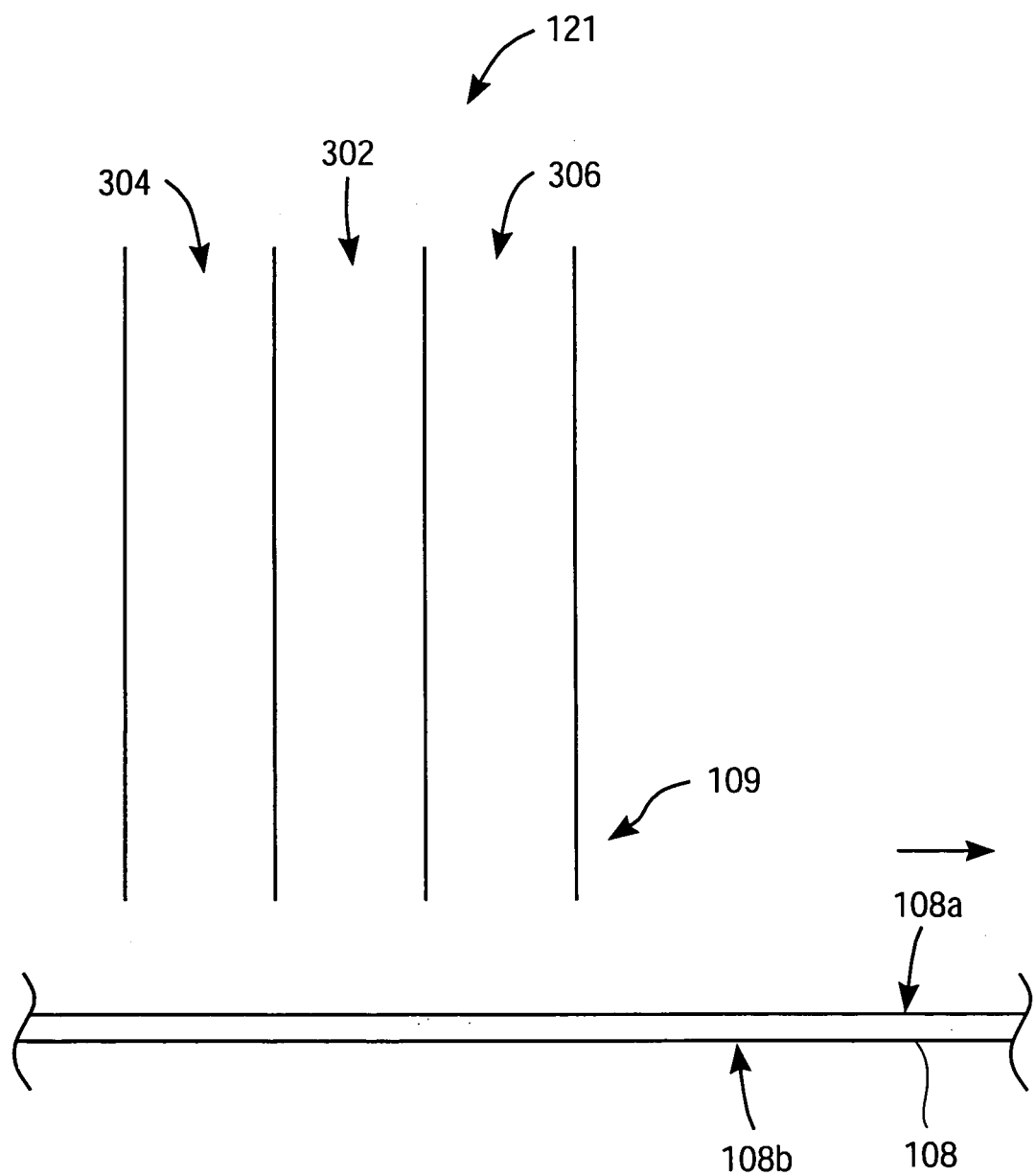
FIG. 6C shows a further proximity head inlet/outlet orientation that may be utilized to clean and dry the wafer in accordance with one embodiment of the present invention.

FIG. 6C shows a further proximity head inlet/outlet orientation 121 that may be utilized to process the wafer 108 in accordance with one embodiment of the present invention. In one embodiment, the orientation 121 is a portion of a proximity head 106a where other source inlets 302 and 306 in addition to other source outlets 304 may be utilized in addition to the orientation 119 shown. The orientation 119 may include a source inlet 306 on a leading edge 109 with a source inlet 302 in between the source outlet 304 and the source outlet 306.

Figure 6D:
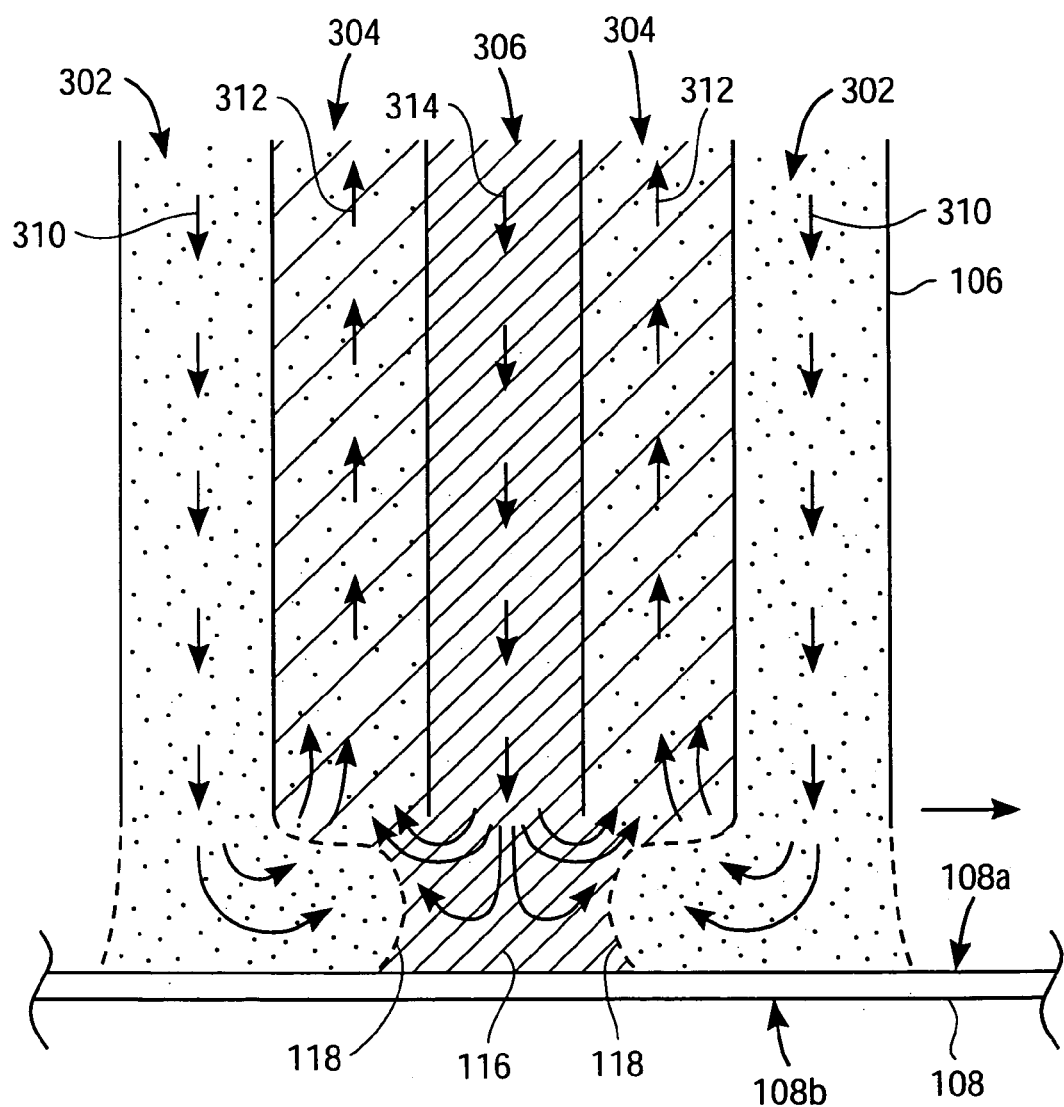
FIG. 6D illustrates a preferable embodiment of a wafer drying process that may be conducted by a proximity head in accordance with one embodiment of the present invention.

FIG. 6D illustrates a preferable embodiment of a wafer drying process that may be conducted by a proximity head 106a in accordance with one embodiment of the present invention. Although FIG. 6 shows a top surface 108a being dried, it should be appreciated that the wafer drying process may be accomplished in substantially the same way for the bottom surface 108b of the wafer 108. In one embodiment, a source inlet 302 may be utilized to apply isopropyl alcohol (IPA) vapor toward a top surface 108a of the wafer 108, and a source inlet 306 may be utilized to apply deionized water (DIW) toward the top surface 108a of the wafer 108. In addition, a source outlet 304 may be utilized to apply vacuum to a region in close proximity to the wafer surface to remove fluid or vapor that may located on or near the top surface 108a. It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is input through use of a $N_2$ carrier gas. Moreover, although DIW is utilized herein, any other suitable fluid may be utilized that may enable or enhance the wafer processing such as, for example, water purified in other ways, cleaning fluids, etc. In one embodiment, an IPA inflow 310 is provided through the source inlet 302, a vacuum 312 may be applied through the source outlet 304 and DIW inflow 314 may be provided through the source inlet 306. Therefore, an embodiment of the IPA-vacuum-DIW orientation as described above in reference to FIG. 2 is utilized. Consequently, if a fluid film resides on the wafer 108, a first fluid pressure may be applied to the wafer surface by the IPA inflow 310, a second fluid pressure may be applied to the wafer surface by the DIW inflow 314, and a third fluid pressure may be applied by the vacuum 312 to remove the DIW, IPA and the fluid film on the wafer surface.

Therefore, in one embodiment, as the DIW inflow 314 and the IPA inflow 310 is applied toward a wafer surface, any fluid on the wafer surface is intermixed with the DIW inflow 314. At this time, the DIW inflow 314 that is applied toward the wafer surface encounters the IPA inflow 310. The IPA forms an interface 118 (also known as an IPA/DIW interface 118) with the DIW inflow 314 and along with the vacuum 312 assists in the removal of the DIW inflow 314 along with any other fluid from the surface of the wafer 108. In one embodiment, the IPA/DIW interface 118 reduces the surface of tension of the DIW. In operation, the DIW is applied toward the wafer surface and almost immediately removed along with fluid on the wafer surface by the vacuum applied by the source outlet 304. The DIW that is applied toward the wafer surface and for a moment resides in the region between a proximity head and the wafer surface along with any fluid on the wafer surface forms a meniscus 116 where the borders of the meniscus 116 are the IPA/DIW interfaces 118. Therefore, the meniscus 116 is a constant flow of fluid being applied toward the surface and being removed at substantially the same time with any fluid on the wafer surface. The nearly immediate removal of the DIW from the wafer surface prevents the formation of fluid droplets on the region of the wafer surface being dried thereby reducing the possibility of contamination drying on the wafer 108. The pressure (which is caused by the flow rate of the IPA) of the downward injection of IPA also helps contain the meniscus 116.

The flow rate of the $N_2$ carrier gas for the IPA assists in causing a shift or a push of water flow out of the region between the proximity head and the wafer surface and into the source outlets 304 through which the fluids may be output from the proximity head. Therefore, as the IPA and the DIW is pulled into the source outlets 304, the boundary making up the IPA/DIW interface 118 is not a continuous boundary because gas (e.g., air) is being pulled into the source outlets 304 along with the fluids. In one embodiment, as the vacuum from the source outlet 304 pulls the DIW, IPA, and the fluid on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the IPA, DIW, and vacuum as long as the meniscus 116 can be maintained. In one embodiment, the flow rate of the DIW through a set of the source inlets 306 is between about 25 ml per minute to about 3,000 ml per minute. In a preferable embodiment, the flow rate of the DIW through the set of the source inlets 306 is about 400 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304 more flow for larger head.

In one embodiment, the flow rate of the IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the IPA, DIW, and the vacuum.

Figure 6E:
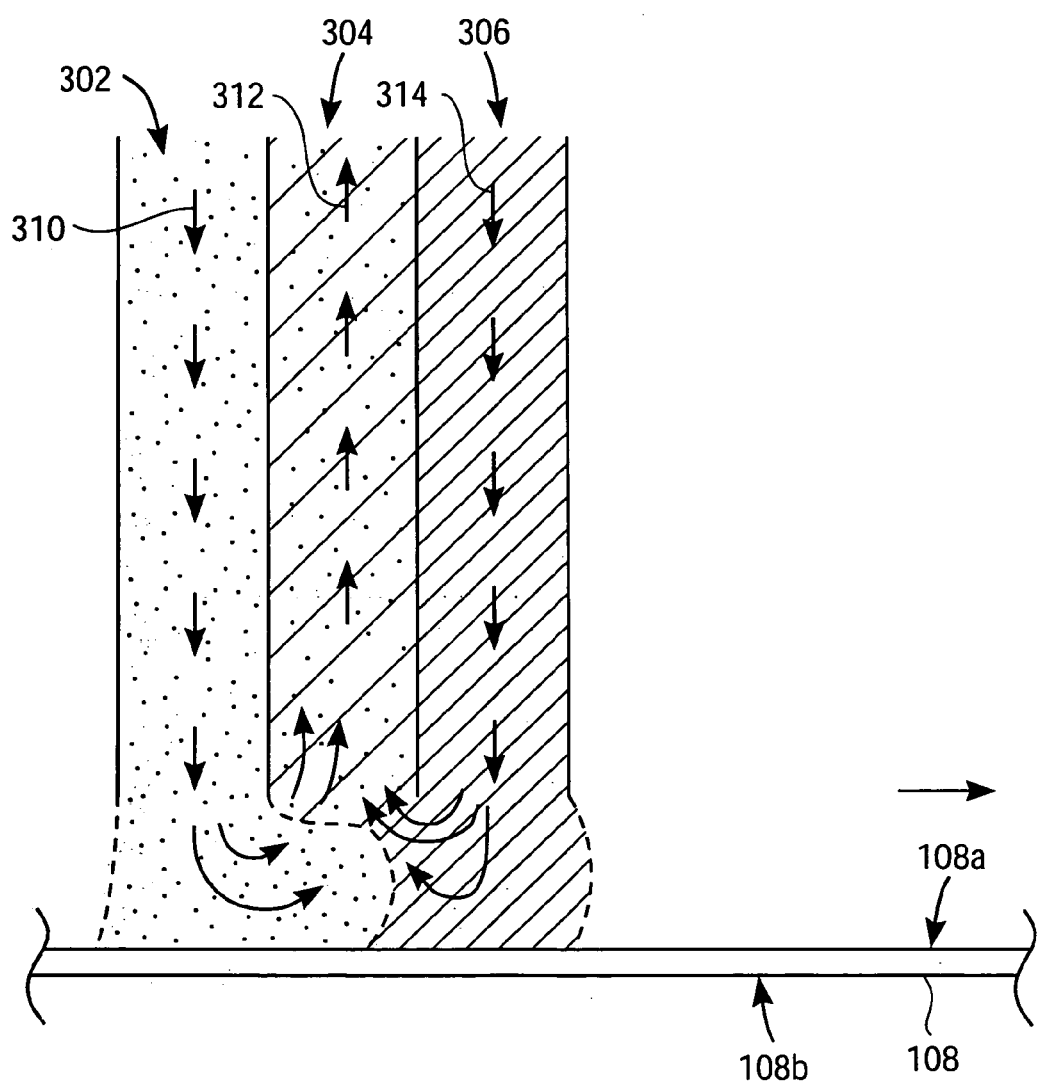
FIG. 6E shows another wafer drying process using another source inlet/outlet orientation that may be conducted by a proximity head in accordance with one embodiment of the present invention.

FIG. 6E shows another wafer drying process using another source inlet/outlet orientation that may be conducted by a proximity head 106a in accordance with one embodiment of the present invention. In this embodiment, the proximity head 106a may be moved over the top surface 108a of the wafer 108 so the meniscus may be moved along the wafer surface 108a. The meniscus applies fluid to the wafer surface and removes fluid from the wafer surface thereby cleaning and drying the wafer simultaneously. In this embodiment, the source inlet 306 applies a DIW flow 314 toward the wafer surface 108a, the source inlet 302 applies IPA flow 310 toward the wafer surface 108a, and the source outlet 312 removes fluid from the wafer surface 108a. It should be appreciated that in this embodiment as well as other embodiments of the proximity head 106a described herein, additional numbers and types of source inlets and source outlets may be used in conjunction with the orientation of the source inlets 302 and 306 and the source outlets 304 shown in FIG. 6E. In addition, in this embodiment as well as other proximity head embodiments, by controlling the amount of flow of fluids onto the wafer surface 108a and by controlling the vacuum applied, the meniscus may be managed and controlled in any suitable manner. For example, in one embodiment, by increasing the DIW flow 314 and/or decreasing the vacuum 312, the outflow through the source outlet 304 may be nearly all DIW and the fluids being removed from the wafer surface 108a. In another embodiment, by decreasing the DIW flow 314 and/or increasing the vacuum 312, the outflow through the source outlet 304 may be substantially a combination of DIW and air as well as fluids being removed from the wafer surface 108a.

Figure 6F:
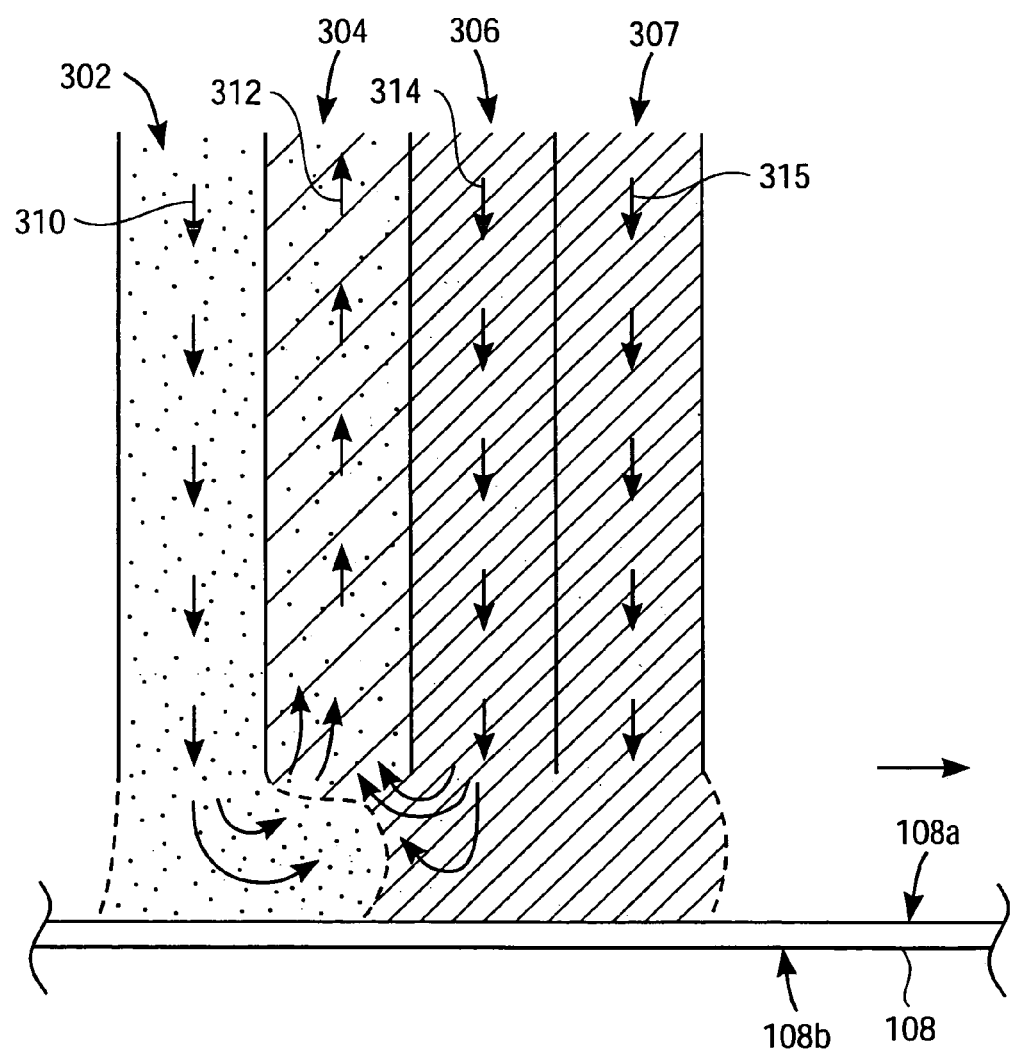
FIG. 6F shows another source inlet and outlet orientation where an additional source outlet may be utilized to input an additional fluid in accordance with one embodiment of the present invention.

FIG. 6F shows another source inlet and outlet orientation where an additional source outlet 307 may be utilized to input an additional fluid in accordance with one embodiment of the present invention. The orientation of inlets and outlets as shown in FIG. 6E is the orientation described in further detail in reference to FIG. 6D except the additional source outlet 307 is included adjacent to the source inlet 306 on a side opposite that of the source outlet 304. In such an embodiment, DIW may be input through the source inlet 306 while a different solution such as, for example, a cleaning solution may be input through the source inlet 307. Therefore, a cleaning solution flow 315 may be utilized to enhance cleaning of the wafer 108 while at substantially the same time drying the top surface 108a of the wafer 108.

FIG. 7A illustrates a proximity head 106 performing a drying operation in accordance with one embodiment of the present invention. The proximity head 106, in one embodiment, moves while in close proximity to the top surface 108a of the wafer 108 to conduct a cleaning and/or drying operation. It should be appreciated that the proximity head 106 may also be utilized to process (e.g., clean, dry, etc.) the bottom surface 108b of the wafer 108. In one embodiment, the wafer 108 is rotating so the proximity head 106 may be moved in a linear fashion along the head motion while fluid is removed from the top surface 108a. By applying the IPA 310 through the source inlet 302, the vacuum 312 through source outlet 304, and the deionized water 314 through the source inlet 306, the meniscus 116 as discussed in reference to FIGS. 6A–6F may be generated.

FIG. 7B shows a top view of a portion of a proximity head 106 in accordance with one embodiment of the present invention. In the top view of one embodiment, from left to right are a set of the source inlet 302, a set of the source outlet 304, a set of the source inlet 306, a set of the source outlet 304, and a set of the source inlet 302. Therefore, as N$_2$/IPA and DIW are input into the region between the proximity head 106 and the wafer 108, the vacuum removes the N$_2$/IPA and the DIW along with any fluid film that may reside on the wafer 108. The source inlets 302, the source inlets 306, and the source outlets 304 described herein may also be any suitable type of geometry such as for example, circular opening, square opening, etc. In one embodiment, the source inlets 302 and 306 and the source outlets 304 have circular openings.

Figure 7C:
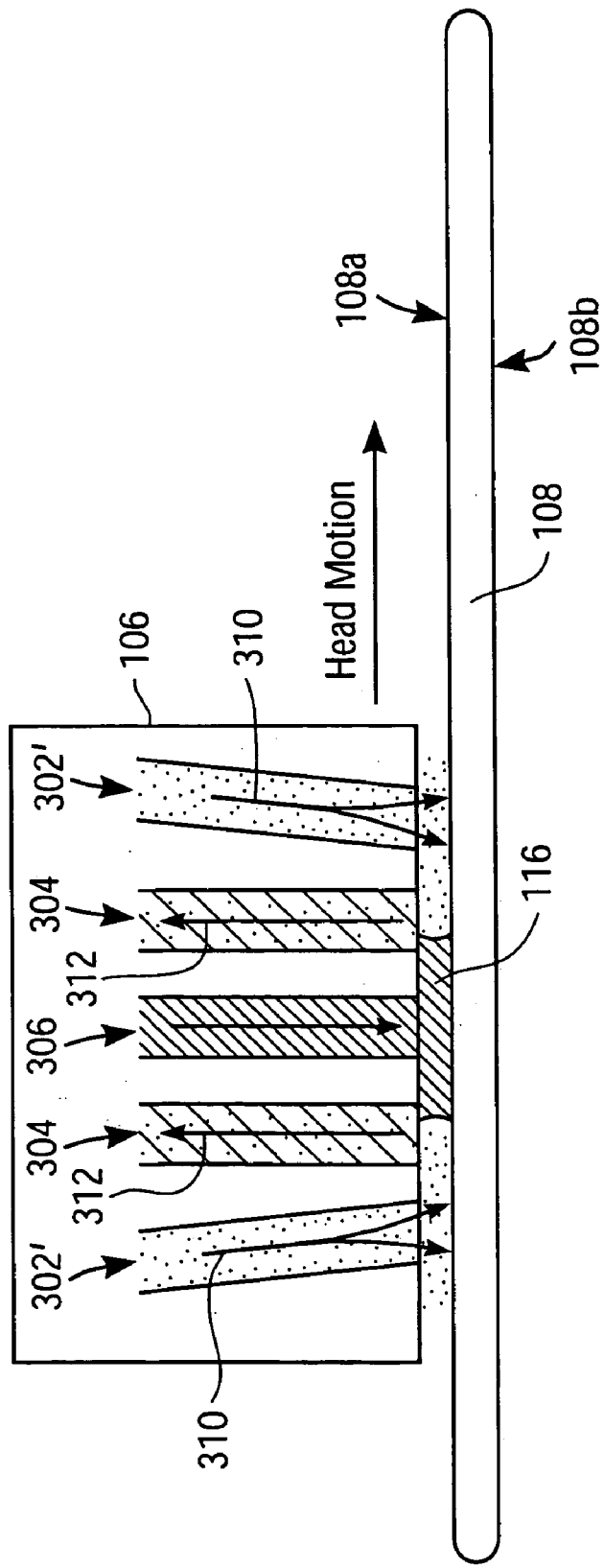
FIG. 7C illustrates a proximity head with angled source inlets performing a drying operation in accordance with one embodiment of the present invention.

FIG. 7C illustrates a proximity head 106 with angled source inlets 302' performing a drying operation in accordance with one embodiment of the present invention. It should be appreciated that the source inlets 302' and 306 and the source outlet(s) 304 described herein may be angled in any suitable way to optimize the wafer cleaning and/or drying process. In one embodiment, the angled source inlets 302' that input IPA vapor onto the wafer 108 is angled toward the source inlets 306 such that the IPA vapor flow is directed to contain the meniscus 116.

Figure 7D:
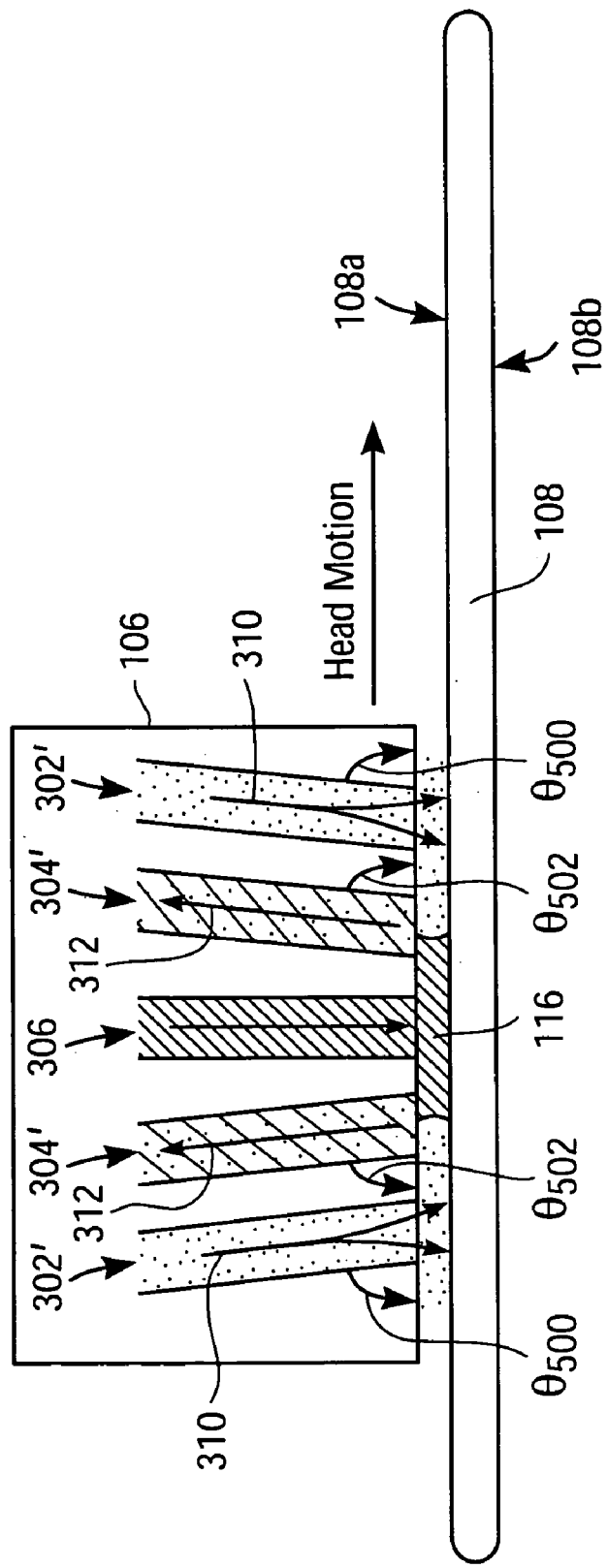
FIG. 7D illustrates a proximity head with angled source inlets and angled source outlets performing a drying operation in accordance with one embodiment of the present invention.

FIG. 7D illustrates a proximity head 106 with angled source inlets 302' and angled source outlets 304' performing a drying operation in accordance with one embodiment of the present invention. It should be appreciated that the source inlets 302' and 306 and the angled source outlet(s) 304' described herein may be angled in any suitable way to optimize the wafer cleaning and/or drying process.

In one embodiment, the angled source inlets 302' that input IPA vapor onto the wafer 108 is angled at an angle θ$_{500}$ toward the source inlets 306 such that the IPA vapor flow is directed to contain the meniscus 116. The angled source outlet 304' may, in one embodiment, be angled at an angle θ$_{500}$ towards the meniscus 116. It should be appreciated that the angle θ$_{500}$ and the angle θ$_{502}$ may be any suitable angle that would optimize the management and control of the meniscus 116. In one embodiment, the angle θ$_{500}$ is greater than 0 degrees and less than 90 degrees, and the angle θ$_{502}$ is greater than 0 degrees and less than 90 degrees. In a preferable embodiment, the angle θ$_{500}$ is about 15 degrees, and in another preferable embodiment, the angle angled at an angle θ$_{502}$ is about 15 degrees. The angle θ$_{500}$ and the angle θ$_{502}$ adjusted in any suitable manner to optimize meniscus management. In one embodiment, the angle θ$_{500}$ and the angle θ$_{502}$ may be the same, and in another embodiment, the angle angle θ$_{500}$ and the angle θ$_{502}$ may be different. By angling the angled source inlet(s) 302' and/or angling the angled source outlet(s) 304', the border of the meniscus may be more clearly defined and therefore control the processing the surface being processed.

Figure 8A:
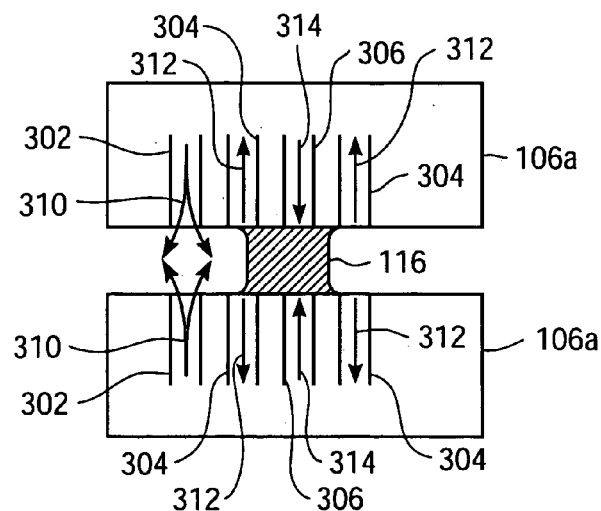
FIG. 8A illustrates a side view of the proximity heads for use in a dual wafer surface cleaning and drying system in accordance with one embodiment of the present invention.

FIG. 8A illustrates a side view of the proximity heads 106 and 106b for use in a dual wafer surface processing system in accordance with one embodiment of the present invention. In this embodiment, by usage of source inlets 302 and 306 to input N$_2$/IPA and DIW respectively along with the source outlet 304 to provide a vacuum, the meniscus 116 may be generated. In addition, on the side of the source inlet 306 opposite that of the source inlet 302, there may be a source outlet 304 to remove DIW and to keep the meniscus 116 intact. As discussed above, in one embodiment, the source inlets 302 and 306 may be utilized for $N_2$/IPA inflow 310 and DIW inflow 314 respectively while the source outlet 304 may be utilized to apply vacuum 312. It should be appreciated that any suitable configuration of source inlets 302, source outlets 304 and source inlets 306 may be utilized. For example, the proximity heads 106 and 106b may have a configuration of source inlets and source outlets like the configuration described above in reference to FIGS. 7A and 7B. In addition, in yet more embodiments, the proximity heads 106 and 106b may be of a configuration as shown below in reference to FIGS. 9 through 15. Any suitable surface coming into contact with the meniscus 116 may be dried by the movement of the meniscus 116 into and away from the surface.

Figure 8B:
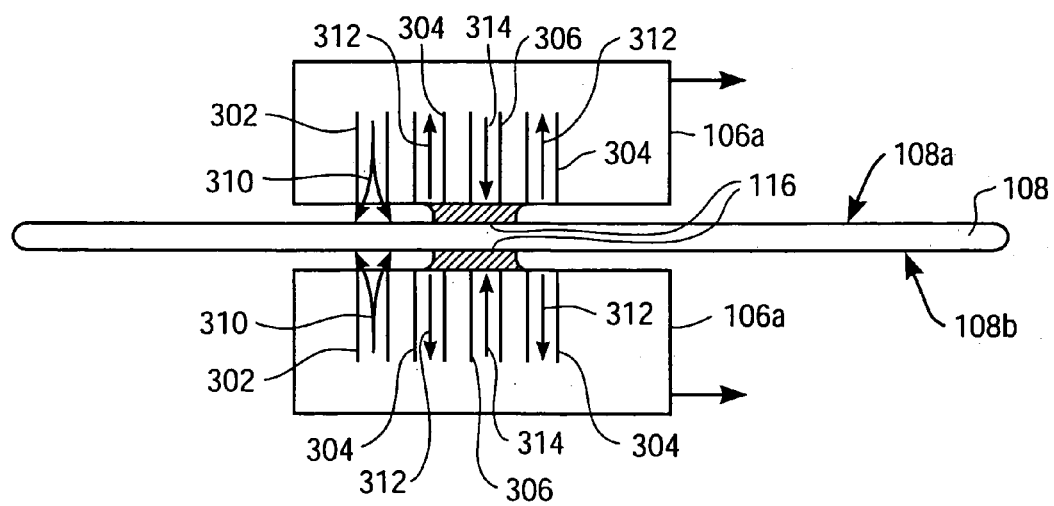
FIG. 8B shows the proximity heads in a dual wafer surface cleaning and drying system in accordance with one embodiment of the present invention.

FIG. 8B shows the proximity heads 106 and 106b in a dual wafer surface processing system in accordance with one embodiment of the present invention. In this embodiment, the proximity head 106 processes the top surface 108a of the wafer 108, and the proximity head 106b processes the bottom surface of 108b of the wafer 108. By the inputting of the $N_2$/IPA and the DIW by the source inlets 302 and 306 respectively, and by use of the vacuum from the source outlet 304, the meniscus 116 may be formed between the proximity head 106 and the wafer 108 and between the proximity head 106b and the wafer 108. The proximity heads 106 and 106b, and therefore the meniscus 116, may be moved over the wet areas of the wafer surface in a manner so the entire wafer 108 can be processed (e.g., cleaned, dried, rinsed, etched, deposition, etc.).

Figure 9A:
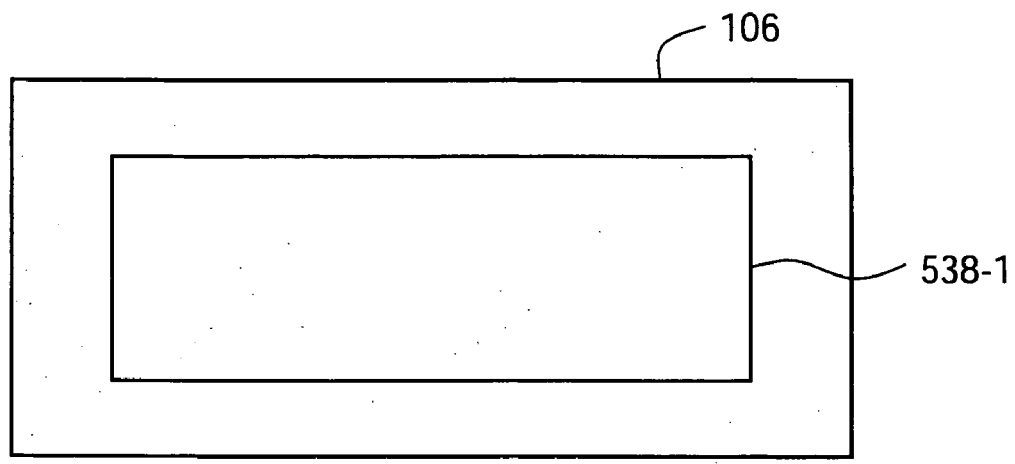
FIG. 9A illustrates a processing window in accordance with one embodiment of the present invention.

FIG. 9A illustrates a processing window 538-1 in accordance with one embodiment of the present invention. In one embodiment, the processing window 538-1 may include a plurality of source inlets 302 and 306 and also a plurality of source outlets 304. The processing window 538-1 is a region on a proximity head 106 (or any other proximity head referenced herein) that may generate and control the shape and size (e.g., area) of the meniscus 116. Therefore, the processing window 538-1 may be a region that dries and/or cleans a wafer if the proximity head 106 is desired to be used in that manner. In one embodiment, the processing window 538-1 is a substantially rectangular shape. It should be appreciated that the size of the processing window 538-1 (or any other suitable processing window described herein) may be any suitable length and width (as seen from a top view).

Figure 9B:
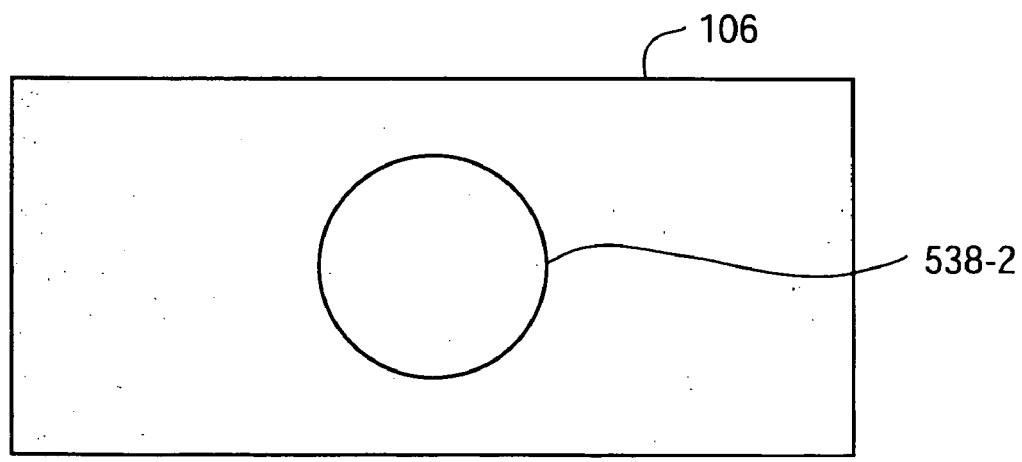
FIG. 9B illustrates a substantially circular processing window in accordance with one embodiment of the present invention.

FIG. 9B illustrates a substantially circular processing window 538-2 in accordance with one embodiment of the present invention. In one embodiment, the processing window 538-2 may include a plurality of source inlets 302 and 306 and also a plurality of source outlets 304. The processing window 538-2 is a region on the proximity head 106 (or any other proximity head referenced herein) that may generate and control the meniscus 116. Therefore, the processing window 538-2 may be a region that dries and/or cleans a wafer if the proximity head 106 is desired to be used in that manner. In one embodiment, the processing window 538-2 is a substantially circular shape.

Figure 9C:
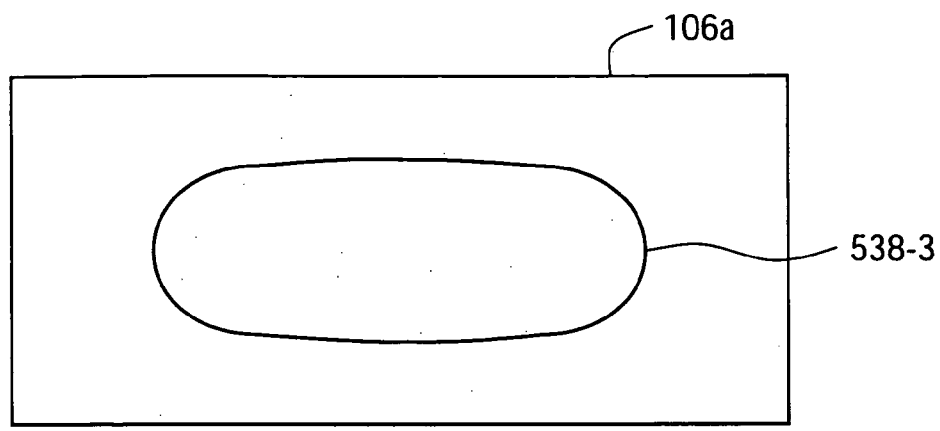
FIG. 9C illustrates a processing window in accordance with one embodiment of the present invention.

FIG. 9C illustrates a processing window 538-3 in accordance with one embodiment of the present invention. In one embodiment, the processing window 538-3 may include a plurality of source inlets 302 and 306 and also a plurality of source outlets 304. The processing window 538-3 is a region on the proximity head 106 (or any other proximity head referenced herein) that may generate and control the meniscus 116. Therefore, the processing window 538-3 may be a region that dries and/or cleans a wafer if the proximity head 106 is desired to be used in that manner. In one embodiment, the processing window 538-3 is a substantially oval in shape.

Figure 9D:
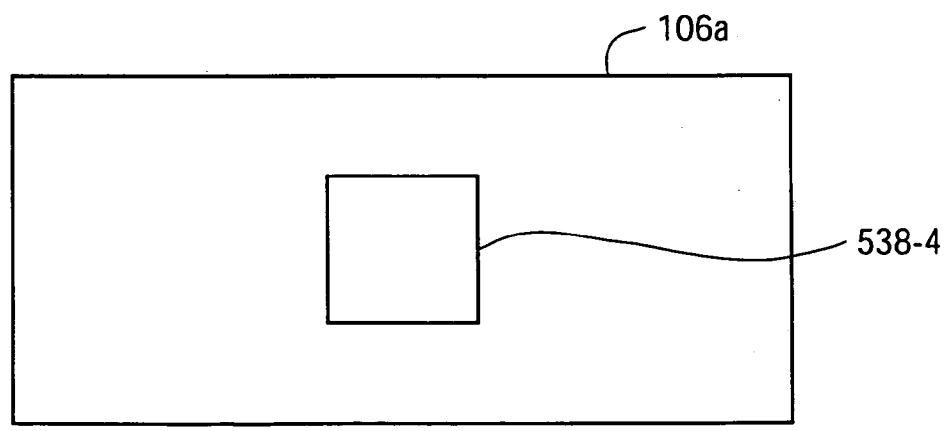
FIG. 9D illustrates a processing window in accordance with one embodiment of the present invention.

FIG. 9D illustrates a processing window 538-4 in accordance with one embodiment of the present invention. In one embodiment, the processing window 538-4 may include a plurality of source inlets 302 and 306 and also a plurality of source outlets 304. The processing window 538-4 is a region on the proximity head 106 (or any other proximity head referenced herein) that may generate and control the meniscus 116. Therefore, the processing window 538-4 may be a region that dries and/or cleans a wafer if the proximity head 106 is desired to be used in that manner. In one embodiment, the processing window 538-4 is a substantially square shape.

Figure 10A:
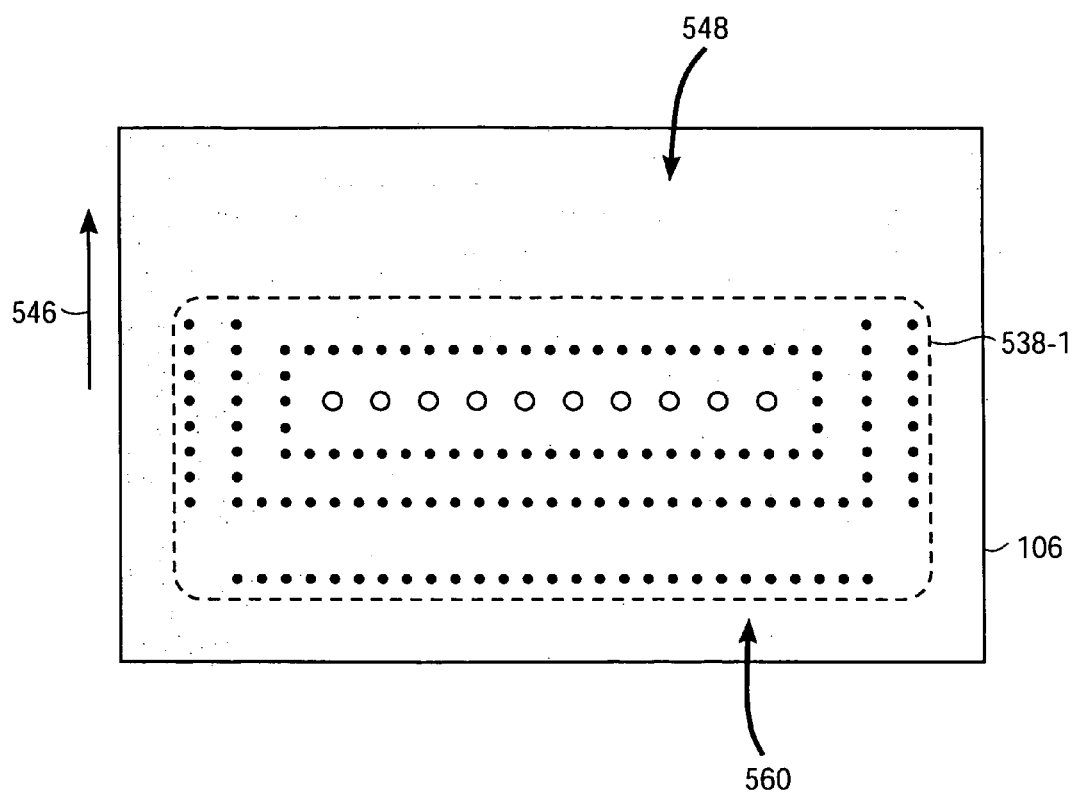
FIG. 10A shows an exemplary process window with the plurality of source inlets and as well as the plurality of source outlets in accordance with one embodiment of the present invention.

FIG. 10A shows an exemplary process window 538-1 with the plurality of source inlets 302 and 306 as well as the plurality of source outlets 304 in accordance with one embodiment of the present invention. In one embodiment, the process window 538-1 in operation may be moved in direction 546 across a wafer during, for example, a wafer drying operation. In such an embodiment, a proximity head 106 may encounter fluids on a wafer surface on a leading edge region 548. The leading edge region 548 is an area of the proximity head 106 that, in a drying process, encounters fluids first. Conversely a trailing edge region 560 is an area of the proximity head 106 that encounters the area being processed last. As the proximity head 106 and the process window 538-1 included therein move across the wafer in the direction 546, the wet area of the wafer surface enter the process window 538-1 through the leading edge region 548. Then after processing of the wet region of the wafer surface by the meniscus that is generated and controllably maintained and managed by the process window 538-1, the wet region is dried and the dried region of the wafer (or substrate) leaves the process window 538-1 through a trailing edge region 560 of the proximity head 106. As discussed in reference to FIGS. 9A through 9D, the process window 538-1 may be any suitable shape such as, for example, rectangular, square, circular, oval, semi-circular, etc.

Figure 10B:
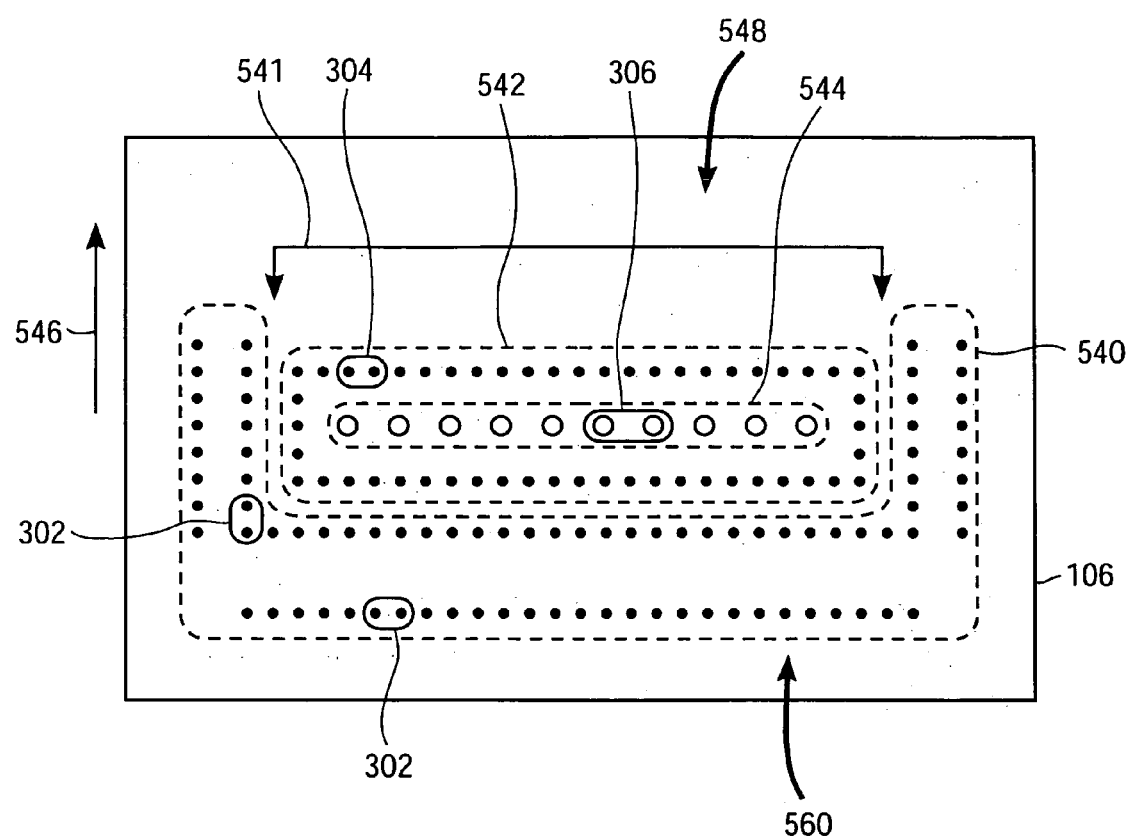
FIG. 10B shows processing regions of a proximity head in accordance with one embodiment of the present invention.

FIG. 10B shows processing regions 540, 542, and 544 of a proximity head 106 in accordance with one embodiment of the present invention. In one embodiment, the processing regions 540, 542, and 544 (the regions being shown by the broken lines) make up the processing window as discussed in reference to FIG. 10A. It should be appreciated that the processing regions 540, 542, and 544 may be any suitable size and/or shape such as, for example, circular, ring, semi-circular, square, semi-square, free form, etc. as long as a stable and controllable fluid meniscus can be generated that can apply and remove fluids from a surface in an efficient manner. In one embodiment, the processing region 540 includes the plurality of source inlets 302, the processing region 542 (also known as a vacuum ring) includes the plurality of source outlets 304, and the processing region 544 includes the plurality of source inlets 306. In a preferable embodiment, the region 542 surrounds (or substantially surrounds) the region 544 with a ring of source outlets 304 (e.g., a vacuum ring). The region 540 substantially surrounds the region 544 but has an opening 541 where there are no source inlets 302 exist on a leading edge side of the process window 538-1. In yet another embodiment, the region 540 forms a semi-enclosure around the region 542. The opening in the semi-enclosure leads in the direction of the scanning/processing by the head 106. Therefore, in one embodiment, the proximity head 106 can supply a first fluid to a first region of the wafer surface from the region 544 and surround the first region of the wafer with a vacuum region using the region 542. The proximity head 106 can also semi-enclose the vacuum region with an applied surface tension reducing fluid applied from the region 540. In such as embodiment, the semi-enclosing generates an opening that leads to the vacuum region.

Therefore, in operation, the proximity head 106 generates a fluid meniscus by application of a vacuum and DIW in the respective regions 540, 542 in the process window 538 (as shown in FIG. 10A). IPA vapor carried on a carrier gas (e.g., $N_2$) can be added as necessary in the respective region 544 (e.g., to aid in moving the formed meniscus). When the proximity head 106 is moving over the wafer surface in an exemplary drying operation, the wafer surface that moves through the opening 541 in the region 542 and contacts the meniscus 116 within the process window 538 is dried. The drying occurs because fluid that is on that portion of the wafer surface that contacts the meniscus 116 is removed as the meniscus moves over the surface. Therefore, wet surfaces of a wafer may enter the process window 538 through the opening 541 in the region 540 and by contacting the fluid meniscus may undergo a drying process.

It should be appreciated that although the plurality of source inlets 302, the plurality of source inlets 306, and the plurality of source outlets 304 are shown in this embodiment, other embodiments may be utilized where any suitable number of the source inlets 302, the source inlets 306, and the source outlets 304 may be utilized as long as the configuration and number of the plurality of source inlets 302, the source inlets 306, and the source outlets 306 may generate a stable, controllable fluid meniscus that can dry a surface of a substrate.

FIGS. 11 through 14 illustrate exemplary embodiments of the proximity head 106. It should be appreciated any of the different embodiments of the proximity head 106 described may be used as one or both of the proximity heads 106a and 106b described above in reference to FIGS. 2A through 5H. As shown by the exemplary figures that follow, the proximity head may be any suitable configuration or size that may enable the fluid removal process as described in FIGS. 6 to 10. Therefore, any, some, or all of the proximity heads described herein may be utilized in any suitable wafer processing system such as, for example, the system 100 or a variant thereof as described in reference to FIGS. 2A to 2D. In addition, the proximity head may also have any suitable numbers or shapes of source outlets 304 and source inlets 302 and 306. It should be appreciated that the side of the proximity heads shown from a top view is the side that comes into close proximity with the wafer to conduct wafer processing. All of the proximity heads described in FIGS. 11 through 14 are manifolds that enable usage of the IPA-vacuum-DIW orientation in a process window or a variant thereof as described above in reference to FIGS. 2 through 10. The embodiments of the proximity head 106 as described below in reference to FIGS. 11 through 14 all have embodiments of the process window 538, and regions 540, 542, and 544 as described in reference to FIGS. 9A through 10B above. In addition, the proximity heads described herein may be utilized for either cleaning or drying operations depending on the fluid that is input and output from the source inlets 302 and 306, and the source outlets 304. In addition, the proximity heads described herein may have multiple inlet lines and multiple outlet lines with the ability to control the relative flow rates of liquid and/or vapor and/or gas through the respective outlets and inlets. It should be appreciated that every group of source inlets and source outlets can have independent control of the flows.

It should be appreciated that the size as well as the locations of the source inlets and outlets may be varied as long as the meniscus produced is stable. In one embodiment, the size of the openings to source inlets 302, source outlets 304, and source inlets 306 are between about 0.02 inch and about 0.25 inch in diameter. In a preferable embodiment, the size of the openings of the source inlets 306 and the source outlets 304 is about 0.06 inch, and the size of the openings of the source inlets 302 is about 0.03 inch.

In one embodiment the source inlets 302 and 306 in addition to the source outlets 304 are spaced about 0.03 inch and about 0.5 inch apart. In a preferable embodiment, the source inlets 306 are spaced 0.125 inch apart from each other and the source outlets 304 are spaced 0.125 inch apart and the source inlets 302 are spaced about 0.06 inch apart. In one embodiment, the source inlets 302 the source outlets 304 the may be combined in the form of one or more slots or channels rather than multiple openings. By way of example, the vacuum inlets 304 can be combined in the form of one or more channels that at least partially surrounds the area of the source outlets 306 for the fluid portion of the meniscus. Similarly, the IPA outlets 302 can be combined into one or more channels that at lie outside the area of the vacuum inlets 304. The source outlets 306 can also be combined into one or more channels.

Additionally, the proximity heads may not necessarily be a "head" in configuration but may be any suitable configuration, shape, and/or size such as, for example, a manifold, a circular puck, a bar, a square, a triangle, an oval puck, a tube, plate, etc., as long as the source inlets 302, and 306, and the source outlets 304 may be configured in a manner that would enable the generation of a controlled, stable, manageable fluid meniscus. Multiple meniscuses can be supported simultaneously on the wafer. By way of example, a single proximity head can include sufficient source inlets 302, and 306, and the source outlets 304 such that the single proximity head can support the multiple meniscuses. Alternatively, multiple proximity heads can be used in combination, where each proximity head supports one or more meniscuses. Each of the multiple meniscuses can simultaneously perform separate processes (e.g., etch, rinse and drying processes). In a preferable embodiment, the proximity head may be a type of manifold as described in reference to FIGS. 10A through 14C. The size of the proximity heads may be varied to any suitable size depending on the application desired. In one embodiment, the length (from a top view showing the process window) of the proximity heads may be between 1.0 inch to about 18.0 inches and the width (from a top view showing the process window) may be between about 0.5 inch to about 6.0 inches. Also when the proximity head may be optimized to process any suitable size of wafers such as, for example, 200 mm wafers, 300, wafers, etc. The process windows of the proximity heads may be arranged in any suitable manner as long as such a configuration may generate a controlled stable and manageable fluid meniscus.

Figure 11A:
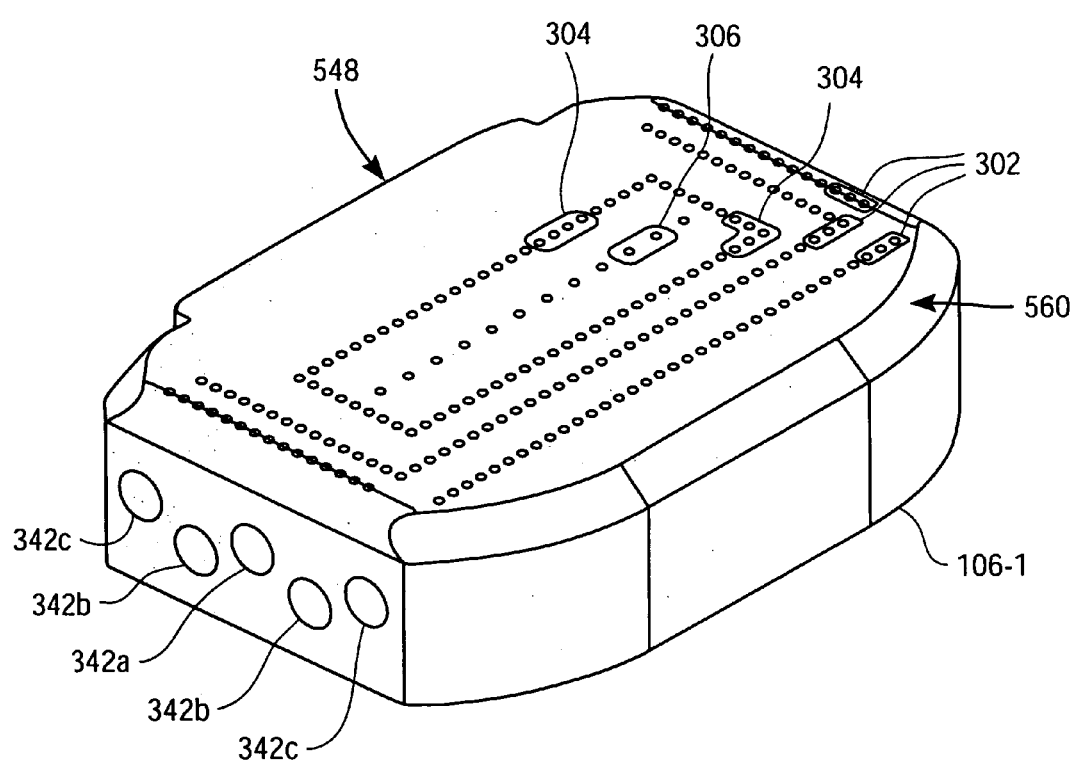
FIG. 11A shows a top view of a proximity head with a substantially rectangular shape in accordance with one embodiment of the present invention.

FIG. 11A shows a top view of a proximity head 106-1 with a substantially rectangular shape in accordance with one embodiment of the present invention. In this embodiment, the proximity head 106-1 includes three of the source inlets 302 which, in one embodiment, apply IPA to a surface of the wafer 108.

In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-1 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be input or output through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed between the proximity head 106-1 and the wafer 108. The shape of the meniscus 116 may vary depending on the configuration and dimensions of the proximity head 106-1.

It should be appreciated that the ports 342a, 342b, and 342c for any of the proximity heads described herein may be any suitable orientation and dimension as long as a stable meniscus can be generated and maintained by the source inlets 302, source outlets 304, and source inlets 306. The embodiments of the ports 342a, 342b, and 342c described herein may be applicable to any of the proximity heads described herein. In one embodiment, the port size of the ports 342a, 342b, and 342c may be between about 0.03 inch and about 0.25 inch in diameter. In a preferable embodiment, the port size is about 0.06 inch to 0.18 inch in diameter. In one embodiment, the distance between the ports is between about 0.125 inch and about 1 inch apart. In a preferable embodiment, the distance between the ports is between about 0.25 inch and about 0.37 inch apart.

Figure 11B:
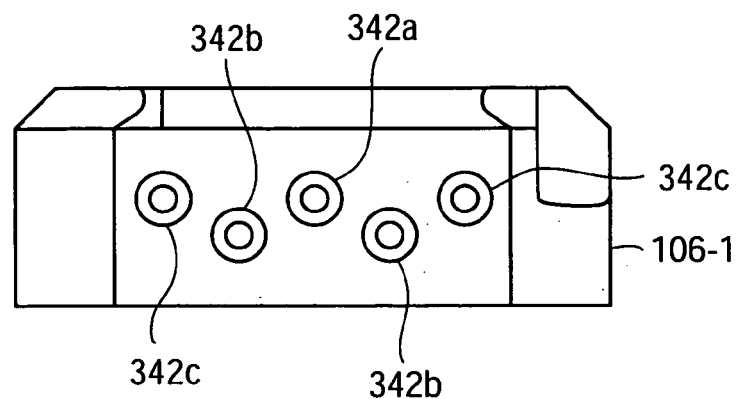
FIG. 11B illustrates a side view of the proximity head in accordance with one embodiment of present invention.

FIG. 11B illustrates a side view of the proximity head 106-1 in accordance with one embodiment of present invention. The proximity head 106-1 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 11C:
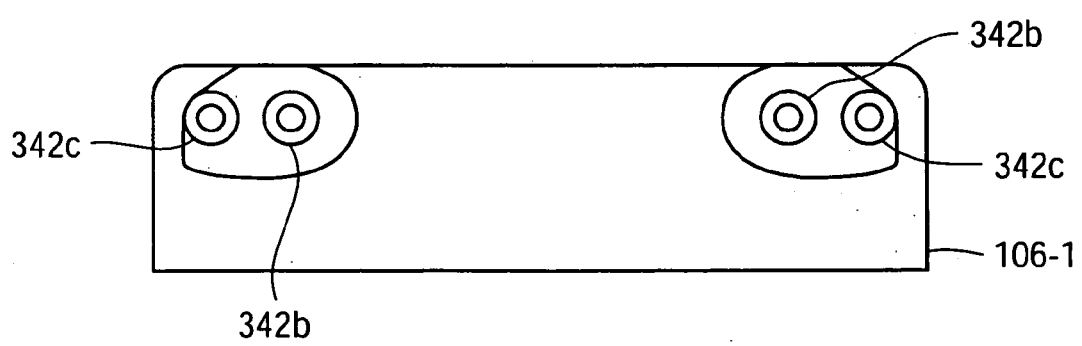
FIG. 11C shows a rear view of the proximity head in accordance with one embodiment of the present invention.

FIG. 11C shows a rear view of the proximity head 106-1 in accordance with one embodiment of the present invention. The rear view of the proximity head 106-1, in one embodiment, corresponds to the leading edge 548 of the proximity head 106-1. It should be appreciated that the proximity head 106-1 is exemplary in nature and may be any suitable dimension as long as the source inlets 302 and 306 as well as the source outlet 304 are configured in a manner to enable cleaning and/or drying of the wafer 108 in the manner described herein. In one embodiment, the proximity head 106-1 includes the input ports 342c which may feed fluid to at least some of the source inlets 302a which run parallel to the input ports 342c shown in FIG. 11C.

Figure 12A:
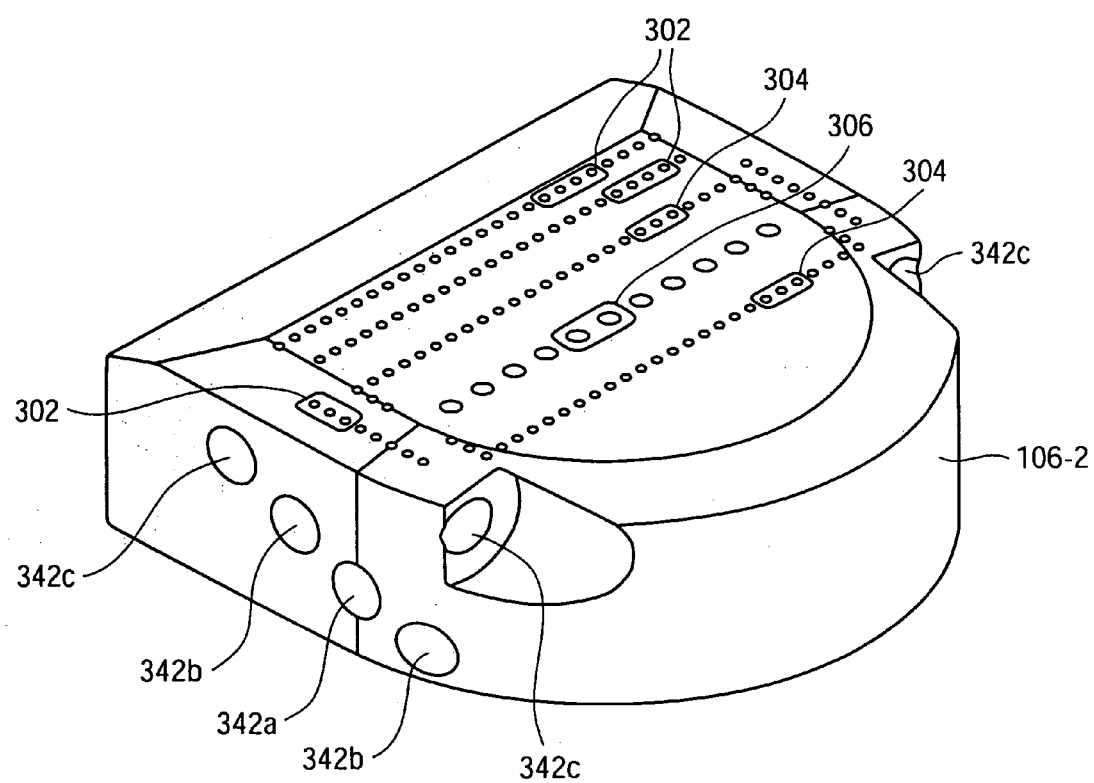
FIG. 12A shows a proximity head with a partial rectangular and partial circular shape in accordance with one embodiment of the present invention.

FIG. 12A shows a proximity head 106-2 with a partial rectangular and partial circular shape in accordance with one embodiment of the present invention. In this embodiment, the proximity head 106-2 includes one row of source inlets 306 that is adjacent on both sides to rows of source outlets 304. One of the rows of source outlets 304 is adjacent to two rows of source inlets 302. Perpendicular to and at the ends of the rows described above are rows of source outlets 304.

Figure 12B:
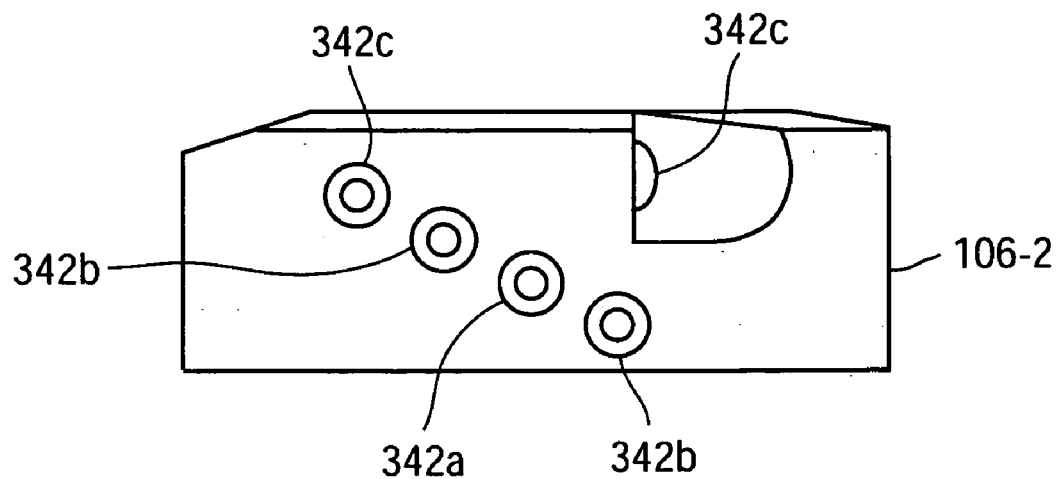
FIG. 12B shows a side view of the proximity head with a partial rectangular and partial circular shape in accordance with one embodiment of the present invention.

FIG. 12B shows a side view of the proximity head 106-2 with a partial rectangular and partial circular shape in accordance with one embodiment of the present invention. In one embodiment, the proximity head 106-2 includes ports 342a, 342b, and 342c on a side of the proximity head 106-2. The ports 342a, 342b, and 342c may be utilized to input and/or output fluids through the source inlets 302 and 306 and the source outlets 304. In one embodiment, the ports 342a, 342b, and 342c correspond to the source inlets 302, the source outlets 304, and the source inlets 306 respectively.

Figure 12C:
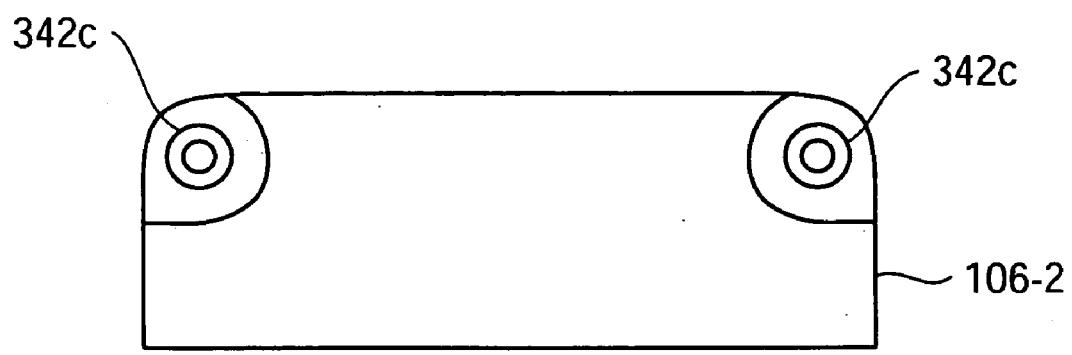
FIG. 12C shows a back view of the proximity head with a partial rectangular and partial circular shape in accordance with one embodiment of the present invention.

FIG. 12C shows a back view of the proximity head 106-2 with a partial rectangular and partial circular shape in accordance with one embodiment of the present invention. The back side as shown by the rear view is where the back side is the square end of the proximity head 106-2.

Figure 13A:
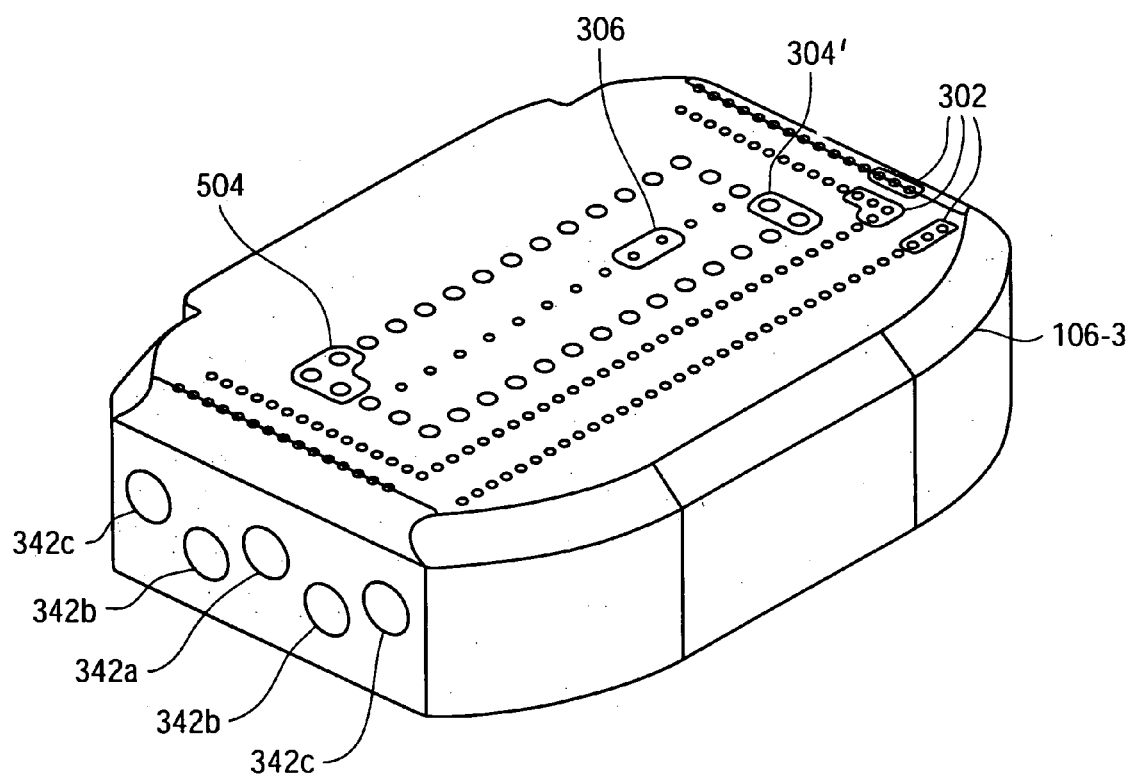
FIG. 13A shows a rectangular proximity head in accordance with one embodiment of the present invention.

FIG. 13A shows a rectangular proximity head 106-3 in accordance with one embodiment of the present invention. In one embodiment, the proximity head 106-3 includes a configuration of source inlets 302 and 306 and source outlets 304' that is similar to the proximity head 106-1 as discussed in reference to FIG. 11A. The rectangular proximity head 106-3 includes the source outlets 304' that are larger in diameter than the source outlets 304. In any of the proximity heads described herein, the diameter of the source inlets 302 and 306 as well as the source outlets 304 may be altered so meniscus generation, maintenance, and management may be optimized. In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-3 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be input or output through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed between the proximity head 106-1 and the wafer 108. The shape of the meniscus 116 may vary depending on the configuration and dimensions of the proximity head 106-1.

It should be appreciated that the ports 342a, 342b, and 342c for any of the proximity heads described herein may be any suitable orientation and dimension as long as a stable meniscus can be generated and maintained by the source inlets 302, source outlets 304, and source inlets 306. The embodiments of the ports 342a, 342b, and 342c described in relation to the proximity head 106-1 may be applicable to any of the proximity heads described in reference to the other Figures. In one embodiment, the port size of the ports 342a, 342b, and 342c may be between about 0.03 inch and about 0.25 inch in diameter. In a preferable embodiment, the port size is about 0.06 inch to 0.18 inch in diameter. In one embodiment, the distance between the ports is between about 0.125 inch and about 1 inch apart. In a preferable embodiment, the distance between the ports is between about 0.25 inch and about 0.37 inch apart.

Figure 13B:
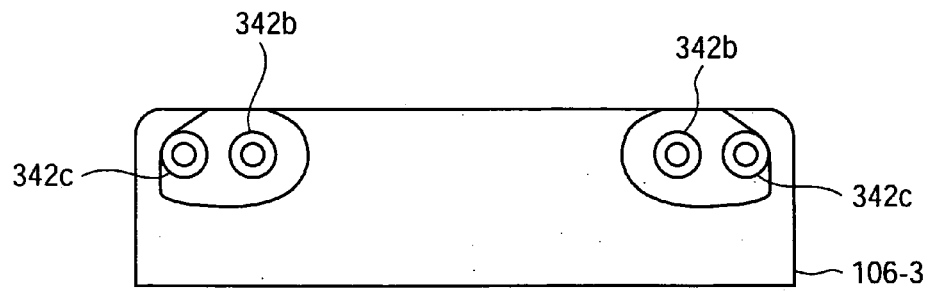
FIG. 13B shows a rear view of the proximity head in accordance with one embodiment of the present invention.

FIG. 13B shows a rear view of the proximity head 106-3 in accordance with one embodiment of the present invention. The rear view of the proximity head 106-3, in one embodiment, corresponds to the leading edge 548 of the proximity head 106-3. It should be appreciated that the proximity head 106-3 is exemplary in nature and may be any suitable dimension as long as the source inlets 302 and 306 as well as the source outlet 304 are configured in a manner to enable processing of the wafer 108 in the manner described herein. In one embodiment, the proximity head 106-3 includes the input ports 342c which may feed fluid to at least some of the source inlets 302a which run parallel to the input ports 342c shown in FIG. 13A.

Figure 13C:
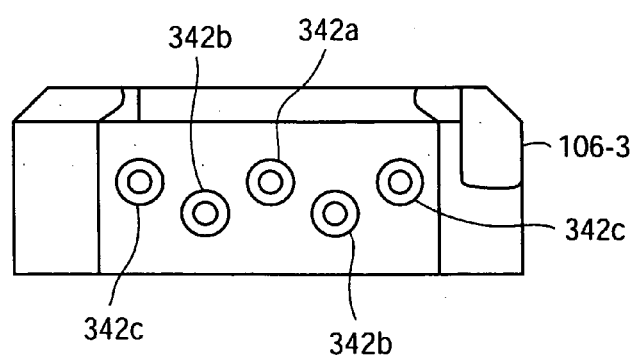
FIG. 13C illustrates a side view of the proximity head in accordance with one embodiment of present invention.

FIG. 13C illustrates a side view of the proximity head 106-3 in accordance with one embodiment of present invention. The proximity head 106-3 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 14A:
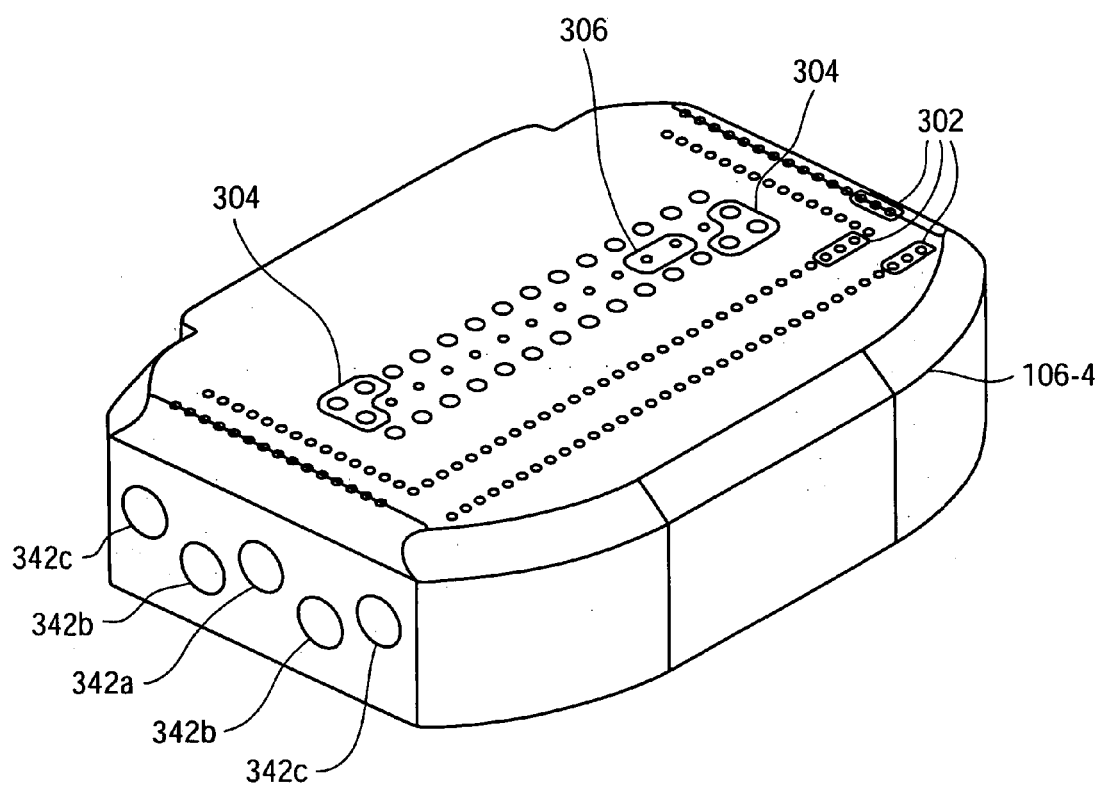
FIG. 14A shows a rectangular proximity head in accordance with one embodiment of the present invention.

FIG. 14A shows a rectangular proximity head 106-4 in accordance with one embodiment of the present invention. In one embodiment, the proximity head 106-4 includes a configuration of source inlets 302 and 306 and source outlets 304' that is similar to the proximity head 106-3 as discussed in reference to FIG. 13A. The rectangular proximity head 106-3 includes the source outlets 304' that are larger in diameter than the source outlets 304. In any of the proximity heads described herein, the diameter of the source inlets 302 and 306 as well as the source outlets 304 may be altered so meniscus generation, maintenance, and management may be optimized. In one embodiment, the source outlets 304' are located closer to the source inlets 302 than the configuration discussed in reference to FIG. 13A. With this type of configuration, a smaller meniscus may be generated. The region spanned by the source inlets 302, 306 and source outlets 304' (or also source outlets 304 as described in reference to FIG. 11A) may be any suitable size and/or shape. In one embodiment, the process window may be between about 0.03 square inches to about 9.0 square inches. In a preferable embodiment, the process window may be about 0.75. Therefore, by adjusting the region of the In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-3 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be input or output through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed by the process window between the proximity head 106-1 and the wafer 108. The shape of the meniscus 116 may correspond with the shape of the process window and therefore the size and shape of the meniscus 116 may be varied depending on the configuration and dimensions of the regions of source inlets 302 and 306 and regions of the source outlets 304.

Figure 14B:
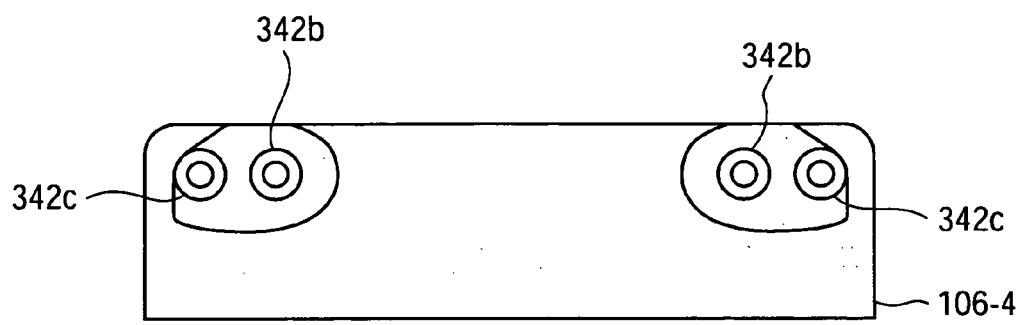
FIG. 14B shows a rear view of the rectangular proximity head in accordance with one embodiment of the present invention.

FIG. 14B shows a rear view of the rectangular proximity head 106-4 in accordance with one embodiment of the present invention. The rear view of the proximity head 106-4, in one embodiment, corresponds to the leading edge 548 of the proximity head 106-4. It should be appreciated that the proximity head 106-4 is exemplary in nature and may be any suitable dimension as long as the source inlets 302 and 306 as well as the source outlet 304 are configured in a manner to enable cleaning and/or drying of the wafer 108 in the manner described herein. In one embodiment, the proximity head 106-4 includes the input ports 342c which may feed fluid to at least some of the source inlets 302a which run parallel to the input ports 342c shown in FIG. 13A.

Figure 14C:
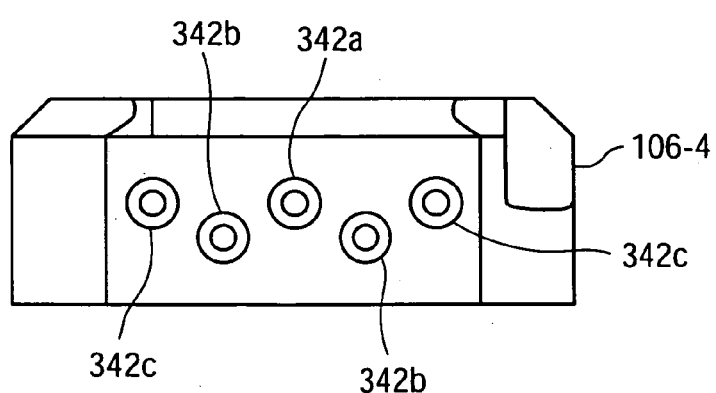
FIG. 14C illustrates a side view of the rectangular proximity head in accordance with one embodiment of present invention.

FIG. 14C illustrates a side view of the rectangular proximity head 106-4 in accordance with one embodiment of present invention. The proximity head 106-4 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 15A:
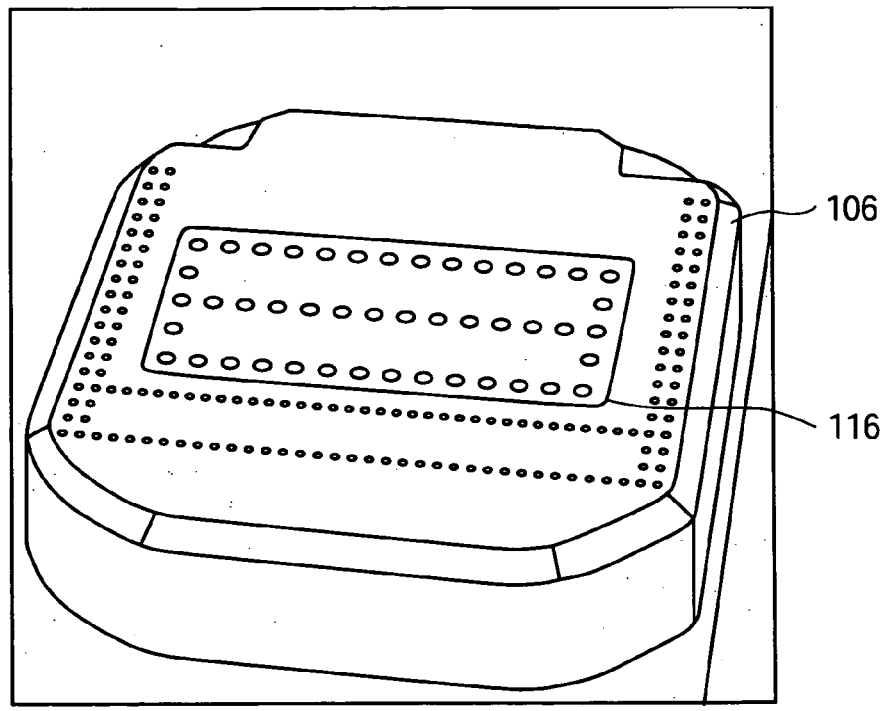
FIG. 15A shows a proximity head in operation according to one embodiment of the present invention.

FIG. 15A shows a proximity head 106 in operation according to one embodiment of the present invention. It should be appreciated that the flow rate of the DIW and the $N_2$/IPA, the magnitude of the vacuum, and rotation/movement of the wafer being processed may be varied in any suitable manner to provide optimal fluid meniscus controllability and management to generate enhanced wafer processing. The proximity head 106, in one exemplary embodiment, is utilized in a configuration as described in reference to FIG. 2A. As shown in reference to FIGS. 15A through 15F, the wafer is a clear material so fluid meniscus dynamics can be seen with different flow rates, vacuum rates, and wafer rotations. The flow rate of DIW and $N_2$/IPA as well as the vacuum and rotation of the wafer may be varied depending on the conditions encountered during drying. In FIG. 15A, the meniscus has been formed by input of DIW and vacuum without any $N_2$/IPA flow. Without the $N_2$/IPA flow, the meniscus has an uneven boundary. In this embodiment, the wafer rotation is zero and the DIW flow rate is 500 ml/min.

Figure 15B:
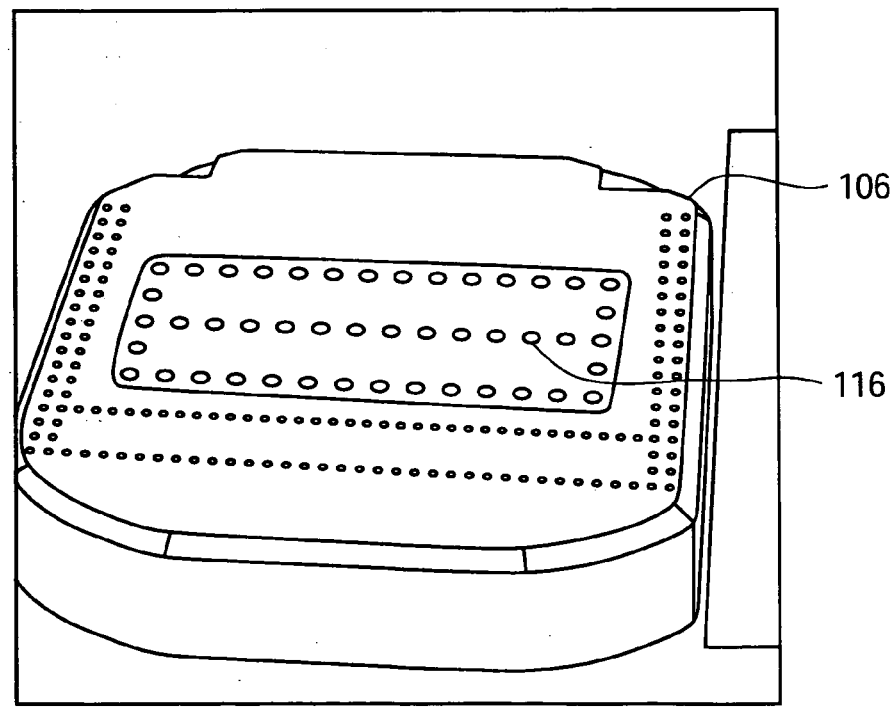
FIG. 15B illustrates the proximity head as described in FIG. 15A with IPA input in accordance with one embodiment of the present invention.

FIG. 15B illustrates the proximity head 106 as described in FIG. 15A with $N_2$/IPA input in accordance with one embodiment of the present invention. In this embodiment, the DIW flow rate is 500 ml/min and the $N_2$/IPA flow rate is 12 ml/min with the rotation of the wafer being zero. As shown by FIG. 15B, the usage of $N_2$/IPA flow has made the boundary of the meniscus more even. Therefore, the fluid meniscus is more stable and controllable.

Figure 15C:
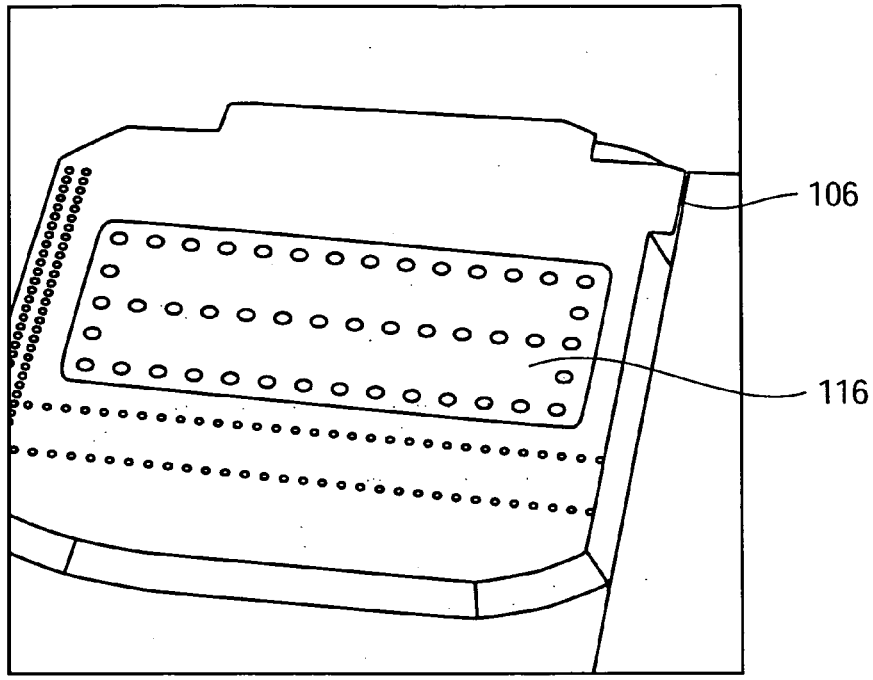
FIG. 15C shows the proximity head as described in FIG. 15B, but with the IPA flow increased to 24 SCFH in accordance with one embodiment of the present invention.

FIG. 15C shows the proximity head 106 as described in FIG. 15B, but with the $N_2$/IPA flow increased to 24 ml/min in accordance with one embodiment of the present invention. The rotation has been kept at zero and the flow rate of the DIW is 500 ml/min. When the $N_2$/IPA flow rate is too high, the fluid meniscus becomes deformed and less controllable.

Figure 15D:
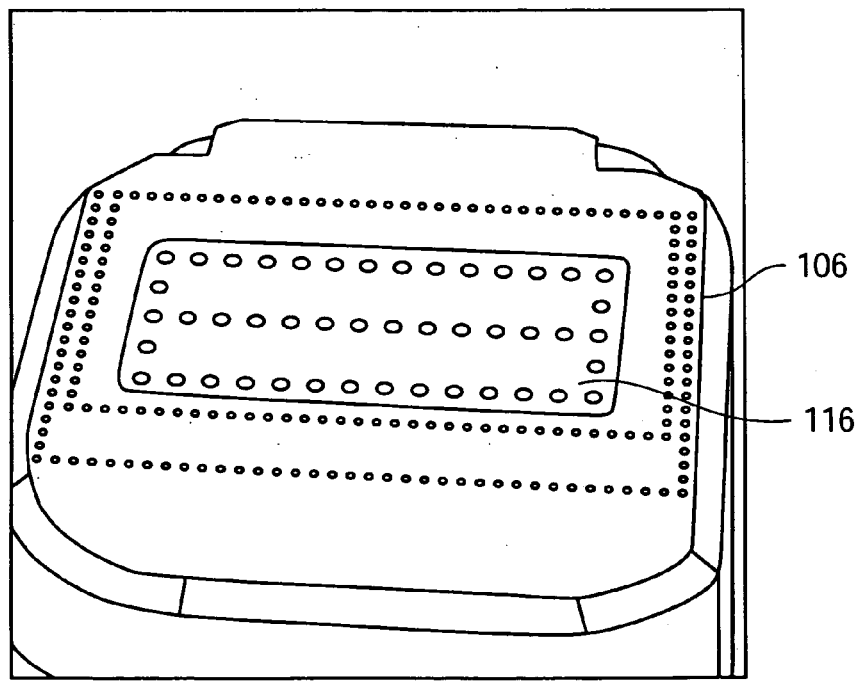
FIG. 15D shows the proximity head where the fluid meniscus is shown where the wafer is being rotated in accordance with one embodiment of the present invention.

FIG. 15D shows the proximity head 106 where the fluid meniscus is shown where the wafer is being rotated in accordance with one embodiment of the present invention. In this embodiment, the rotation of the wafer is about 3 rotations per minute. The flow rate of the DIW is 500 ml/min while the flow rate of the $N_2$/IPA is 12 SCFH. The magnitude of the vacuum is about 30 in Hg @ 80 PSIG. When the wafer is rotated, the fluid meniscus becomes less stable due to the added wafer dynamics as compared with FIG. 15C which shows the same DIW and $N_2$/IPA flow rate but without wafer rotation.

Figure 15E:
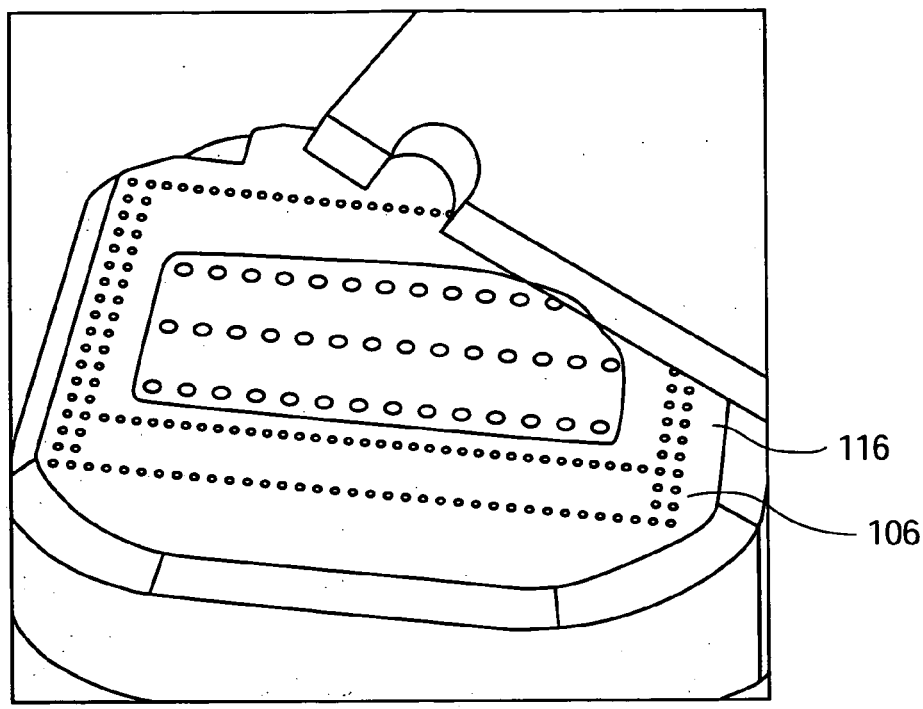
FIG. 15E shows the proximity head where the fluid meniscus is shown where the wafer is being rotated faster than the rotation shown in FIG. 15D in accordance with one embodiment of the present invention.

FIG. 15E shows the proximity head 106 where the fluid meniscus is shown where the wafer is being rotated faster than the rotation shown in FIG. 15D in accordance with one embodiment of the present invention. In this embodiment, the rotation of the wafer is about 4.3 rotations per minute. The flow rate of the DIW is 500 ml/min while the flow rate of the IPA is 12 SCFH. The magnitude of the vacuum is about 30 on Hg @ 80 PSIG. When the wafer is rotated faster, the fluid meniscus has a more uneven boundary as compared to the fluid meniscus discussed in reference to FIG. 15D due to the added wafer dynamics as compared.

Figure 15F:
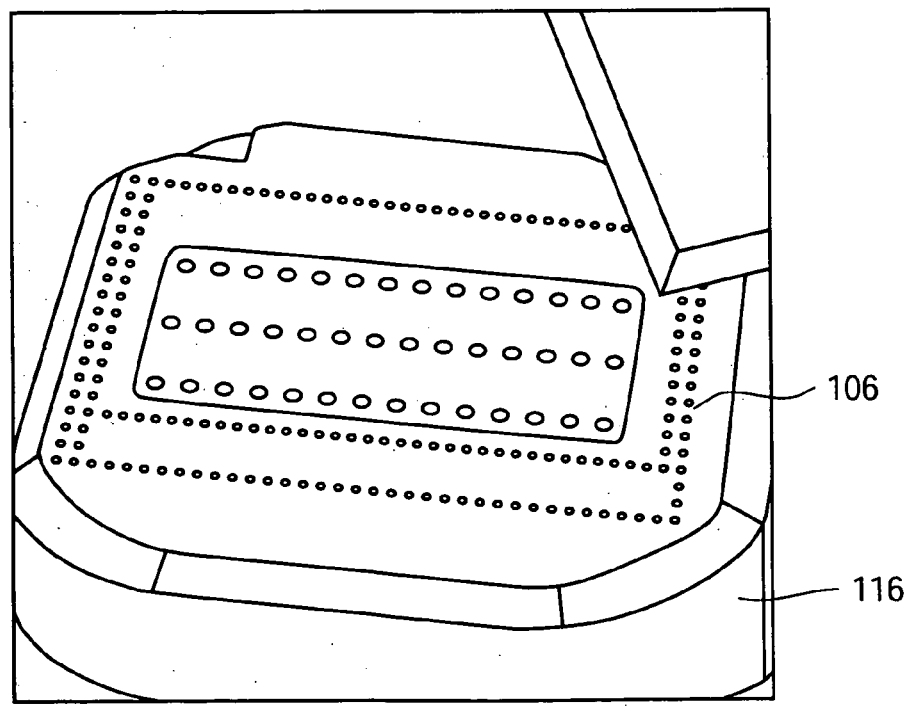
FIG. 15F shows the proximity head where the IPA flow has been increased as compared to the IPA flow of FIG. 15D in accordance with one embodiment of the present invention.

FIG. 15F shows the proximity head 106 where the $N_2$/IPA flow has been increased as compared to the IPA flow of FIG. 15D in accordance with one embodiment of the present invention. In this embodiment, the variables such as the DIW flow rate, rate of wafer rotation, and vacuum magnitude are the same as that described in reference to FIG. 15D. In this embodiment, the $N_2$/IPA flow rate was increased to 24 SCFH. With the $N_2$/IPA flow rate increased, the IPA holds the fluid meniscus along the border to generate a highly controllable and manageable fluid meniscus. Therefore, even with wafer rotation, the fluid meniscus looks stable with a consistent border that substantially corresponds to the region with the plurality of source inlets 302 and the region with the plurality of source outlets 304. Therefore, a stable and highly controllable, manageable, and maneuverable fluid meniscus is formed inside of the process window so, in an exemplary drying process, fluid that the proximity head 106 may encounter on a wafer surface is removed thereby quickly and efficiently drying the wafer surface.

While the various embodiments of proximity heads described in FIGS. 6A–15F above are very useful in processing each surface of a substrate such as a semiconductor wafer, the proximity heads cannot easily support a processing meniscus on the edge of the substrate. FIGS. 16A–16E show various aspects of an edge process system 1600 in accordance with one embodiment of the present invention.

Figure 16A:
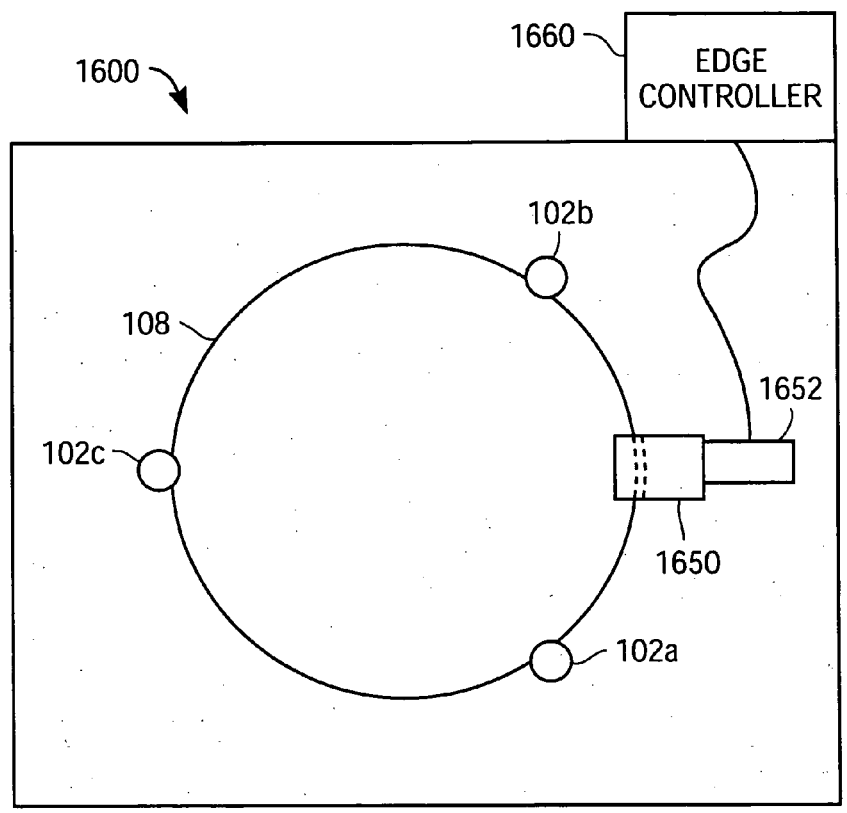
FIG. 16A shows a layout view of the edge processing system, in accordance with one embodiment of the present invention.
Figure 16B:
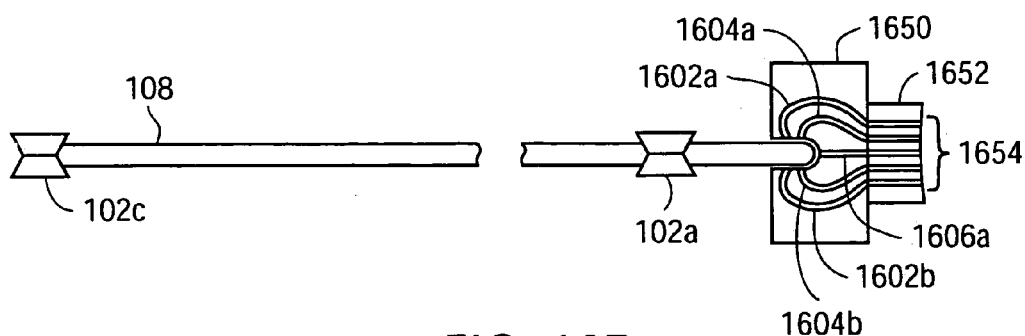
FIG. 16B shows a side view of the edge processing system, in accordance with one embodiment of the present invention.

FIG. 16A shows a layout view of the edge processing system 1600, in accordance with one embodiment of the present invention. FIG. 16B shows a side view of the edge processing system 1600, in accordance with one embodiment of the present invention. The edge processing system 1600 includes a wafer support system that can include multiple wafer edge rollers 102A, 102B, 102C, for supporting a wafer 108. The wafer support system can also allow the wafer to move (e.g., rotate) relative to an edge processing proximity head 1650. The edge processing proximity head 1650 is supported and can be moved by a head support 1652. Supporting the edge processing proximity head 1650 can also include supplying the various requirements of the various ports 1602A, 1602B, 1604A, 1604B, 1606A in the proximity head 1650 as will be described in more detail below. As a result, the head support 1652 can include tubes and other supply lines 1654 for supplying the various requirements of the various ports 1602A, 1602B, 1604A, 1604B, 1606A in the proximity head 1650.

The edge processing system 1600 also includes an edge controller for controlling the edge process. By way of example, the edge controller can control the rotational speed of the wafer, the chemistry in the processing meniscus 1610, the size and location of the processing meniscus 1610 within the proximity head 1650, the location and movement of the proximity head 1650 relative to the wafer 108 and the various pressures and flowrates applied to each of the various ports 1602A–1602H, 1604A–1604E, 1606A–1606B included in the proximity head 1650.

Figure 16C:
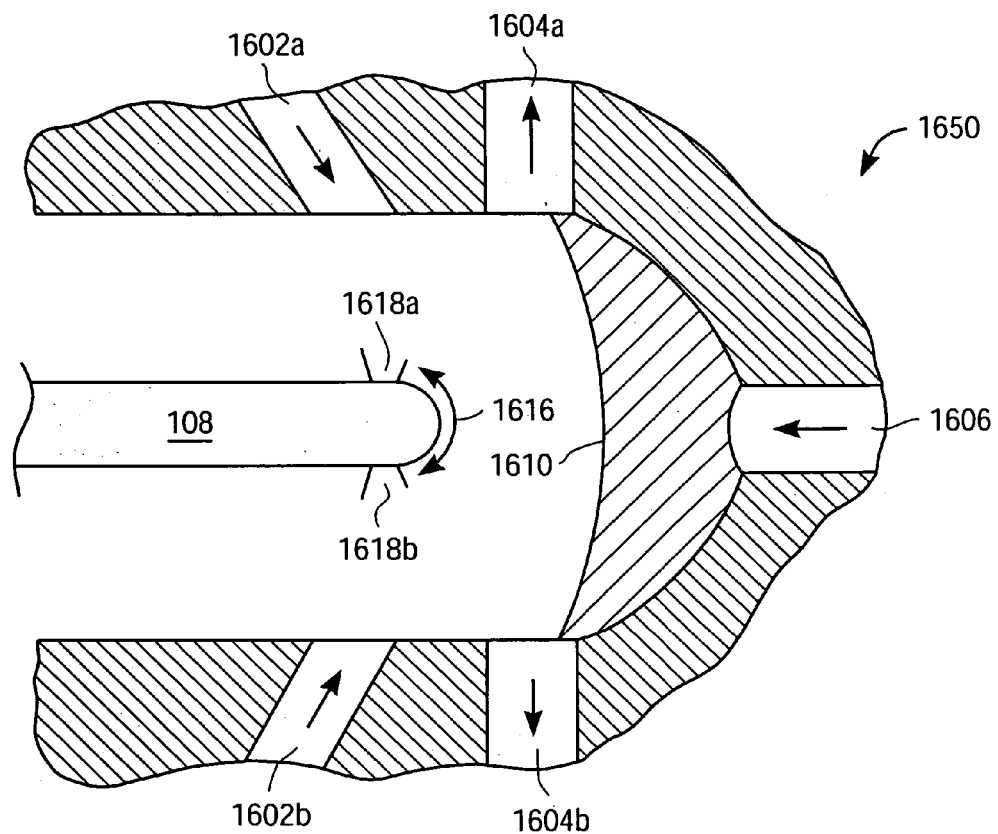
FIGS. 16C and 16D show a cutaway side view of the edge process proximity head in accordance with one embodiment of the present invention.
Figure 16D:
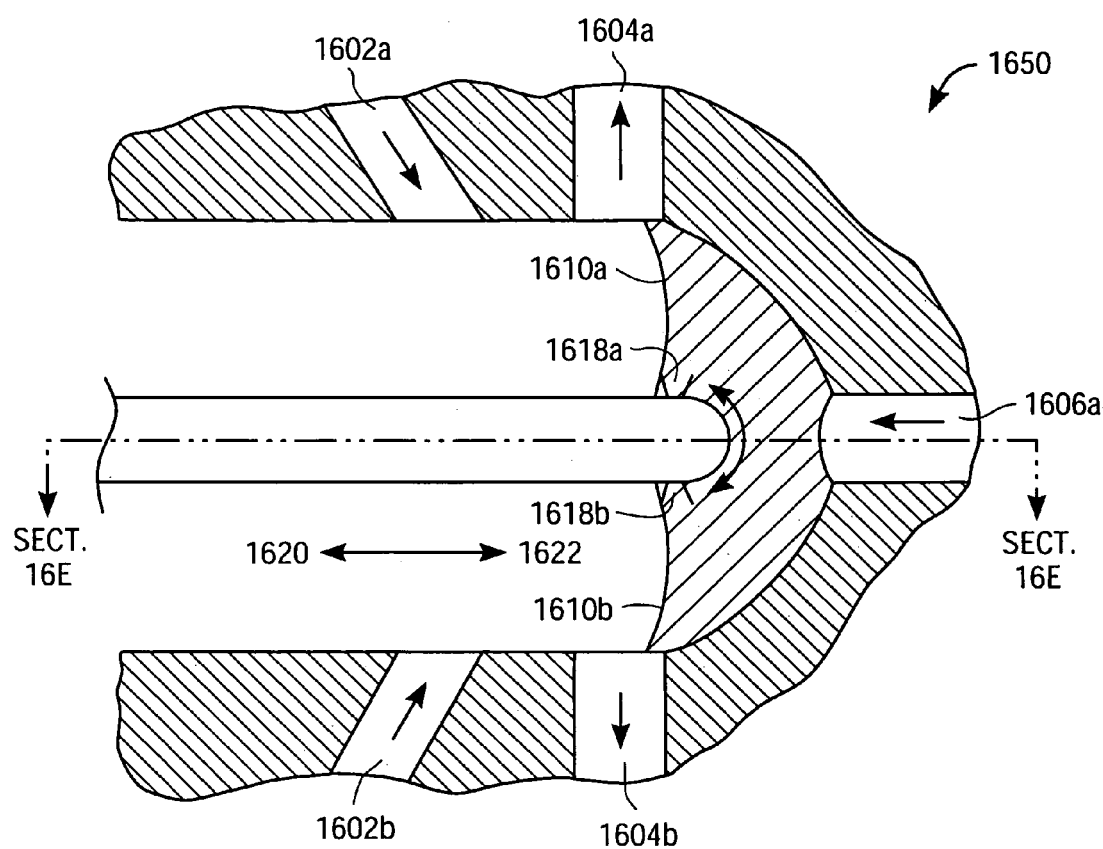

FIGS. 16C and 16D show a cutaway side view of the edge process proximity head 1650 in accordance with one embodiment of the present invention. Similar to the proximity heads described in FIGS. 6A–15F above, the edge process proximity head 1650 includes an arrangement of ports 1602A–1602H, 1604A–1604E, 1606A–1606B to create and support a processing meniscus 1610. In one embodiment, the ports 1606A–1606B inject a process chemistry (e.g., deionized water, etching chemistries, liquid, and combinations thereof, etc.) while vacuum ports 1604A–1604E remove the excess liquid from the meniscus 1610. IPA ports 1602A–1602H can inject IPA or other chemistries to aid in controlling the surface tension of the meniscus 1610.

The various ports 1602A–1602H, 1604A–1604E, 1606A–1606B can also be controlled according to the location of the trailing edge of the meniscus. The meniscus 1610 can be supported by the edge process proximity head 1650 sufficiently deep enough that the edge region 1616 and the edge exclusion zones 1618A, 1618B can be fully encompassed by the meniscus, such as shown in FIG. 16D. By way of example, in FIG. 16D the wafer 108 is shown being moved in direction 1622 to insert the wafer into the meniscus 1610 until the edge region 1616 and the edge exclusion zones 1618A, 1618B are included within the meniscus, forming two separate meniscus surfaces 1610A, 1610B. Surface 1610A is formed between the top surface of the wafer 108 and the top inside surface of the edge process proximity head 1650. Similarly, surface 1610B is formed between the bottom surface of the wafer 108 and the bottom inside surface of the edge process proximity head 1650.

As the wafer 108 is moved out of the meniscus surfaces 1610A, 1610B (e.g., as the wafer is moved in direction 1620), IPA can be injected through ports 1602A, 1602B to control the surface tension of the trailing edge of the meniscus surfaces 1610A, 1610B. Controlling the surface tension of the trailing edge of the surfaces 1610A, 1610B can help ensure the meniscuses dry (i.e., remove the process chemistry) the edge region 1616 and edge exclusion zones 1618A, 1618B as the trailing edge draws across the edge exclusion zones and the edge region.

Figure 16E:
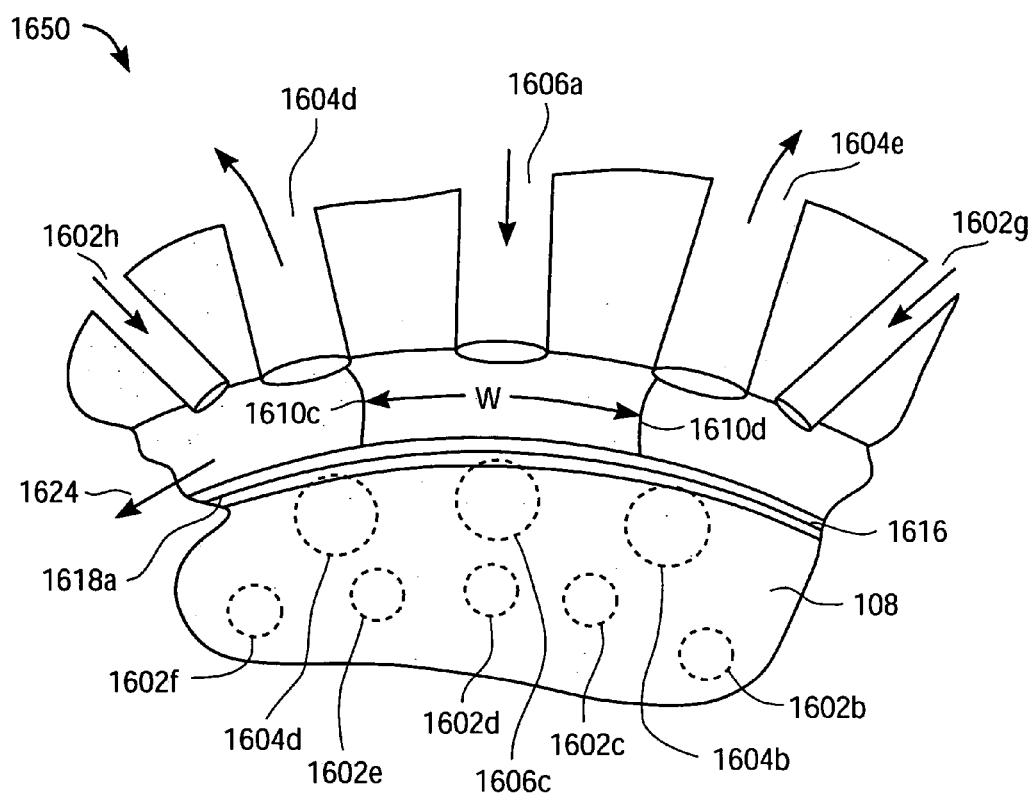
FIG. 16E shows a 16E—16E sectional view of edge process proximity head, in accordance with one embodiment of the present invention.

FIG. 16E shows a 16E—16E sectional view of edge process proximity head 1650, in accordance with one embodiment of the present invention. While only one half of edge process proximity head 1650 is shown, the opposing portion is substantially similar, however, in some embodiments, the port arrangements may be adjusted as required to support meniscuses across different width exclusion zones. By way of example, a bottom side edge exclusion zone 1618B may be as much as about 5 mm or more is width, where the top side edge exclusion zone 1618A may be less than about 2 mm. As a result, locations of the ports 1602B–F and 1604B–D may be adjusted relative to the edge of the wafer 108 as required.

As the wafer 108 moves (e.g., rotates) through the meniscus 1610 in direction 1624, meniscus trailing edge 1610D is formed. The injection of $N_2$/IPA or other chemistries can be used to control and maintain the surface tension of the trailing edge of the meniscus 1610D.

The volume of the meniscus 1610 can also be manipulated to cause the meniscus to extend or retract toward and onto or off of and away from the wafer 108. The meniscus 1610 can have a width W of between about 2 mm and about 15 mm. The width of the meniscus 1610 can also be extended in the arc around the circumference of wafer 108 through use of more or fewer ports 1602A-16-2H, 1604A–1604E, 1606A–1606B. A meniscus 1610 having a larger arc can also provide greater resonance time on each incremental area of the edge region 1616 and edge exclusion zones 1618A, 1618B. Multiple edge process proximity heads 1650 can also used in combination to allow multiple processes to be accomplished substantially simultaneously, on a single wafer 108. One or more edge process proximity heads 1600 can also be combined with one or more proximity heads described in FIGS. 2A–15F above.

While described in terms of processing an edge of a wafer 108, the edge process proximity head 1650 can also be adapted to process a straight edge of a substrate having straight edges. In such an embodiment, the edge process proximity head 1650 can move a meniscus along a straight edge of the substrate and process the regions of the substrate that are in close proximity to the edge of the substrate similar to processing the edge region 1616 and edge exclusion zones 1618A of wafer 108 described above.

Figure 17:
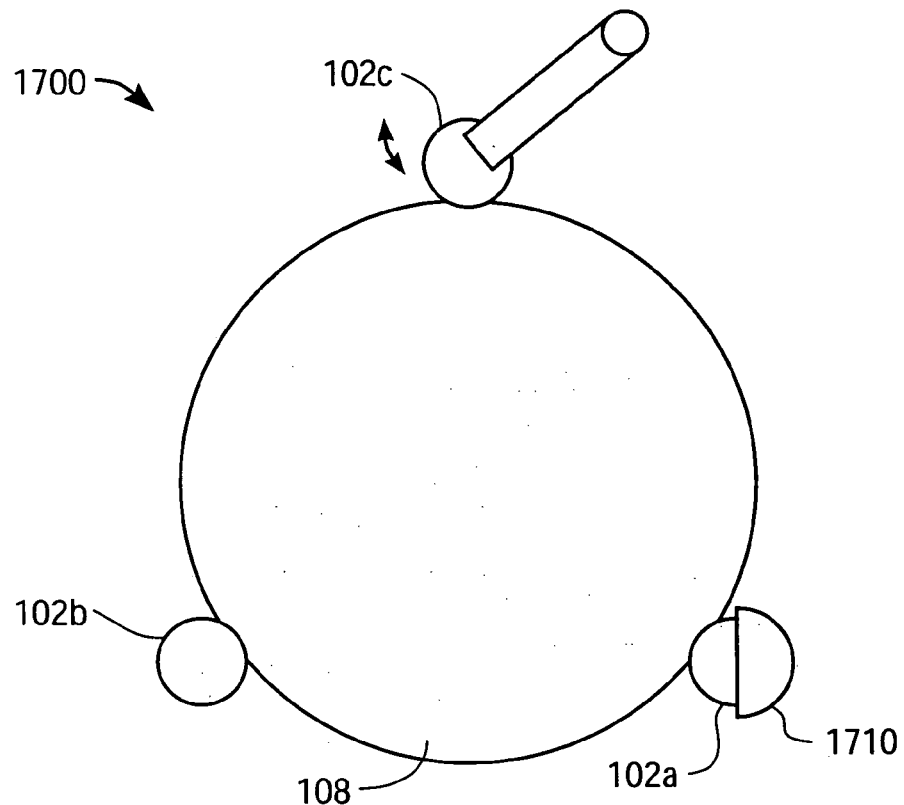
FIG. 17 illustrates an alternative substrate edge processing system, in accordance with one embodiment of the present invention.

FIG. 17 illustrates an alternative substrate edge processing system 1700, in accordance with one embodiment of the present invention. The substrate edge processing system 1700 includes three edge rollers 102A, 102B, 102C that support and can rotate the wafer 108. Edge roller 102A includes a proximity head 1710. The proximity head 1710 is described in further detail in FIGS. 18A–20 as follows.

FIGS. 18A–18D are detailed views of the proximity head 1710, in accordance with one or more embodiments of the present invention. The proximity head 1710 includes ports 1810, 1812, 1814 so that a meniscus 1714A can be formed. The ports 1810, 1812, 1814 are substantially similar to the ports described in the variously described embodiments above. While only three ports 1810, 1812, 1814 are illustrated, it should be understood that additional ports and other arrangements of ports are within the scope of the present invention. Such numbers of ports and port arrangements can be as varied as the numerous embodiments provided above. The specific number, arrangement, size and orientation of the ports 1810, 1812, 1814 is dependent upon the desired process, desired meniscus shape and any other aspect as may be applicable to the desired application of the meniscus to be formed by the ports 1810, 1812, 1814.

Figure 19A:
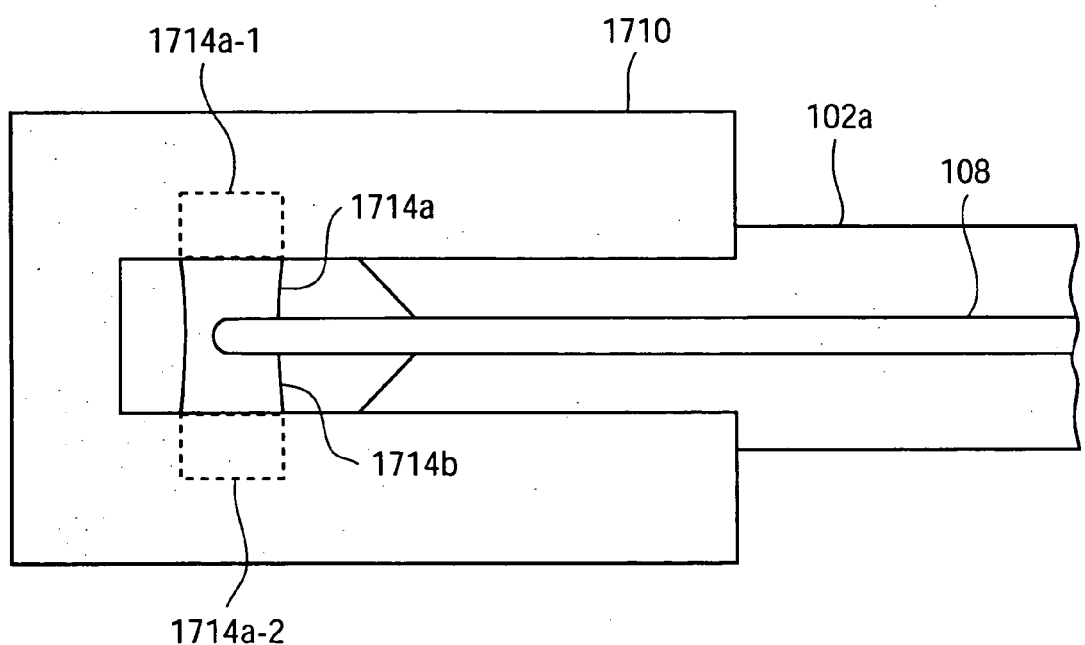
FIGS. 19A and 19B illustrate a side view of proximity head, in accordance with one embodiment of the present invention.
Figure 19B:
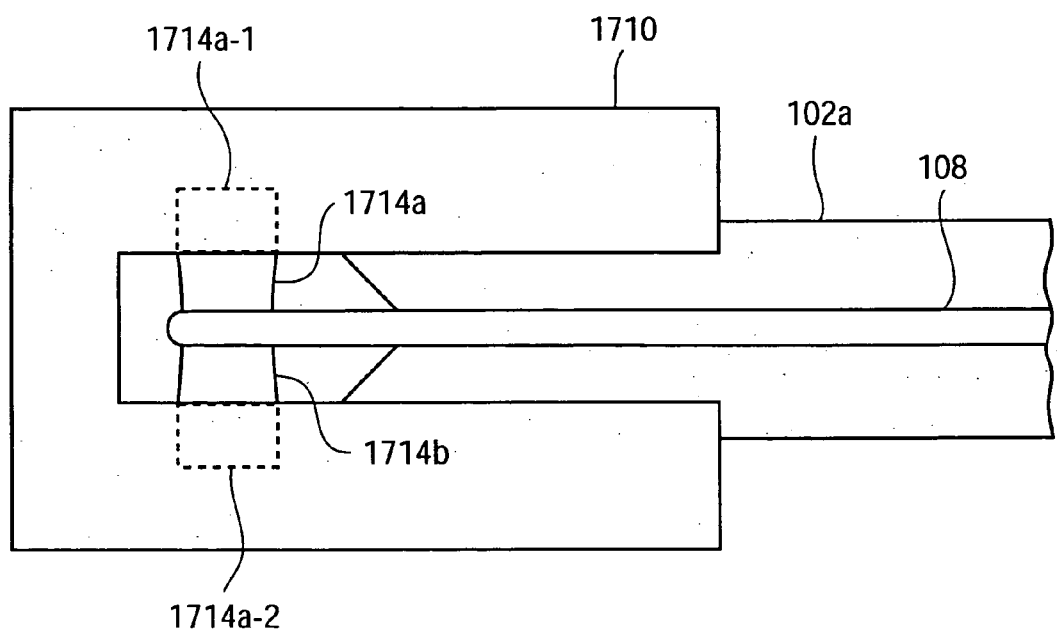

Similar ports (not shown) can also be included so that a second meniscus 1714B (as shown in FIGS. 19A and 19B, below) can also be included. Similarly, another meniscus 1714C can also be formed by a corresponding set of ports (not shown). Yet another meniscus (not shown) that is analogous to meniscus 1714B can be formed that opposes meniscus 1714C.

Figure 18A:
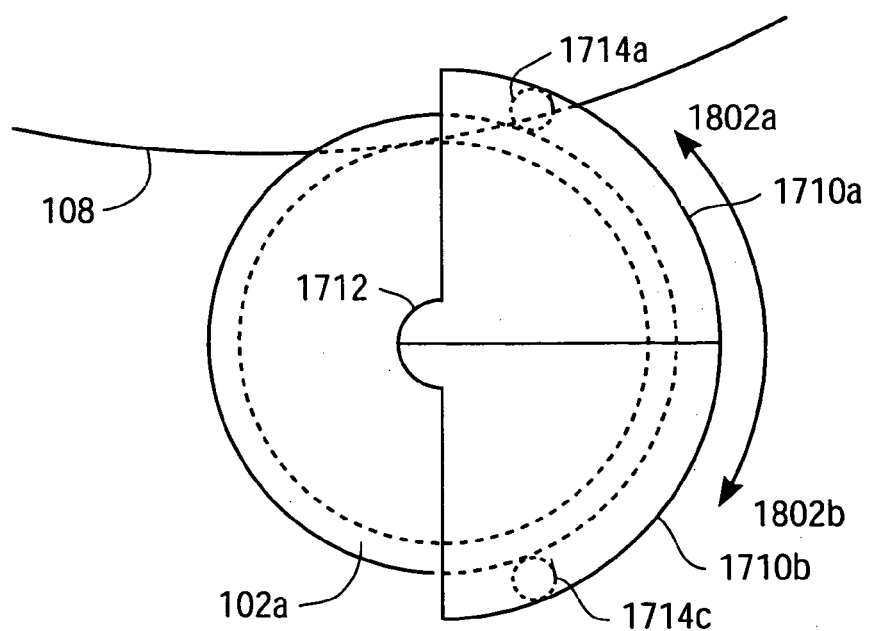
FIGS. 18A–18D are detailed views of the proximity head, in accordance with one or more embodiments of the present invention.
Figure 18B:
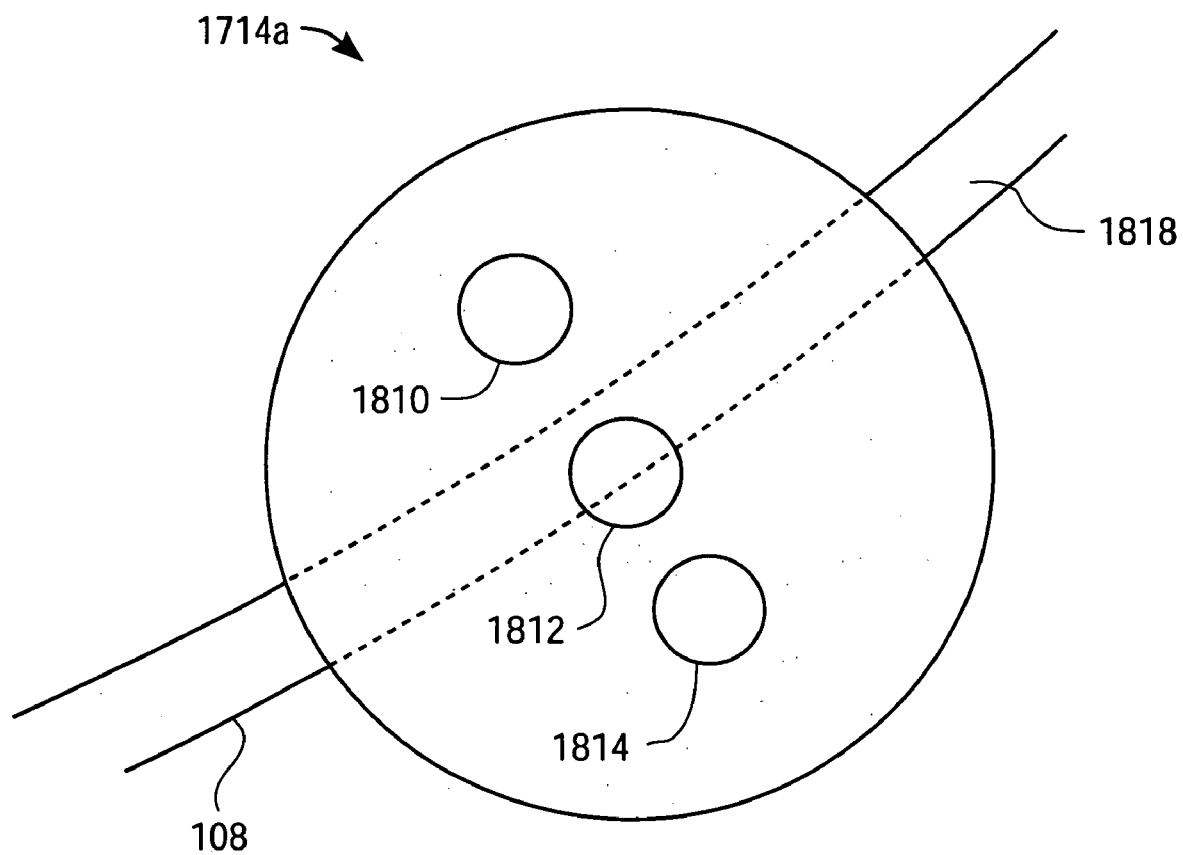
Figure 18C:
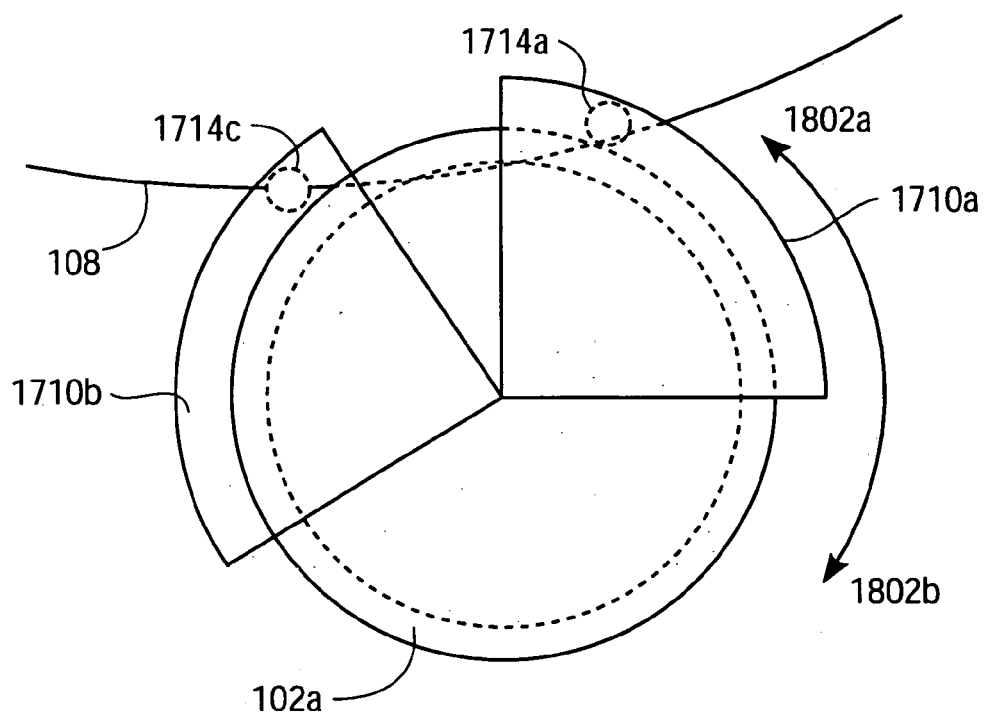

Proximity head 1710 can be moved (e.g., rotated) in either direction 1802A or 1802B so as to align the meniscus 1714A, 1714C with the edge of the wafer 108 as described in more detail in FIGS. 19A and 19B, below. FIG. 18C illustrates one embodiment where the proximity head 1710 is divided into two separate proximity heads 1710A, 1710B. Proximity heads 1710A, 1710B can then be moved (e.g., rotated) so as to align the meniscuses 1714A, 1714C with the edge of the wafer 108. Proximity head 1710A can be arranged such that the meniscus 1714A is located just to the right of the contact area between the wafer 108 and the edge roller 102A. Simultaneously, the proximity head 1710B can be arranged such that the meniscus 1714C is located just to the left of the contact area between the wafer 108 and the edge roller 102A. In such an arrangement, the edge of the wafer 108 can be processed just prior to contacting the edge roller 102A and immediately after contacting the edge roller. This arrangement would allow the edge of the wafer 108 to be, for example, rinsed and dried before and after contacting the edge roller 102A. Similarly, the meniscuses 1714A, 1714C can also perform different processes to the edge of the wafer. By way of example, meniscus 1714C might apply a cleaning process to the edge of the wafer 108 before the edge roller contacts the wafer while meniscus 1714A applies a rinsing and drying process to the edge of the wafer after the edge roller contacts the wafer. In this manner the two meniscuses can minimize the transfer of contaminants from the wafer to the edge roller before contact and from the edge roller to the wafer after contact.

Figure 18D:
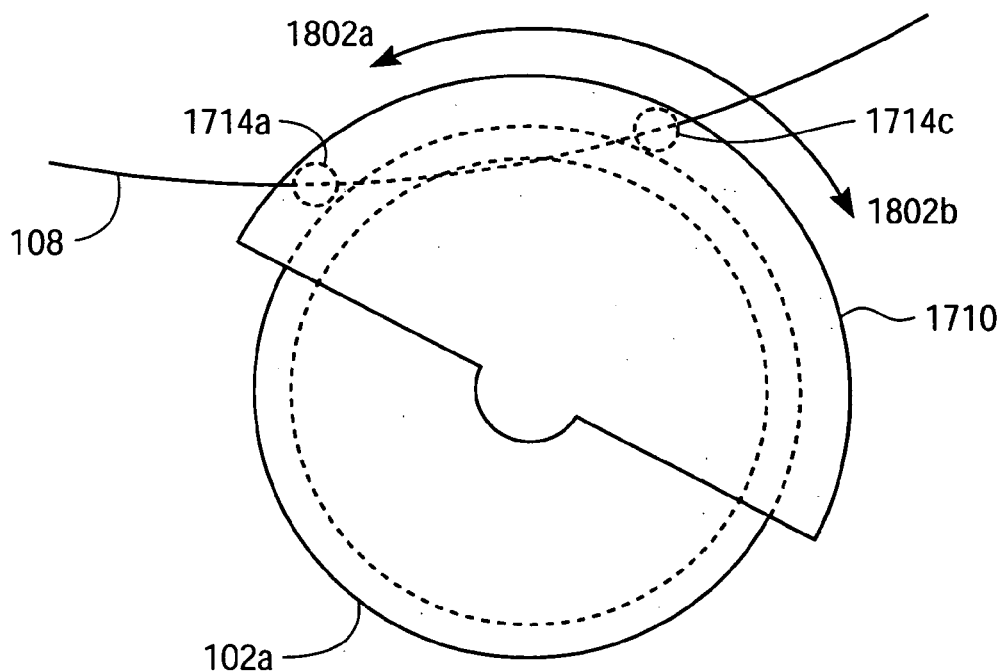

FIG. 18D illustrates an alternative embodiment of a single proximity head 1710 that can support two meniscuses 1714A, 1714C. The proximity head 1710 can be rotated until the meniscuses 1714A, 1714C are arranged in a before and after edge roller contact arrangement. Alternatively, the two meniscuses 1714A, 1714C can be located on the proximity head 1710 somewhat closely so that the edge of the wafer 108 passes through both meniscuses in short succession such as either before or after the edge contacts the edge roller 102A. In this manner, the two meniscuses 1714A, 1714C can perform successive processes on the edge of the wafer 108. By way of example, a cleaning process in the first meniscus, followed by a rinse and dry process in the second meniscus.

FIGS. 19A and 19B illustrate a side view of proximity head 1710, in accordance with one embodiment of the present invention. A set of ports 1714A-1 form meniscus 1714A and a corresponding set of ports 1714A-2 form meniscus 1714B. The meniscuses 1714A and 1714B can be formed with the wafer 108 extended between them as shown in FIG. 19B. Alternatively, the meniscuses 1714A and 1714B can be formed with the wafer 108 not extended between them and the meniscuses then moved partially onto the edge of the wafer 108 as shown in FIG. 19A and then fully moved onto the wafer as shown in FIG. 19B. In this manner the edge of the wafer 108, including the edge exclusion zone 1818 (shown in FIG. 18B above) can be completely processed as desired. By way of example, if the edge exclusion zone 1818 is 2 mm wide then the proximity head 1710 can move meniscus 1714A, which has a 4 mm in diameter, onto the edge of the wafer 108 to perform the desired process (e.g., clean, rinse, dry, etch). Similarly, when the desired process has been completed, the meniscuses 1714A and 1714B can be moved fully off of he edge of the wafer 108 such that the meniscuses do not fail and leave residues on the edge of the wafer.

Figure 20:
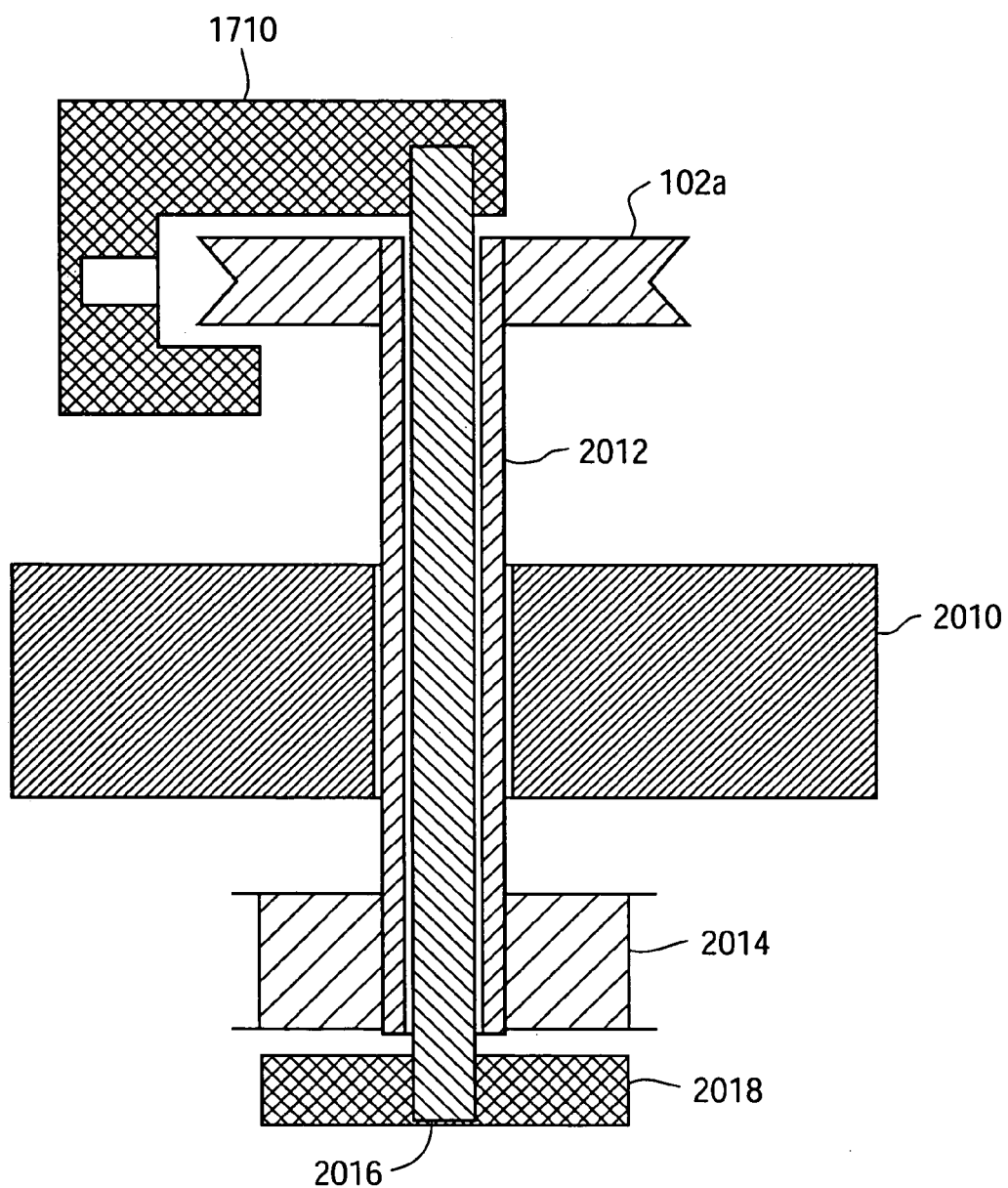
FIG. 20 illustrates a sectional view of the proximity head and the edge roller, in accordance with one embodiment of the present invention.

FIG. 20 illustrates a sectional view of the proximity head 1710 and the edge roller 102A, in accordance with one embodiment of the present invention. The edge roller 102A is mounted on a first shaft 2012. The first shaft 2012 is hollow and allows one (or more) concentric shafts (e.g., second shaft 2016) to rotate within the first shaft. An edge roller drive 2014 is attached to the first shaft 2012 so that the first shaft can rotate the edge roller. The edge roller drive can be, for example a motor or a pulley or any other device as well known in the art that can drive the edge roller 102A as needed by the overall application. A housing 2010 supports the first shaft 2012.

The second shaft 2016 is coupled to the proximity head 1710 at one end and an actuator 2018 at the other end. In this manner the actuator 2018 can rotate the proximity head 1710 concentrically with the edge roller 102A. The actuator 2018 can be a motor (e.g., a stepper motor) or an arm actuator or other actuator system such that the shaft 2016 and therefore the proximity head 1710 can be moved in a very precise and controlled manner. The very precise and controlled manner allows for an accurate location of the meniscus 1714A relative to the edge of the wafer 108.

In another embodiment, such as described in FIG. 18C above, where two proximity heads 1710A and 1710B are utilized, the shaft 2016 could also be hollow and allow for a third concentric shaft to pass through. In this embodiment, shaft 2012 is used by the edge roller and shaft 2016 is used by one of the proximity heads (e.g., proximity head 1710A) while the third shaft is used by the other proximity head 1710B. In such an embodiment, the two proximity heads 1710A, 1710B may be independently controlled and moved.

In yet another embodiment, where the edge roller 102A is not a driven roller (i.e., edge roller does not drive or otherwise cause the edge of the wafer to move) such as if edge rollers 102B and/or 102C are the driven rollers, then the edge roller 102A can simply be supported by a bearing on shaft 2012. In this manner shaft 2012 can be coupled to one of the proximity heads (e.g., proximity head 1710A) and shaft can be coupled to the other proximity head 1710B.

While the above description has primarily described wafers and substrates as having a generally rounded shape, if should be understood that with minor modification the edge processing systems described herein can also be utilized to process a substrate having a substantially straight edge.

While the above-described systems, apparatus and methods may be described in terms of various exemplary cleaning and drying processes, it should be understood that other processes can also be encompassed within the scope of the present invention. The other processes can include etching processes, rinsing processes, deposition processes and other applicable processes. It will be further appreciated that the instructions represented by the operations in FIG. 5N-1 are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of processing an edge of a substrate, comprising:
   supporting the substrate by an edge support, the edge support including a first proximity head;
   forming an edge meniscus inside a concave portion of the first proximity head, the concave portion being capable of receiving at least a portion of an edge of the substrate, wherein the concave portion includes a plurality of ports opening into the concave portion, the plurality of ports including:
      at least one process liquid injection port;
      at least one vacuum port; and
      at least one surface tension control port; and
   moving the edge meniscus onto the edge of the substrate.

2. The method of claim 1, further comprising moving the edge meniscus off of the edge of the substrate.

3. The method of claim 1, wherein moving the edge meniscus onto the edge of the substrate includes rotating the proximity head about an axis of the first proximity head.

4. The method of claim 1, wherein moving the edge meniscus onto the edge of the substrate includes moving the edge meniscus relative to the edge of the substrate.

5. The method of claim 1, wherein moving the meniscus includes increasing the size of the edge meniscus.

6. The method of claim 1, wherein the edge of the substrate includes a circumferential edge of the substrate and the meniscus encompasses at least a portion of the circumference of the substrate.

7. The method of claim 1, wherein the edge meniscus encompasses the edge of the substrate within the portion of the circumference of the substrate.

8. The method of claim 7, wherein the edge meniscus encompasses at least one of a top surface edge exclusion zone and a bottom surface edge exclusion zone.

9. The method of claim 1, further comprising moving the meniscus along the edge of the substrate.

10. The method of claim 1, wherein the edge support includes an edge roller.

11. The method of claim 1, wherein processing the edge of a substrate includes at least one of cleaning, rinsing, etching or drying the edge of the substrate.

12. The method of claim 1, wherein processing the edge of a substrate includes processing at least a portion of at least one of a top surface or a bottom surface of the substrate.

13. The method of claim 12, wherein processing at least a portion of at least one of the top surface or the bottom surface of the substrate includes processing the at least a portion of at least one of the top surface or a bottom surface of the substrate with the edge meniscus.

14. The method of claim 12, wherein processing at least a portion of at least one of the top surface or the bottom surface of the substrate includes processing the at least a portion of at least one of the top surface or the bottom surface of the substrate with a corresponding top or bottom meniscus.

15. The method of claim 14, wherein the corresponding top meniscus is supported between a top proximity head and the top surface of the substrate and the corresponding bottom meniscus is supported between a bottom proximity head and the bottom surface of the substrate.

16. The method of claim 15, wherein the corresponding top meniscus is formed between the top proximity head and at least one of the bottom proximity head, an adjacent surface or the top surface of the substrate and the top meniscus is moved onto the top surface of the substrate.

17. A method of processing an edge of a substrate, comprising:
   supporting the substrate by an edge roller, the edge roller including a proximity head;
   forming a meniscus inside a concave portion of the proximity head, the concave portion being capable of receiving at least a portion of an edge of the substrate, wherein the meniscus encompasses the edge of the substrate within a portion of the circumference of the substrate, wherein the concave portion includes a plurality of ports opening into the concave portion, the plurality of ports including:
      at least one process liquid injection port;
      at least one vacuum port; and
      at least one surface tension control port;
   moving the meniscus onto the edge of the substrate;
   moving the meniscus along the edge of the substrate.

18. The method of claim 17, wherein moving the meniscus onto the edge of the substrate includes increasing the size of the meniscus.

* * * * *